(12) United States Patent
Shin et al.

(10) Patent No.: US 7,724,216 B2
(45) Date of Patent: May 25, 2010

(54) DISPLAY PANEL

(75) Inventors: Kyoung-Ju Shin, Yongin-si (KR);
Beohm-Rock Choi, Seoul (KR);
Chong-Chul Chai, Seoul (KR);
Joon-Hoo Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 1114 days.

(21) Appl. No.: 10/552,261

(22) PCT Filed: Apr. 6, 2004

(86) PCT No.: PCT/KR2004/000787

§ 371 (c)(1),
(2), (4) Date: Oct. 5, 2005

(87) PCT Pub. No.: WO2004/090853

PCT Pub. Date: Oct. 21, 2004

(65) Prior Publication Data

US 2006/0202934 A1 Sep. 14, 2006

(30) Foreign Application Priority Data

Apr. 7, 2003 (KR) ............... 10-2003-0021640
Apr. 1, 2004 (KR) ............... 10-2004-0022553

(51) Int. Cl.
*G09G 3/30* (2006.01)
(52) U.S. Cl. .................. 345/76; 345/77; 345/80; 345/82; 345/84; 345/87
(58) Field of Classification Search .......... 345/55, 345/76, 77, 80, 82, 84, 87, 90, 92
See application file for complete search history.

(56) References Cited

U.S. PATENT DOCUMENTS

| 6,229,506 | B1 * | 5/2001 | Dawson et al. ............... 345/82 |
| 6,246,384 | B1 | 6/2001 | Sano |
| 6,304,039 | B1 | 10/2001 | Appelberg et al. |
| 6,714,178 | B2 * | 3/2004 | Koyama et al. ............... 345/76 |
| 6,989,805 | B2 * | 1/2006 | Inukai ............... 345/76 |
| 7,038,674 | B2 * | 5/2006 | Inukai ............... 345/211 |
| 7,176,857 | B2 * | 2/2007 | Osame et al. ............... 345/76 |
| 2001/0038367 | A1 * | 11/2001 | Inukai ............... 345/76 |
| 2001/0043168 | A1 * | 11/2001 | Koyama et al. ............... 345/52 |
| 2003/0063054 | A1 * | 4/2003 | Inukai ............... 345/83 |

FOREIGN PATENT DOCUMENTS

| JP | 2002-341790 | 11/2002 |
| JP | 2003-173154 | 6/2003 |
| JP | 2003-177680 | 6/2003 |

* cited by examiner

*Primary Examiner*—My-Chau T Tran
(74) *Attorney, Agent, or Firm*—Cantor Colburn LLP

(57) ABSTRACT

In an OELD panel capable of decreasing a cross-talk and an OELD apparatus having the OELD panel, a switching part is formed in a unit pixel defined by a data line and a scan line to control the output of a data signal in response to a scan signal. A current supply line is disposed on at least two sides of the unit pixel to transfer a current. The sides of the unit pixel are disposed adjacent to one another. An organic electro luminescent part generates a light in response to the current. A driving part is disposed between the organic electro luminescent part and the current supply line to control the current in response to the data signal outputted from the switching part. Therefore, the current supply line forms a net shape to decrease a cross-talk.

16 Claims, 48 Drawing Sheets

DISPLAY PANEL

TECHNICAL FIELD

The present invention relates to a display panel, a method of manufacturing the display panel and a display apparatus having the display panel. More particularly, the present invention relates to a display panel capable of decreasing a cross-talk, a method of manufacturing the display panel and a display apparatus having the display panel.

BACKGROUND ART

A display apparatus may be classified into a cathode ray tube (CRT), a liquid crystal display (LCD) apparatus, a plasma display panel (PDP), an organic electro luminescent display (OELD) apparatus, etc. A monitor for a computer may include the LCD apparatus. The LCD apparatus has low luminance, narrow viewing angle, etc. The CRT has heavy weight, large volume, etc.

The OELD apparatus has various characteristics, for example, such as low cost, high luminance, thin thickness, light weight, etc.

The OELD apparatus generates a light using an electro-luminescence of an organic material or polymers. When an electric energy is applied to the organic material or the polymers, the light is generated through the electro-luminescence. Therefore, a backlight may be omitted so that the OELD apparatus has thinner thickness and lower cost than the LCD apparatus. In addition, the OELD apparatus has wider viewing angle and higher luminance than the LCD apparatus.

FIG. 1 is a circuit diagram showing a pixel of a conventional organic electro luminescent panel.

Referring to FIG. 1, an organic electro luminescent driving element of the conventional organic electro luminescent panel includes a switching transistor (QS), a storage capacitor (Cst), a driving transistor (QD) and an organic electro luminescent element. Current supply lines (VDD lines) are formed with data lines in a direction that is substantially in parallel with the data line. A pixel is electrically connected to each of the current supply lines (VDD lines). The number of the pixels is equal to that of scan lines.

The organic electro luminescent display (OELD) apparatus has lower luminance than the cathode ray tube (CRT). An organic electro luminescent display (OELD) apparatus of a passive type has lower luminance than an organic electro luminescent display (OELD) apparatus of an active type. The organic electro luminescent display (OELD) apparatus of a passive type generates the light when a voltage is applied to one of the scan lines. An active layer of a light emitting cell generates the light in proportion to an amount of a current that is applied to the active layer.

A cross-talk may be formed in a direction that is substantially in parallel with the current supply lines (VDD lines) while the organic electro luminescent panel is operated.

FIG. 2 is a plan view showing a cross-talk of a conventional organic electro luminescent panel.

Referring to FIG. 2, when a voltage drop of each of the current supply lines (VDD lines) corresponding to a column A where a white block is not displayed is small and a voltage drop of each of the current supply lines (VDD lines) corresponding to a column B where the white is displayed is large, pixels in the column B, which receive a current from each of the current supply lines (VDD lines) of the column B display a dark gray color.

Therefore, pixels disposed adjacent to an upper portion of the white block and a lower portion of the white block display the dark gray color that is darker than that of pixels spaced apart from the white block, thereby forming the cross-talk. In addition, the voltage drop of each of the current supply lines (VDD lines) increases in proportion to a size of the white block.

Furthermore, a luminance of the pixels disposed adjacent to the upper and lower portions of the white block decreases in proportion to the size of the white block, therefore forming the cross-talk.

The luminance of the pixels decreases in inverse proportion to a light emitting area, and a change of the luminance in a longitudinal direction is greater than that in the horizontal direction.

DISCLOSURE

Technical Problem

The present invention provides a display panel capable of decreasing a voltage drop and a cross-talk.

The present invention also provides a method of manufacturing the display panel.

The present invention also provides a display apparatus having the display panel.

Technical Solution

The display panel according to an exemplary embodiment of the present invention includes a data line, a scan line, a switching part, a current supply line, an organic electro luminescent part and a driving part. The data and scan lines transfer a data signal and a scan signal, respectively. The switching part is formed in a unit pixel defined by the data and scan lines to control the output of the data signal in response to the scan signal. The current supply line is disposed on at least two sides of the unit pixel to transfer a current. The sides of the unit pixel are disposed adjacent to one another. The organic electro luminescent part generates a light in response to the current. The driving part is disposed between the organic electro luminescent part and the current supply line to control the current in response to the data signal outputted from the switching part. The current flows between the organic electro luminescent part and the current supply line.

In the method of manufacturing the display panel in accordance with an aspect of the present invention, a scan line, a control electrode electrically connected to the scan line, and a storage capacitor line spaced apart from the scan line are formed. A data line, a first current supply line, a first pattern defining a first electrode of a driving transistor, and a second pattern defining a first electrode of a switching transistor are formed. A pixel electrode and a second current supply line spaced apart from the pixel electrode are formed. The pixel electrode is formed in a region defined by the scan and data lines.

In the method of manufacturing the display panel in accordance with another aspect of the present invention, a scan line, a control electrode electrically connected to the scan line, a first current supply line substantially in parallel with the scan line, and a storage capacitor line extended in a longitudinal direction are formed. A data line, a second current supply line, a first pattern defining a first electrode of a driving transistor, and a second pattern defining a first electrode of a switching transistor are formed. A pixel electrode and a third current supply line spaced apart from the pixel electrode are formed. The pixel electrode is formed in a region defined by the scan and data lines.

The display apparatus in accordance with an exemplary embodiment of the present invention includes a column driver, a low driver, a voltage supplier and a display panel. The column driver receives an image signal and a first timing signal to output a data signal. The low driver receives a second timing signal to output a scan signal. The voltage supplier receives a voltage control signal to output a first voltage and a second voltage. The display panel controls an amount of a current formed by the first and second voltages in response to the first voltage, the second voltage, the scan signal and the data signal to generate a light.

Therefore, the organic electro luminescent display apparatus includes main current supply lines and auxiliary current supply lines that form a net shape to uniformize a voltage distribution, thereby decreasing a voltage drop and a cross-talk.

DESCRIPTION OF DRAWINGS

The above and other advantages of the present invention will become readily apparent by reference to the following detailed description when considered in conjunction with the accompanying drawings wherein.

BEST MODE

Figure 1:
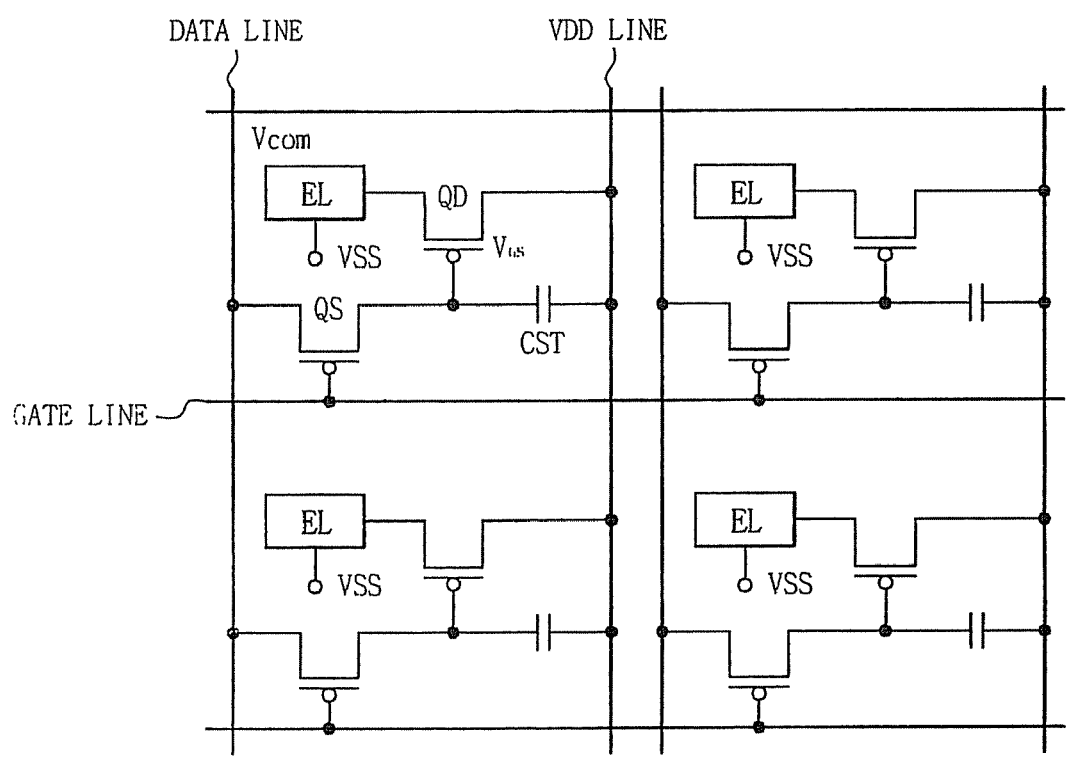
FIG. 1 is a circuit diagram showing a pixel of a conventional organic electro luminescent panel.
Figure 2:
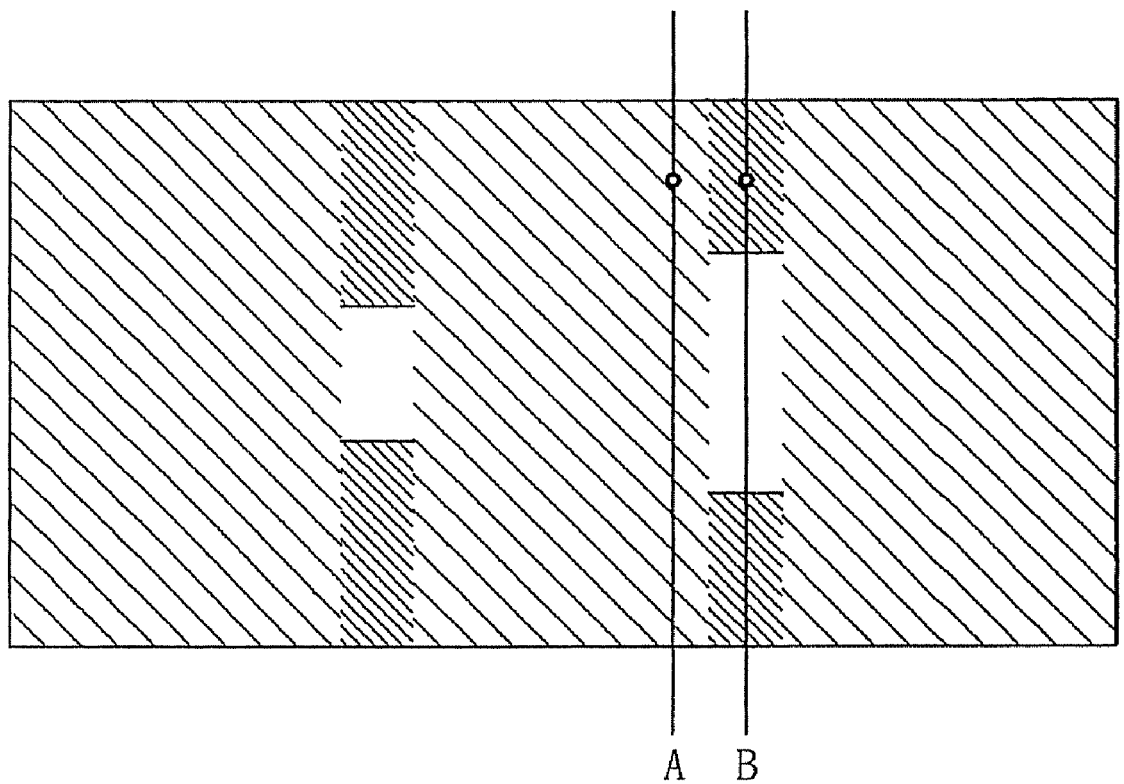
FIG. 2 is a plan view showing a cross-talk of a conventional organic electro luminescent panel.
Figure 3:
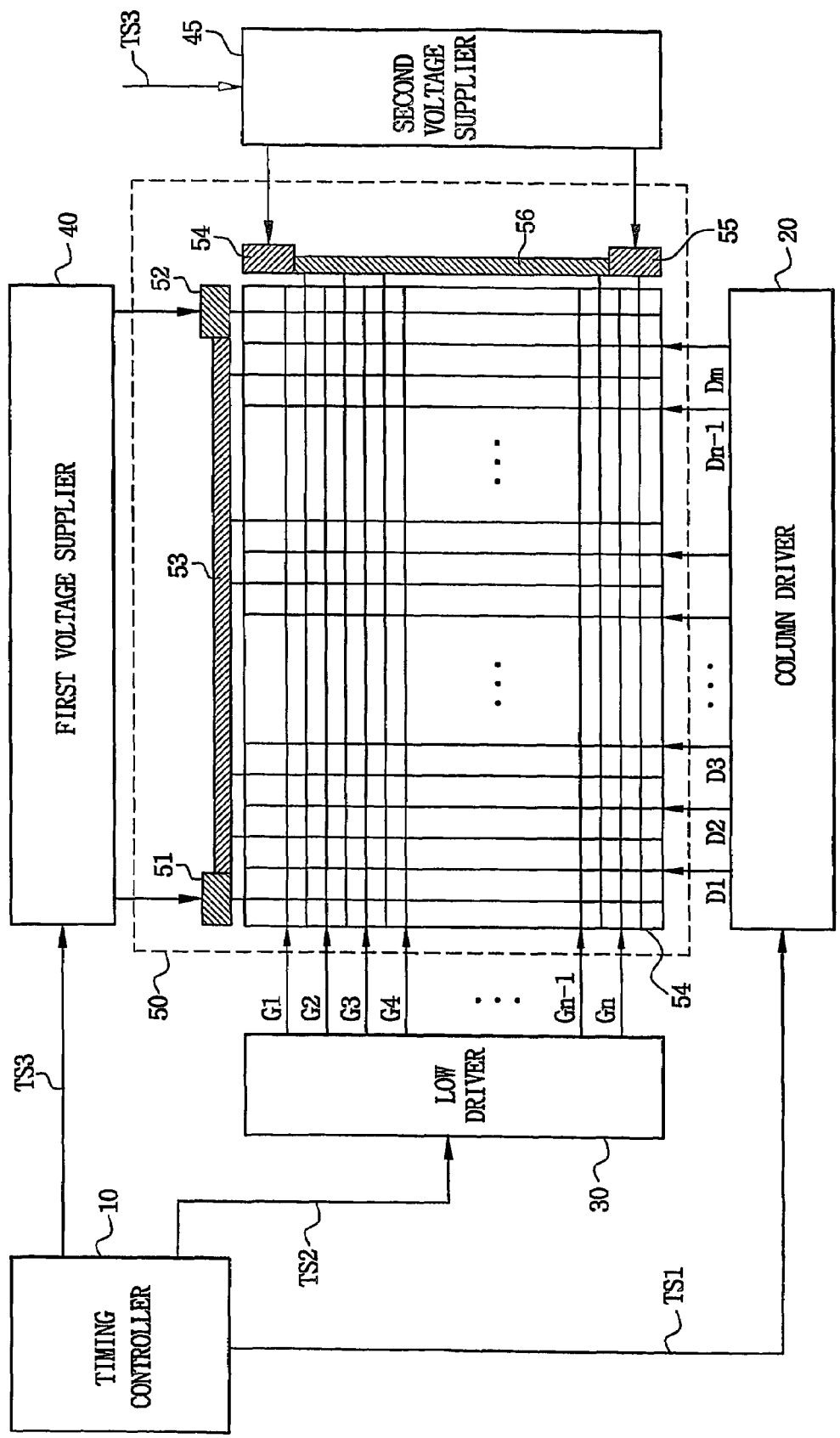
FIG. 3 is a plan view showing an organic electro luminescent display apparatus in accordance with an exemplary embodiment of the present invention.

FIG. 3 is a plan view showing an organic electro luminescent display apparatus in accordance with an exemplary embodiment of the present invention.

Referring to FIG. 3, the organic electro luminescent display apparatus includes a timing controller 10, a column driver 20, a low driver 30, a first voltage supplier 40, a second voltage supplier 45 and an organic electro luminescent panel 50.

The timing controller 10 receives an image signal and a control signal of the image signal from an externally provided graphic controller (not shown). The timing controller 10 outputs a first timing signal (TS1) and the image signal to the column driver 20. Also, the timing controller 10 outputs a second timing signal (TS2) to the low driver 30. In addition, the timing controller 10 outputs a voltage control signal (TS3) to the first and second voltage suppliers 40 and 45.

The column driver 20 receives the image signal and the first timing signal (TS1) from the timing controller 10 to output data signals (D1, D2, . . . , Dm−1, Dm) to the organic electro luminescent panel 50.

The low driver 30 receives the second timing signal (TS2) from the timing controller 10 to output scan signals (G1, G2, . . . , Gn−1, Gn) to the organic electro luminescent panel 50.

The first voltage supplier 40 receives the voltage control signal (TS3) to output a first voltage to a first current supply line that is extended in a longitudinal direction and arranged in a horizontal direction. The first voltage supplier 40 may also output the first voltage to a plurality of the first current supply lines. The first voltage may be a bias voltage. When the organic electro luminescent panel 50 has a P-type driving transistor, the first voltage may be higher than a common voltage that is applied to an organic electro luminescent element. In contrast, when the organic electro luminescent panel 50 has an N-type driving transistor, the first voltage may be lower than the common voltage that is applied to the organic electro luminescent element. The common voltage may be a ground voltage.

The second voltage supplier 45 receives the voltage control signal (TS3) to output a second voltage to a second current supply line that is extended in the horizontal direction and arranged in the longitudinal direction. The second voltage supplier 45 may also output the second voltage to a plurality of the second current supply lines. The second voltage may be substantially equal to the first voltage. Alternatively, the second voltage may also be different from the first voltage. Further, the second voltage supplier may be omitted so that the first voltage supplier 40 supplies the first voltage to the second current supply lines through transmission lines.

The organic electro luminescent panel 50 includes a first station 51, a second station 52, a first bridge line 53 that connects the first station 51 to the second station 52, a third station 54, a fourth station 55 and a second bridge line 56 that connects the third station 54 to the fourth station 55.

In addition, the organic electro luminescent panel 50 includes a plurality of data lines, a plurality of first current supply lines, a plurality of scan lines and a plurality of second current supply lines. Numbers of the data lines, the first current supply lines, the scan lines and the second current supply lines are 'm', 'm', 'n' and 'n', respectively, wherein 'm' and 'n' are positive numbers and are independent from each other. The organic electro luminescent panel 50 displays an image using the image signal that is provided from the column driver 20 in response to the scan signals that are provided from the low driver 30. A switching element (QS, not shown), a driving element (QD, not shown), an organic electro luminescent element (not shown) and a storage capacitor (Cst, not shown) are formed in a region defined by two adjacent data lines and two adjacent scan lines.

A first end portion of the switching element (QS) is electrically connected to one of the data lines. A second end portion of the switching element (QS) is electrically connected to one of the scan lines. The switching element (QS) controls the output of the data signal to output the data signal through a third end portion of the switching element (QS). A first end portion of the organic electro luminescent element is electrically connected to a polarity terminal where the common voltage is applied. The organic electro luminescent element generates a light in response to an amount of current that is applied to the organic electro luminescent element.

A first end portion of the driving element (QD) is electrically connected to a second end portion of the organic electro luminescent element. A second end portion of the driving element (QD) is electrically connected to one of the first current supply lines. The driving element (QD) controls a current between the first and second end portions of the driving element (QD) in response to the output signal that is provided from the third end portion of the switching element (QS) to control an illumination of the organic electro luminescent element.

A first end portion of the storage capacitor (Cst) is electrically connected to the third end portion of the switching element (QS), and a second end portion of the storage capacitor (Cst) is electrically connected to one of the first current supply lines so that a electric charge is stored in the storage capacitor (Cst) in response to a driving voltage.

A first station 51 and a second station 52 of the organic electro luminescent panel 50 receive the first voltage from the first voltage supplier 40 to output the first voltage to the first current supply lines (1st VDD lines) of the organic electro luminescent panel 50, which are extended in the longitudinal direction and arranged in the horizontal direction. The organic electro luminescent panel 50 may include a plurality of the stations.

A third station 54 and a fourth station 55 of the organic electro luminescent panel 50 receive the second voltage from the second voltage supplier 45 to output the second voltage to the second current supply lines (2nd VDD lines) of the organic electro luminescent panel 50, which are extended in the horizontal direction and arranged in the longitudinal direction.

The first and second voltage suppliers 40 and 45 are disposed on an upper portion and a right-sided portion of the organic electro luminescent panel 50 so that the first and second voltages are applied to the first and second current supply lines, respectively. Alternatively, the first and second voltage suppliers may be disposed on a lower portion and a left-sided portion of the organic electro luminescent panel so that the first and second voltages are applied to the first and second current supply lines, respectively.

Figure 4:
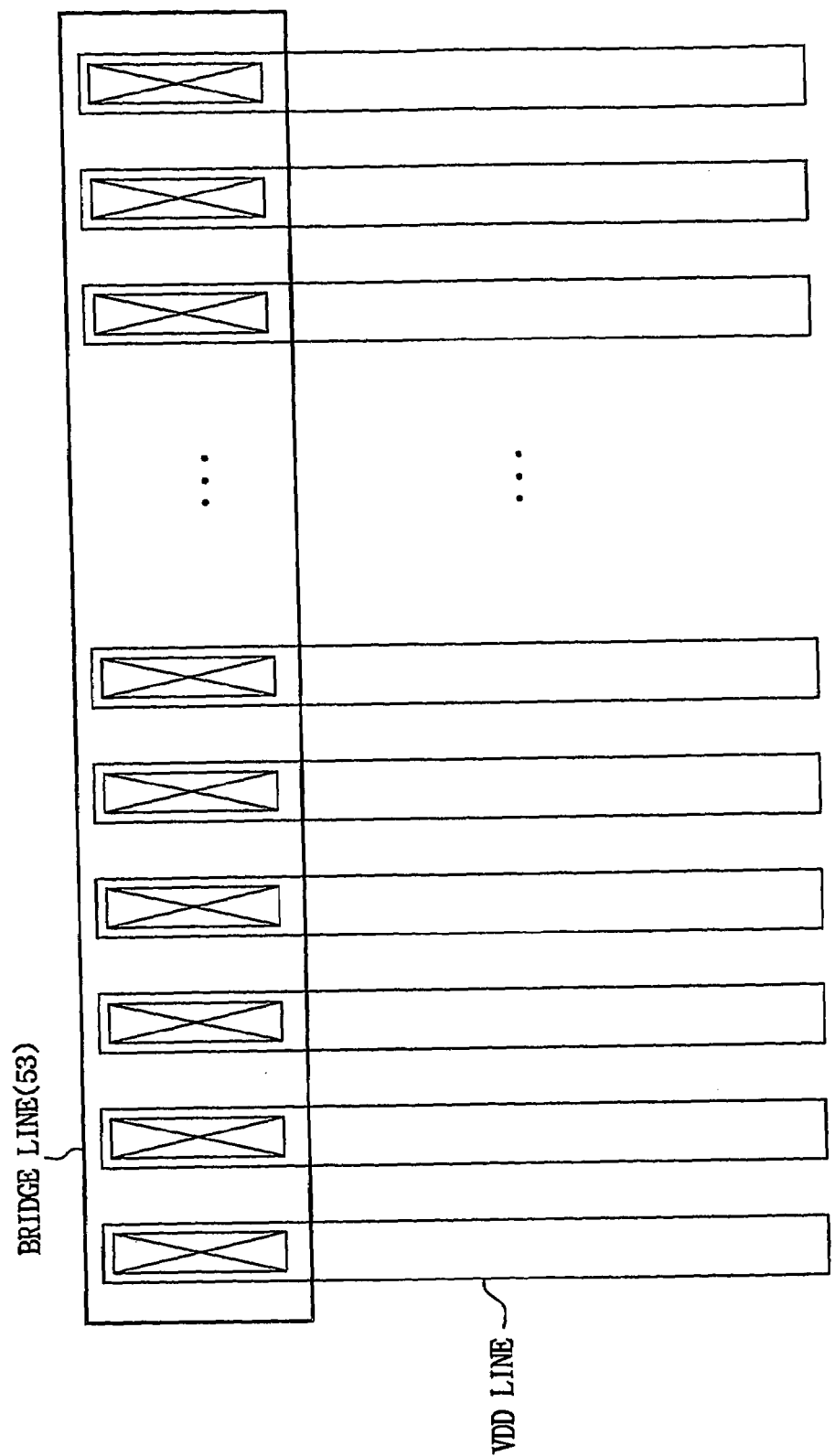
FIG. 4 is a plan view showing current supply lines of an organic electro luminescent display apparatus shown in FIG. 3.

FIG. 4 is a plan view showing current supply lines of an organic electro luminescent display apparatus shown in FIG. 3. The current supply lines are arranged in the direction that is substantially in parallel with the data lines.

Referring to FIGS. 3 and 4, the current supply lines are electrically connected to the first bridge line 53 that electrically connects the first station 51 to the second station 52 through contact holes. The number of the current supply lines is determined in response to a resolution of the organic electro luminescent panel 50. The first bridge line 53 includes aluminum neodymium (AlNd) of about 3000 Å. The first bridge line 53 and the data lines may be formed from a same layer.

Figure 5:
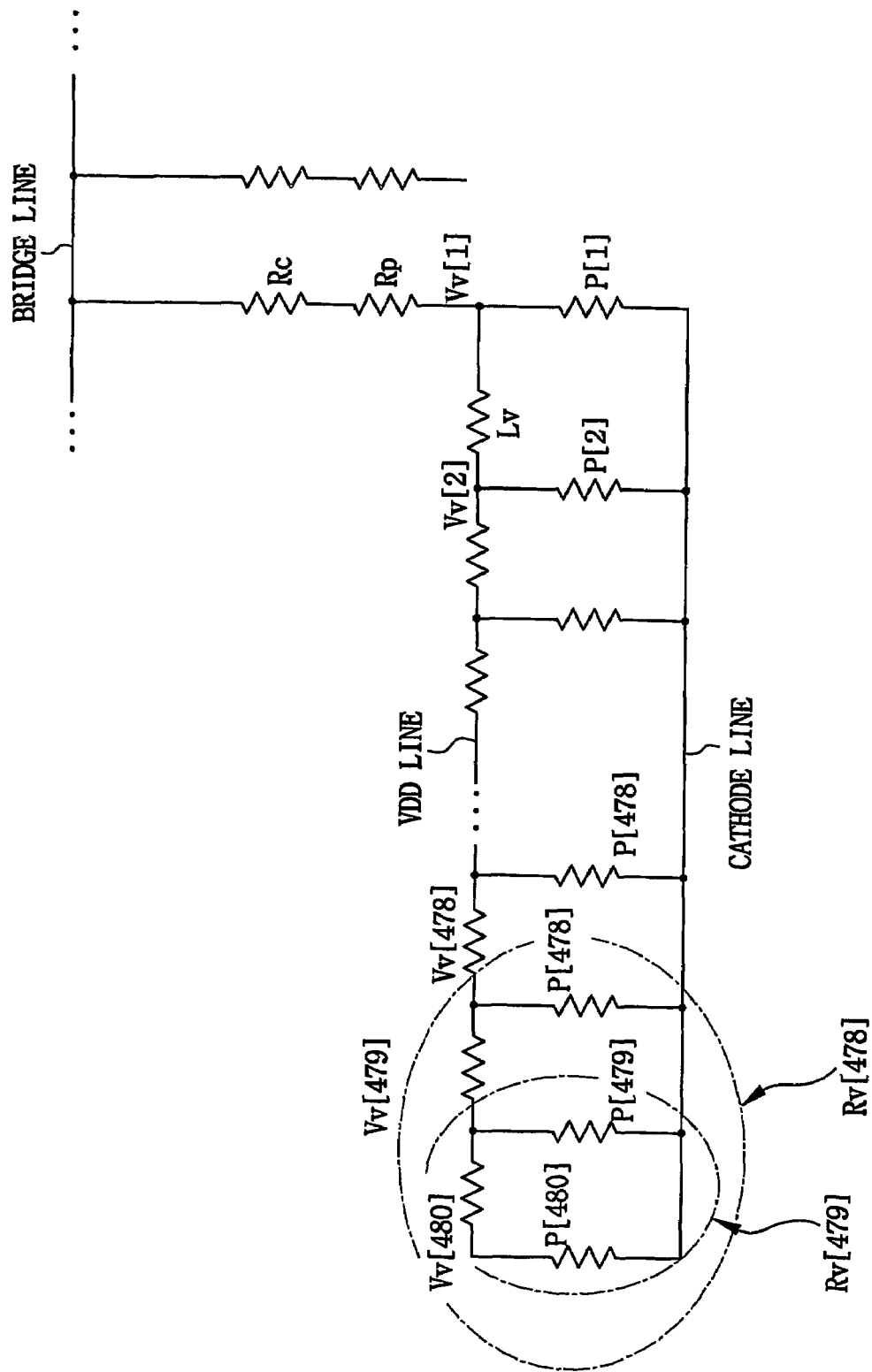
FIG. 5 is a circuit diagram showing a resistance of an organic electro luminescent panel in accordance with an exemplary embodiment of the present invention.

FIG. 5 is a circuit diagram showing a resistance of an organic electro luminescent panel in accordance with an exemplary embodiment of the present invention. A voltage drop of a predetermined current supply line (VDD line) is calculated. The organic electro luminescent panel includes a video graphics array (VGA) mode. A resolution of the organic electro luminescent panel is 640×480×3. A cathode resistance of the organic electro luminescent panel is negligible.

Referring to FIG. 5, 480 pixels are electrically connected to each of the current supply lines (VDD Lines) in substantially in parallel. A line resistance (Lv) corresponding to an n-th pixel is formed between a portion of the current supply line disposed between two adjacent pixels. One of the two adjacent pixels is the n-th pixel. In addition, a contact resistance (Rc) between the current supply line and the bridge line, and a fan-out line resistance (Rp) of the current supply line are formed in the organic electro luminescent panel. Furthermore, an n-th pixel resistance (P[n]) corresponding to the n-th pixel, and a partial sum resistance (Rv[n]) that is a summation of the pixel resistances (P[n, n+1, . . . , 480]) and the line resistances (Lv) corresponding to the n-th to 480th pixels are formed in the organic electro luminescent panel. A VDD voltage (Vv[n]) is applied to the n-th pixel.

Table 1 represents the line resistance (Lv), the contact resistance (Rc), the fan-out line resistance (Rp), the pixel resistance (P) and the VDD voltage (Vv) of a predetermined pixel.

TABLE 1

| | | |
|---|---|---|
| Rc | 0.00214 [Ω] | AlNd (Gate)/MoW (Data) |
| Rp | 55 [Ω] | MoW (Thickness 3000 Å, Width 7 μm) |
| Lv | 11.0 [Ω] | Pitch of Pixel 200 μm |
| P[n] | 22.5 [Ω] | |
| VDD | 10 [Volts] | |

The resistance (Rv[479]) sensed at a 479th pixel is derived by the following Equation 1.

$$1/Rv[479]=1/(Lv+P[480])+1/P[479] \qquad \text{Equation 1}$$

The resistance (Rv[n]) sensed at the n-th pixel is derived by the following Equation 2.

$$1/Rv[n]=1/(Lv+Rv[n+1])+1/P[n] \qquad \text{Equation 2}$$

The line resistance (Lv) is formed between the portion of the current supply line disposed between the n-th pixel and an n−1-th pixel. Also, the n-th pixel resistance (P[n]) corresponding to the n-th pixel, and the partial sum resistance (Rv[n]) that is the summation of the pixel resistances (P[n, n+1, ..., 480]) and the line resistances (Lv) corresponding to the n-th to 480th pixels are formed in the organic electro luminescent panel. The n-th pixel may display a predetermined gray color.

The voltage (Vv[1]) sensed at the first pixel is derived by the following Equation 3.

$$Vv[1]=Rv[1] \cdot VDD/(Rc+Rp+Rv[1]) \qquad \text{Equation 3}$$

The voltage (Vv[n]) sensed at the n-th pixel is derived by the following Equation 4.

$$Vv[n]=Rv[n] \cdot Vv[n-1]/(Lv+Rv[n]) \qquad \text{Equation 4}$$

The line resistance (Lv) is formed between the portion of the current supply line disposed between the n-th pixel and the n-1st pixel. Also, the partial sum resistance (Rv[n]) that is the summation of the pixel resistances (P[n, n+1, ..., 480]) and the line resistances (Lv) corresponding to the n-th to 480th pixels are formed in the organic electro luminescent panel. The VDD voltage (Vv[n]) is applied to the n-th pixel.

Figure 6:
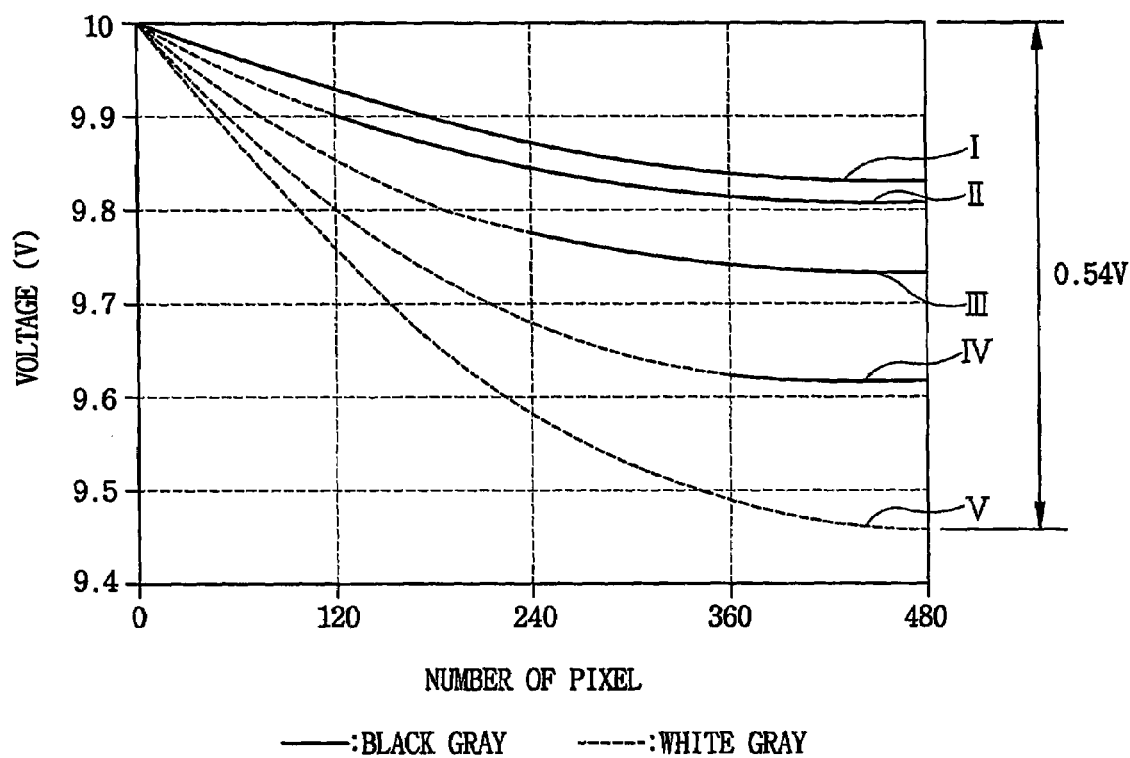
FIG. 6 is a graph showing a relationship between a voltage of an organic electro luminescent panel and the number of pixels.

FIG. 6 is a graph showing a relationship between a voltage of an organic electro luminescent panel and the number of pixels. The organic electro luminescent panel includes the video graphics array (VGA) mode. The resolution of the organic electro luminescent panel is 640×480×3. The current supply lines are arranged in the direction that is substantially in parallel with the data lines. The data lines are extended in the longitudinal direction. Each of the current supply lines includes the aluminum-neodymium (AlNd). The thickness of the current supply line is about 3000 Å.

When all the pixels display a black gray color, a voltage drop is represented by a curve 'I'. When the first to 120th pixels display a white gray color and the 121st to 480th pixels display the black gray color, a voltage drop is represented by a curve 'II'. When the first to 240th pixels display the white gray color and the 241st to 480th pixels displays the black gray color, a voltage drop is represented by a curve 'III'. When the first to 360th pixels display the white gray color and the 361st to 480th pixels displays the black gray color, a voltage drop is represented by a curve 'IV'. When all the pixels display the white gray color, a voltage drop is represented by a curve 'V'.

Referring to FIG. 6, the voltage drop increases in proportion to the number of the pixels. That is, the voltage drop corresponding to the direction that is substantially in parallel with the current supply lines (VDD Lines) increases in proportion to a distance between a voltage source and each of the pixels. Also, the voltage drop increases in proportion to the number of the pixels that display the white gray color. When all the pixels display the white gray color, the voltage drop is about 0.55 [Volts].

The current supply lines are substantially in parallel with the data lines. When the current supply lines are substantially in parallel with the data lines, a longitudinal cross-talk may be formed. Alternatively, the current supply lines may be substantially in parallel with the scan lines. When the current supply lines are substantially in parallel with the scan lines, a horizontal cross-talk may be formed.

The voltage drop deteriorates a luminance uniformity of the organic electro luminance panel. In addition, a voltage distribution may be changed in response to the image of the dark or white gray colors that are displayed using single column or single row. Therefore, luminance of the organic electro luminescent panel may be changed in response to the cross-talk and an area of the white gray color.

A gray-scale of the organic electro luminescent panel is determined in response to a voltage difference between the first voltage and the data voltage, which is substantially equal to a voltage difference (VGS) between a gate electrode and a source electrode of a driving thin film transistor.

When the voltage drop is formed in the longitudinal direction, the voltage difference (VGS) between the gate electrode and the source electrode of the driving thin film transistor is changed so that the gray-scale of the organic electro luminescent panel is also changed. When the voltage drop is formed in the horizontal direction, the voltage difference (VGS) between the gate electrode and the source electrode of the driving thin film transistor is changed so that the gray-scale of the organic electro luminescent panel is also changed.

According to this exemplary embodiment, the organic electro luminescent panel includes the current supply lines (VDD lines) arranged in a net shape to decrease the cross-talk or a variation of luminance.

Figure 7:
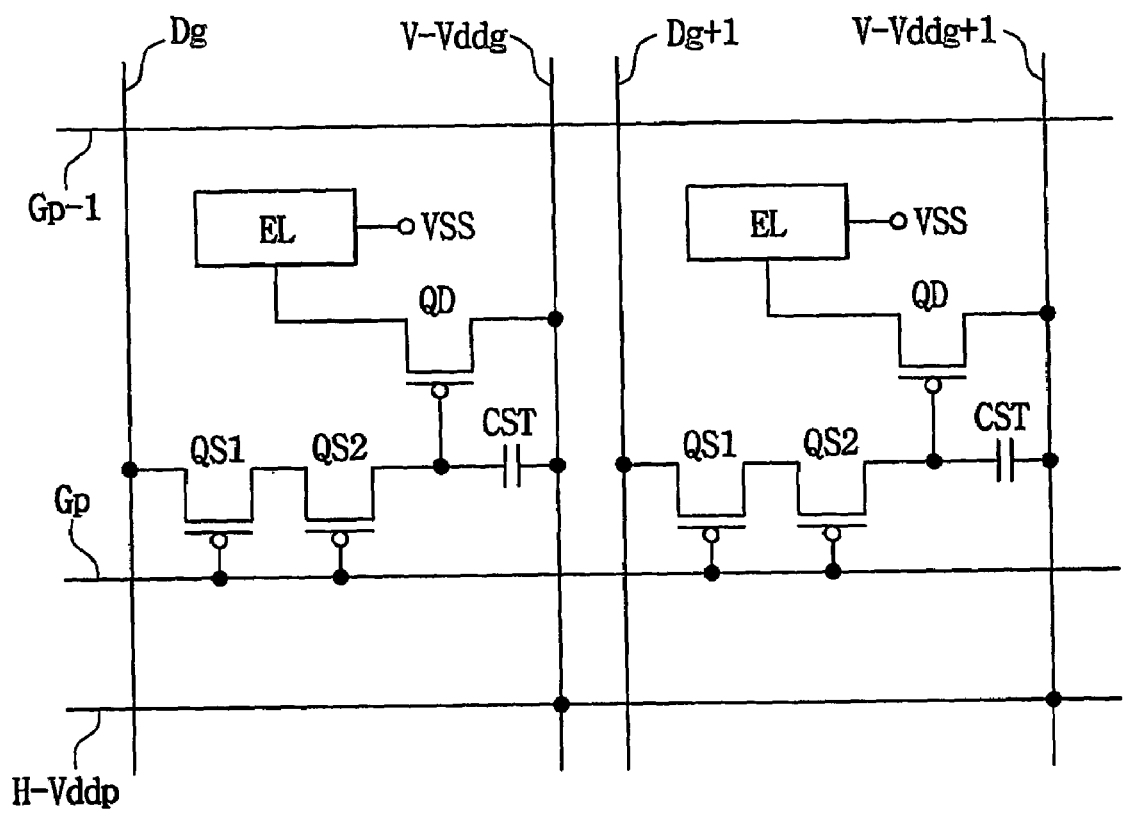
FIG. 7 is a circuit diagram showing a unit pixel of an organic electro luminescent display apparatus in accordance with an exemplary embodiment of the present invention.

FIG. 7 is a circuit diagram showing a unit pixel of an organic electro luminescent display apparatus in accordance with an exemplary embodiment of the present invention.

Referring to FIG. 7, the unit pixel includes a first switching transistor (QS1), a second switching transistor (QS2), a storage capacitor (Cst), a driving transistor (QD) and an organic electro luminescent element (EL). The first switching transistor (QS1), the second switching transistor (QS2), the storage capacitor (Cst), the driving transistor (QD) and the organic electro luminescent element (EL) are disposed in a region defined by a p-th scan line (Gp), a g-th data line (Dg) and a g-th longitudinal current supply line (V-Vddg). A p-th scan signal and a g-th data signal are applied to the p-th scan line (Gp) and the g-th data line (Dg), respectively. A second voltage is applied to a p-th horizontal current supply line (H-Vddp). The p-th horizontal current supply line (H-Vddp) is substantially in parallel with the p-th scan line (Gp). The p-th horizontal current supply line (H-Vddp) is electrically connected to the g-th longitudinal current supply line (V-Vddg).

An adjacent pixel that is disposed at a position adjacent to the unit pixel includes a first switching transistor (QS1), a second switching transistor (QS2), a storage capacitor (Cst), a driving transistor (QD) and an organic electro luminescent element (EL). The first switching transistor (QS1), the second switching transistor (QS2), the storage capacitor (Cst), the driving transistor (QD) and the organic electro luminescent element (EL) are disposed in a region defined by the p-th scan line (Gp), a g+1-th data line (Dg+1) and a g+1-th longitudinal current supply line (V-Vddg+1). The p-th scan signal and a g+1-th data signal are applied to the p-th scan line (Gp) and the g+1-th data line (Dg+1), respectively. The g+1-th longitudinal current supply line (V-Vddg+1) is electrically connected to the p-th horizontal current supply line (H-Vddp). The organic electro luminescent display apparatus may include a plurality of the scan lines and a plurality of the data lines.

The longitudinal current supply lines (V-Vddg and V-Vddg+1) and the data lines are formed from a same layer.

The longitudinal current supply lines (V-Vddg and V-Vddg+1) are substantially in parallel with the data lines. The organic electro luminescent display apparatus may include a plurality of the pixels, a plurality of the scan lines and a plurality of the longitudinal current supply lines, each of which is electrically connected to a portion of the pixels. The number of the pixels that are electrically connected to each of the longitudinal current supply lines may be equal to that of the scan lines.

The horizontal current supply line (H-Vddp) and the scan lines are formed from a same layer. The horizontal current supply line (H-Vddp) is substantially in parallel with each of the scan lines. The horizontal current supply line (H-Vddp) is electrically connected to the longitudinal current supply lines (V-Vddg and V-Vddg+1).

The first and second switching transistors (QS1 and QS2) are P-type transistors. Alternatively, the first and second switching transistors (QS1 and QS2) may also be N-type transistors that have better electrical characteristics compared to the P-type transistors.

Gate electrodes of the first and second switching transistors (QS1 and QS2) are electrically connected to each other so as to decrease an off-current. That is, the first and second switching transistors (QS1 and QS2) include active layers forming two channel forming regions that are serially connected to each other. Each of the pixels may include a plurality of the switching transistors, and gate electrodes of the switching transistors may also be electrically connected to one another. When the off current is low, a capacitance for the capacitor decreases so that an area of the capacitor also decreases. Therefore, when the gate electrodes of the switching transistors (QS1 and QS2) are electrically connected to one another, an effective light emitting area of the organic electro luminescent element increases.

Figure 8:
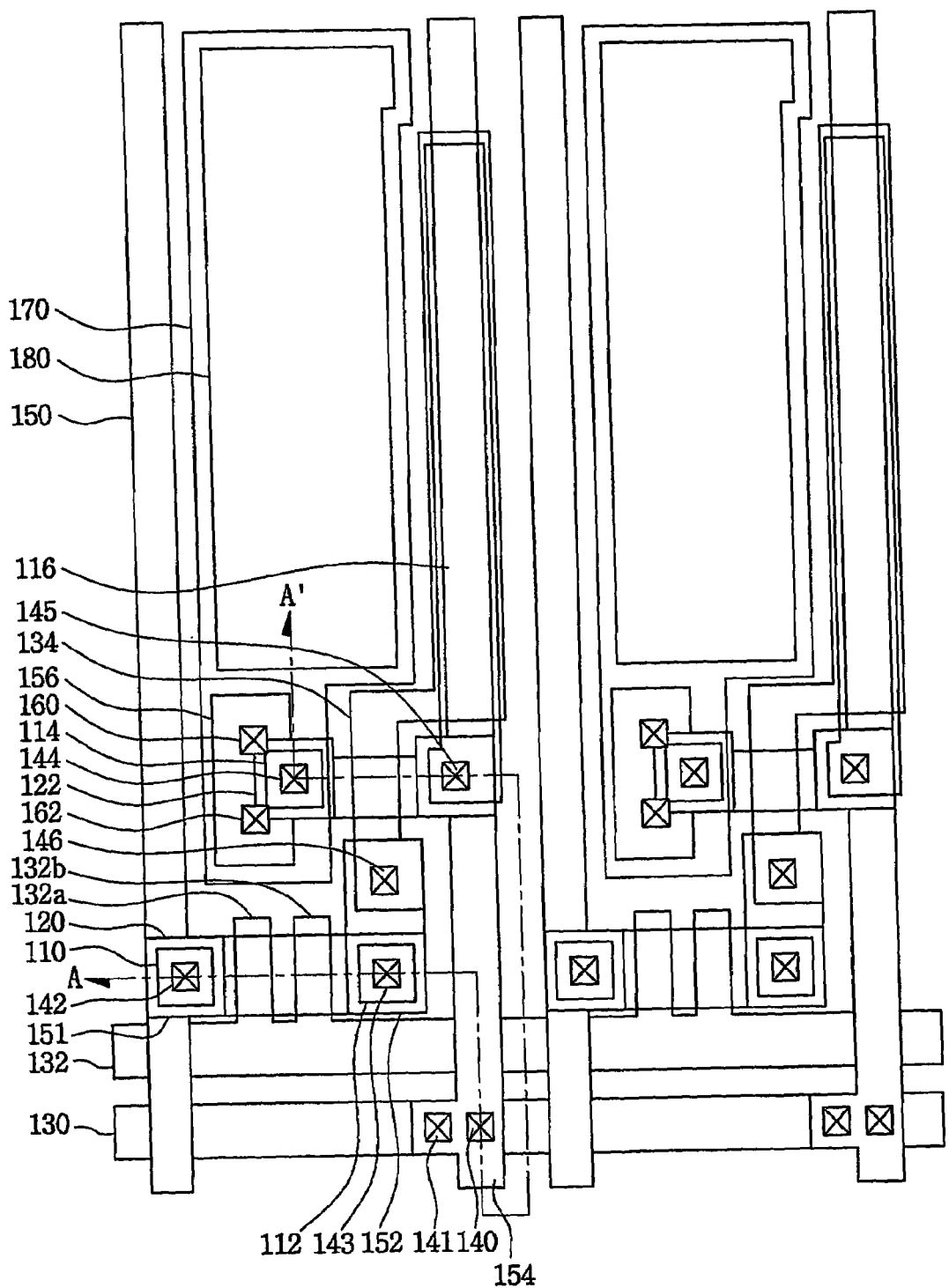
FIG. 8 is a plan view showing a unit pixel of an organic electro luminescent display apparatus in accordance with an exemplary embodiment of the present invention.

FIG. 8 is a plan view showing a unit pixel of an organic electro luminescent display apparatus in accordance with an exemplary embodiment of the present invention.

Referring to FIG. 8, the organic electro luminescent display apparatus includes an organic electro luminescent panel. The organic electro luminescent panel includes a scan line 132, a horizontal current supply line (H-VDD, 130) extended in the horizontal direction, a data line 150, and a longitudinal current supply line (V-VDD, 154) extended in the longitudinal direction. The horizontal current supply line (H-VDD, 130) and the scan line 132 are formed from a same layer. The longitudinal current supply line (V-VDD, 154) and the data line 150 are formed from a same layer. The horizontal current supply line (H-VDD, 130) is electrically connected to the longitudinal current supply line (V-VDD, 154) through first contact holes 140 and 141. The horizontal and longitudinal current supply lines (H-VDD and V-VDD, 130 and 154) form a net shape to decrease a resistance of the organic electro luminescent panel. The organic electro luminescent display apparatus may include a plurality of the scan lines, a plurality of the horizontal current supply lines, a plurality of the data lines and a plurality of the longitudinal current supply lines. Widths of the horizontal and longitudinal current supply lines (H-VDD and V-VDD, 130 and 154) are about 8 μm. The horizontal and longitudinal current supply lines (H-VDD and V-VDD, 130 and 154) may include a low-resistance metal.

Figure 9:
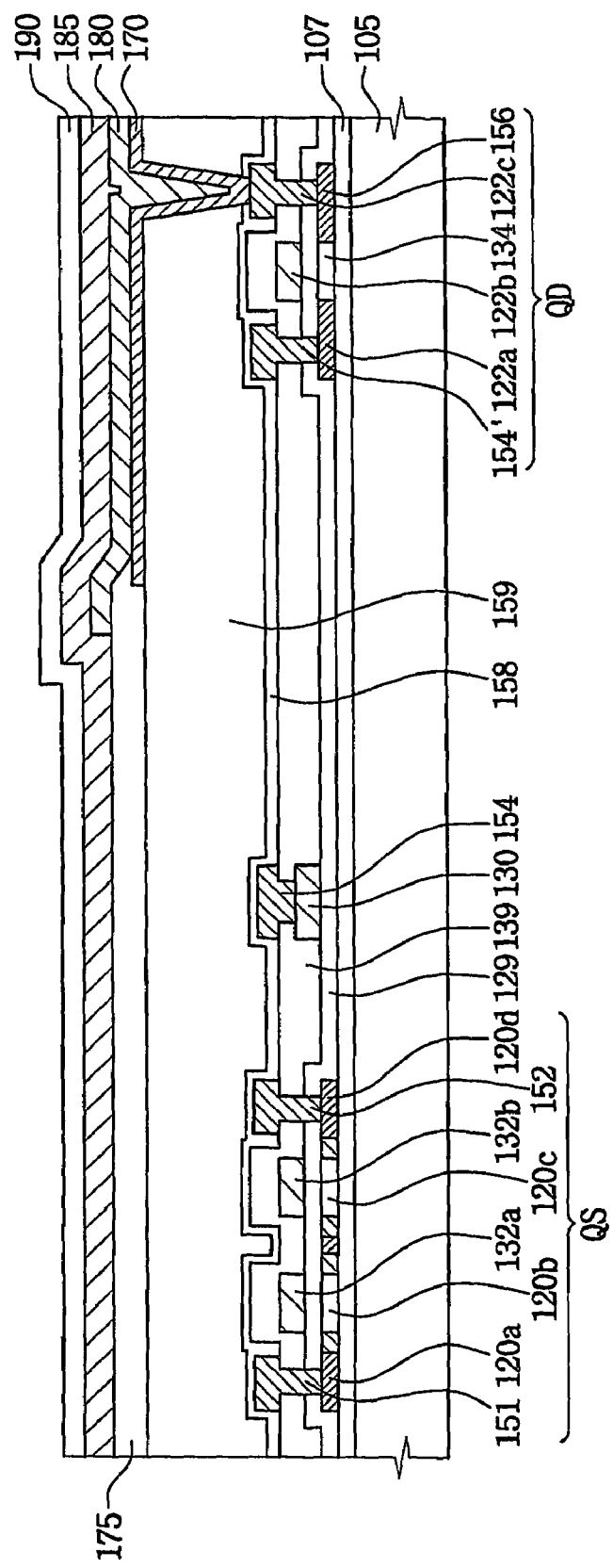
FIG. 9 is a cross-sectional view taken along the line A-A' of FIG. 8.

Referring to FIGS. 8 and 9, an insulating layer 107 is formed on a substrate 105. The substrate 105 includes a transparent material, for example, such as a glass, a quartz, a ceramic, a crystalline glass, etc. Preferably, the transparent material is heat resistive.

The insulating layer 107 may be omitted when the substrate 105 includes a transparent insulating material. The insulating layer 107 may include a silicon. The insulating layer 107 may include an oxide, a nitride or a mixture thereof. In this exemplary embodiment, the insulating layer 107 includes a silicon oxide, a silicon nitride or a silicon oxynitride.

The switching transistor (QS) is formed on the insulating layer 107. The switching transistor (QS) includes a first active layer, a gate insulating layer 129, first gate electrodes 132a and 132b, a first insulating interlayer 139, a first source electrode 151 and a first drain electrode 152. The first active layer includes a first source region 120a, first channel forming regions 120b and 120c and a first drain region 120d. The gate insulating layer 129 is formed on the first active layer, and includes two contact holes through which the first source region 120a and the first drain region 120d are exposed. The first gate electrodes 132a and 132b are formed on the gate insulating layer 129. The first insulating interlayer 139 is formed on the first gate electrodes 132a and 132b and the gate insulating layer 129, and includes two contact holes through which the first source region 120a and the first drain region 120d are exposed. The first source electrode 151 is formed on the first insulating interlayer 139, and electrically connected to the first source region 120a. The first drain electrode 152 is formed on the first insulating interlayer 139. The first drain electrode 152 is electrically connected to the first drain region 120d. The first gate electrodes 132a and 132b form a double-gate structure. The first gate electrodes may form a mono-gate structure or a triple-gate structure.

The horizontal current supply line 130 is formed on the first insulating interlayer 139 in the horizontal direction. The longitudinal current supply line 154 is formed under the first insulating interlayer 139 in the longitudinal direction. The horizontal current supply line 130 is electrically connected to the longitudinal current supply line 154 through the contact hole of the first insulating interlayer 139.

A driving transistor (QD) is formed on the insulating layer 107 to control a current flow. The driving transistor (QD) includes a second active layer, the gate insulating layer 129, a second gate electrode 134, the first insulating interlayer 139, a second source electrode 154' and a second drain electrode 156. The second active layer includes a second source region 122a, a second channel forming region 122b and a second drain region 122c. The gate insulating layer 129 is formed on the second active layer, and further includes two contact holes through which the second source region 122a and the second drain region 122c are exposed. The second gate electrode 134 is formed on the gate insulating layer 129. The first insulating interlayer 139 is formed on the second gate electrode 134 and the gate insulating layer 129, and further includes two contact holes through which the second source region 122a and the second drain region 122c are exposed. The second source electrode 154' is formed on the first insulating interlayer 139, and electrically connected to the second source region 122a. The second drain electrode 156 is formed on the first insulating interlayer 139, and electrically connected to the second drain region 122c. The second gate electrode 136 forms the mono-gate structure. Alternatively, the second gate electrodes may form the double-gate structure or the triple-gate structure.

A second insulating interlayer 158 is formed on the driving transistor (QD), the longitudinal current supply line 154 and the switching transistor (QS). A planarizing layer 159 is formed on the second insulating interlayer 158.

A pixel electrode layer 170 includes a conductive oxide such as indium tin oxide (ITO). The pixel electrode layer 170 is electrically connected to the second drain electrode 156 of the driving transistor (QD) through a hole of the second insulating interlayer 158.

A partition wall 175 is formed on the pixel electrode layer 170. The partition wall 175 defines a light emitting region. An organic electro luminescent layer 180 is formed in the light emitting region. A counter electrode layer 185 is formed on the organic electro luminescent layer 180 and the partition wall 175. The organic electro luminescent layer 180 may have a multi-layered structure so as to improve luminance. The organic electro luminescent layer 180 includes a hole injection film formed on the pixel electrode layer 170, a hole transporting film formed on the hole injection film, a light emitting film formed on the hole transporting film and an electron transporting film formed on the light emitting film. Alternatively, the organic electro luminescent layer 180 may include a hole transporting film formed on the pixel electrode layer 170, the light emitting film formed on the hole transporting film and the electron transporting film formed on the light emitting film. The organic electro luminescent layer 180 may also include the hole injection film formed on the pixel electrode layer 170, the hole transporting film formed on the hole injection film, the light emitting film formed on the hole transporting film, the electron transporting film formed on the light emitting film and an electron injection film formed on the electron transporting film. The organic electro luminescent display apparatus may be an active type. When the active organic electro luminescent display apparatus has a bottom illumination type, the organic electro luminescent layer 180 may generate a light corresponding to a red light, a green light or a blue light. Also, the counter electrode layer 185 may include a metal. When the pixel electrode layer 170 is an anode electrode, the counter electrode layer 185 is a cathode electrode. When the counter electrode layer 185 is the anode electrode, the pixel electrode layer 170 is the cathode electrode.

In addition, when the active organic electro luminescent display apparatus has a top illumination type, the organic electro luminescent layer 180 may also generate the light corresponding to the red light, the green light or the blue light. Also, the counter electrode layer 185 may include a transparent conductive material such as the indium tin oxide (ITO).

Alternatively, the organic electro luminescent display apparatus may also include a color filter. When the organic electro luminescent display apparatus having the color filter includes the bottom illumination type, the color filter corresponding to the red light, the green light or the blue light is disposed between the planarizing layer 159 and the second insulating interlayer 158. The counter electrode layer 185 may include the metal.

In addition, when the organic electro luminescent display apparatus having the color filter includes the top illumination type, the color filter corresponding to the red light, the green light or the blue light is disposed between the planarizing layer 159 and the second insulating interlayer 158. The counter electrode layer 185 may include the transparent conductive material such as the indium tin oxide (ITO).

In this exemplary embodiment, the organic electro luminescent display apparatus has the bottom illumination type. The horizontal current supply line (H-VDD) blocks a portion of the light to decrease a light emitting area. In contrast, a horizontal current supply line of the organic electro luminescent display apparatus having the top illumination type is disposed under a light emitting region so that the horizontal current supply line may not block the light.

FIGS. 10 to 17 are plan views showing a method of manufacturing an organic electro luminescent display apparatus in accordance with an exemplary embodiment of the present invention.

Figure 10:
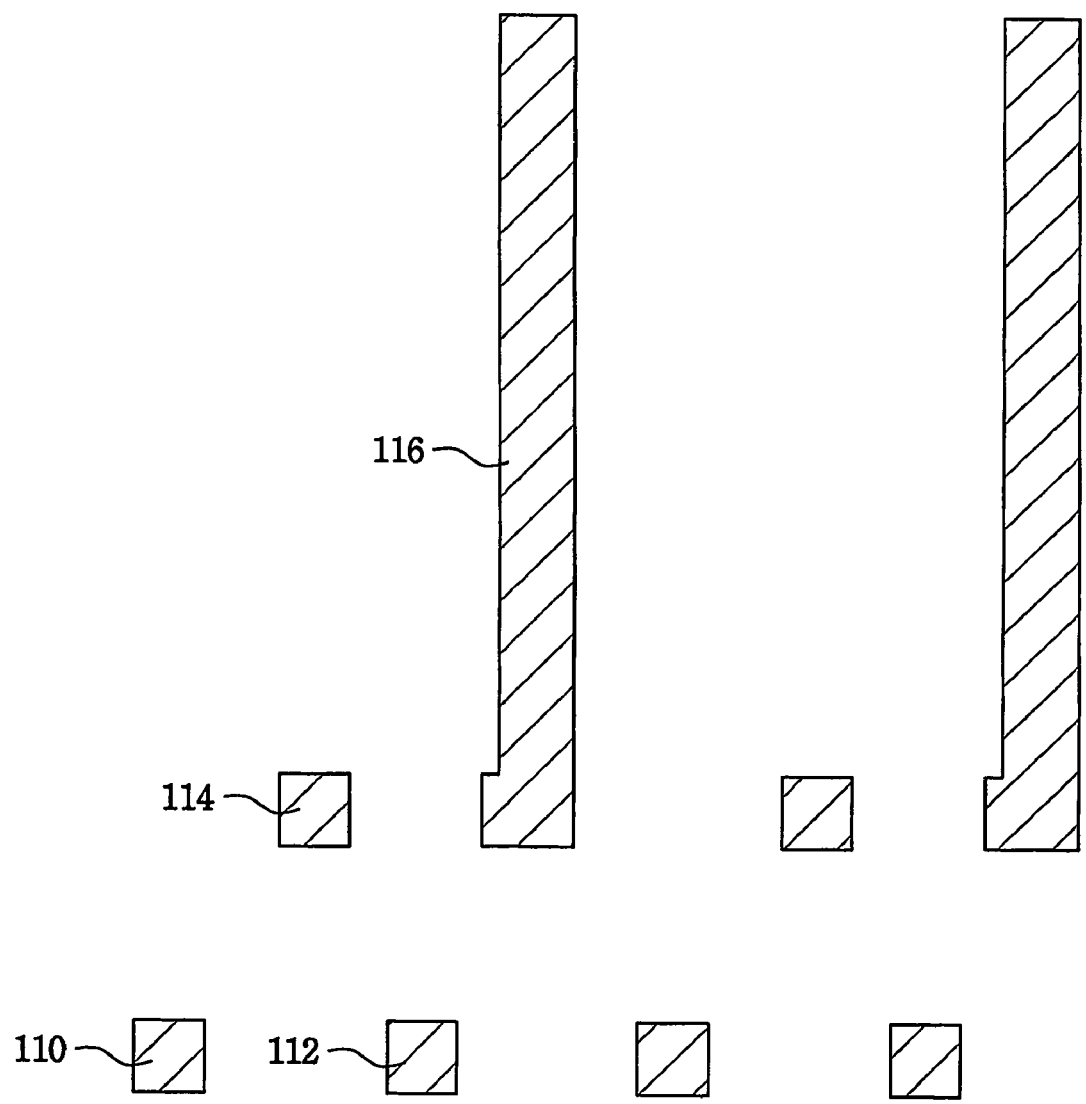
FIGS. 10 to 17 are plan views showing a method of manufacturing an organic electro luminescent display apparatus in accordance with an exemplary embodiment of the present invention.

Referring to FIG. 10, a first buffer layer 110 for the first source electrode of the switching transistor, a second buffer layer 112 for the first drain electrode of the switching transistor, a third buffer layer 114 for the second drain electrode of the driving transistor and a fourth buffer layer 116 for the second source electrode of the driving transistor are formed on the insulating layer (not shown) that is formed over the substrate.

Figure 11:
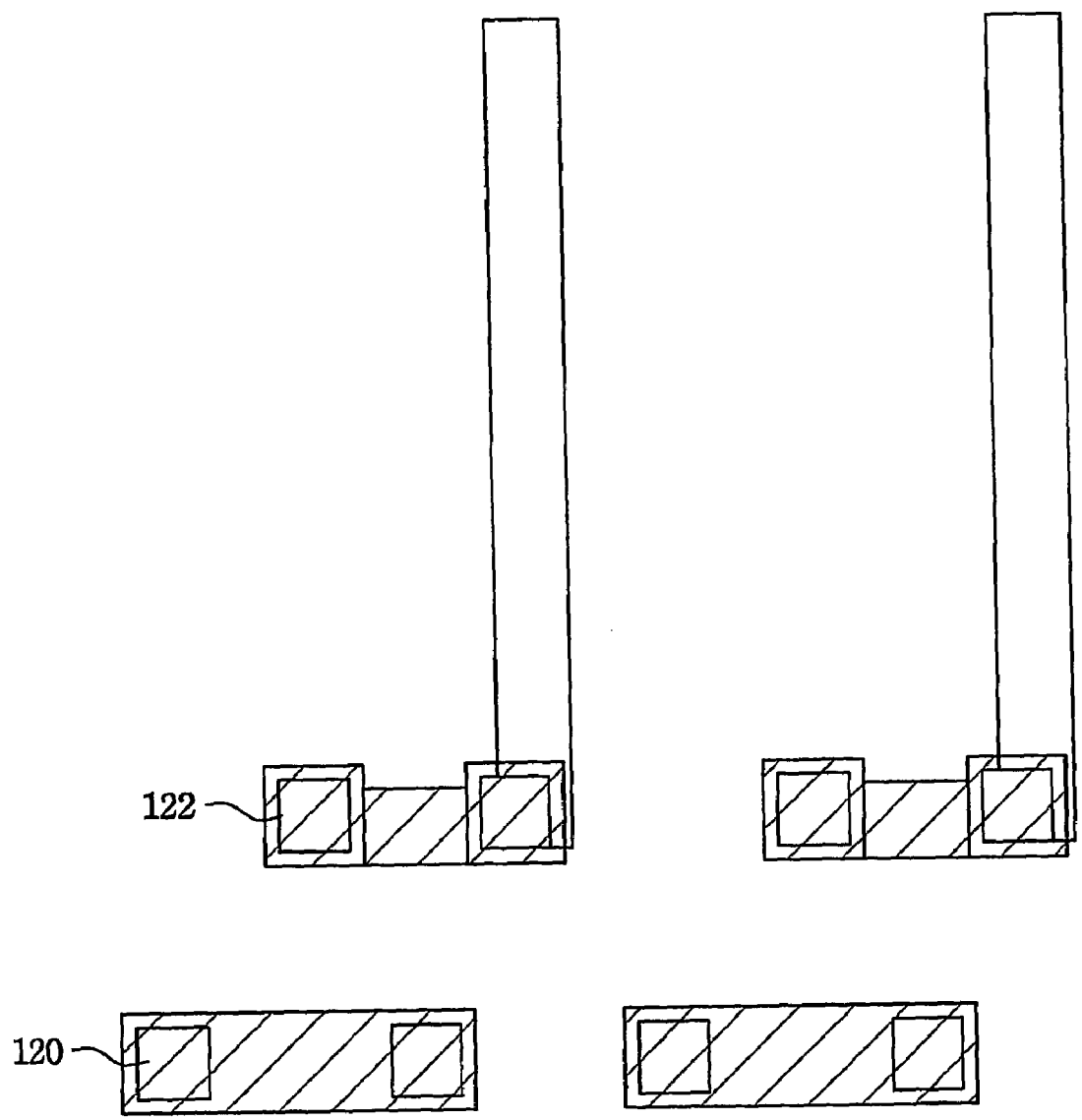

Referring to FIG. 11, a first active layer 120 corresponding to the switching transistor and a second active layer 122 corresponding to the driving transistor that controls a current are formed on the insulating layer having the first to fourth buffer layers 110, 112, 114 and 116. The first active layer 120 includes the first source region, the first channel forming region and the first drain region. The second active layer 122 includes the second source region, the second channel forming region and the second drain region.

Figure 12:
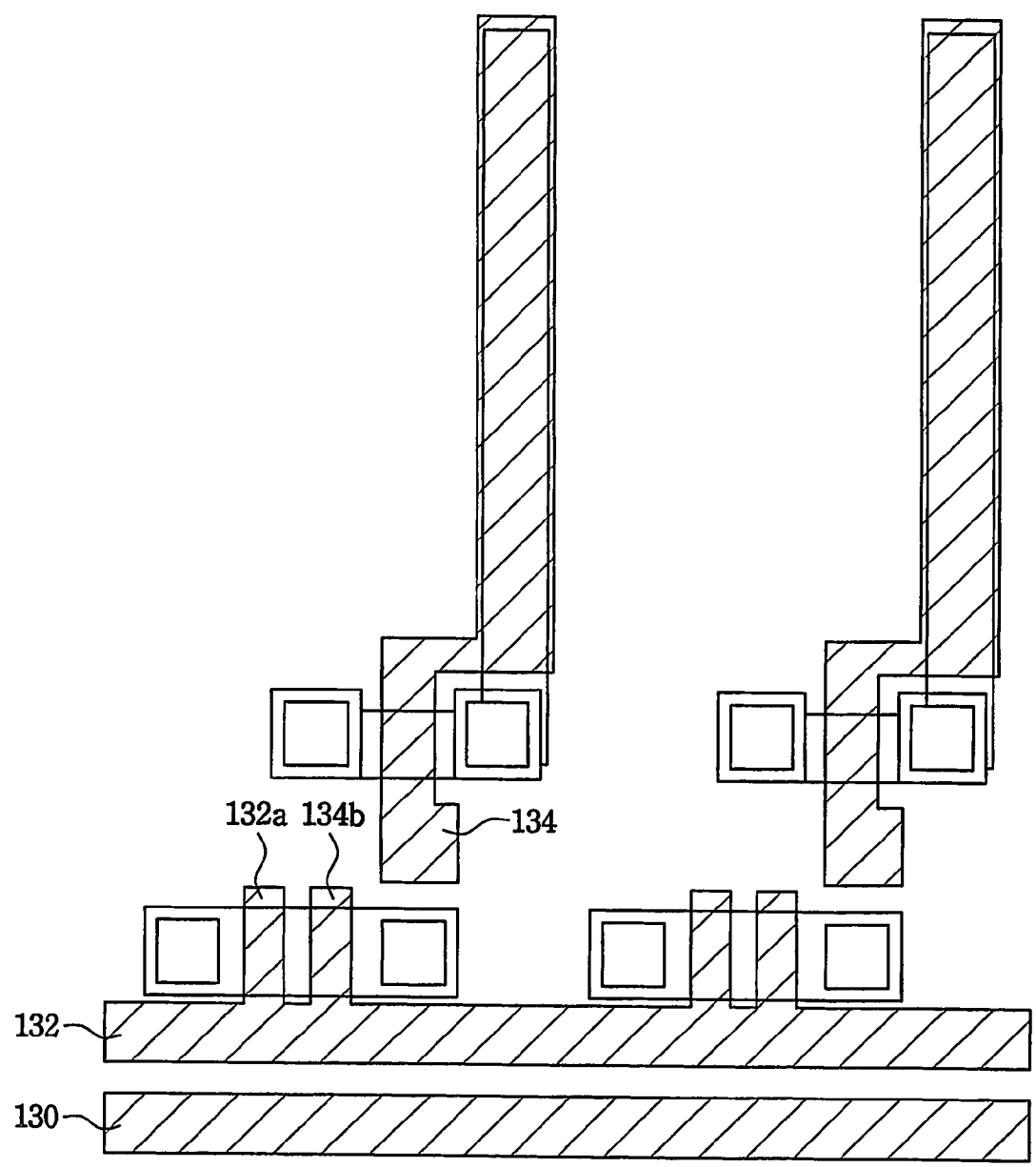

Referring to FIG. 12, a metal layer is formed on the substrate having the first and second active layers 120 and 122. The metal layer is patterned to form the scan line 132, the current supply line 130, the storage capacitor line 134 and the first gate electrodes 132a and 132b. The scan line 132 and the current supply line 130 are extended in the horizontal direction. The storage capacitor line 134 is extended in the longitudinal direction. In this exemplary embodiment, the switching transistor includes the double-gate structure. Alternatively, the metal layer may be patterned to form the first gate electrode having the mono-gate structure.

Figure 13:
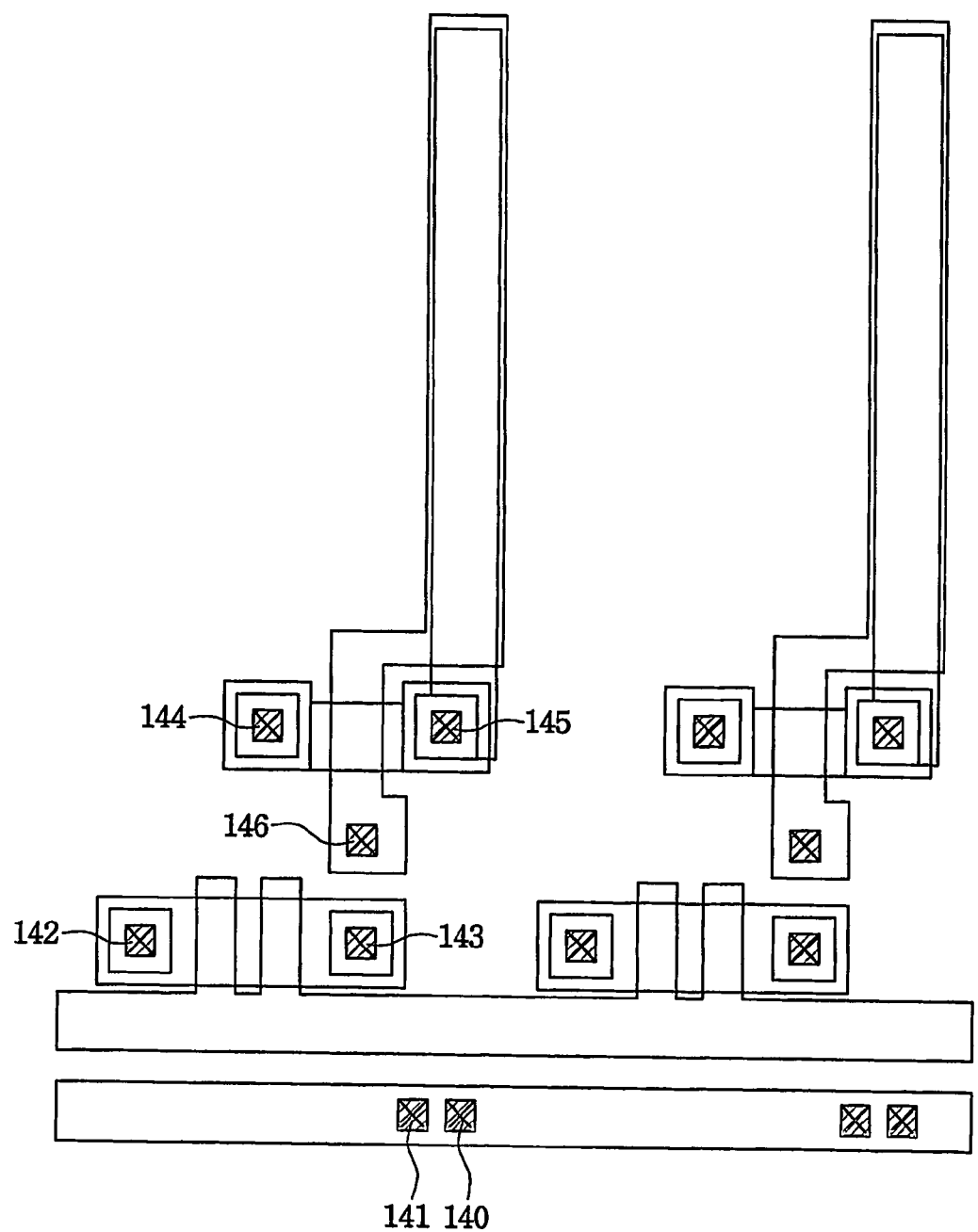

Referring to FIG. 13, the first contact holes 140 and 141 corresponding to the horizontal current supply line 130, second contact holes 142 and 143 corresponding to the first active layer 120 and third contact holes 144 and 145 corresponding to the second active layer 122 are then formed. The longitudinal current supply line is electrically connected to the horizontal current supply line 130 through the first contact holes 140 and 141. The first source electrode and the first drain electrode of the switching transistor are formed at positions corresponding to the second contact holes 142 and 143. The second source electrode and the second drain electrode of the driving transistor are formed at positions corresponding to the third contact holes 144 and 145.

Figure 14:
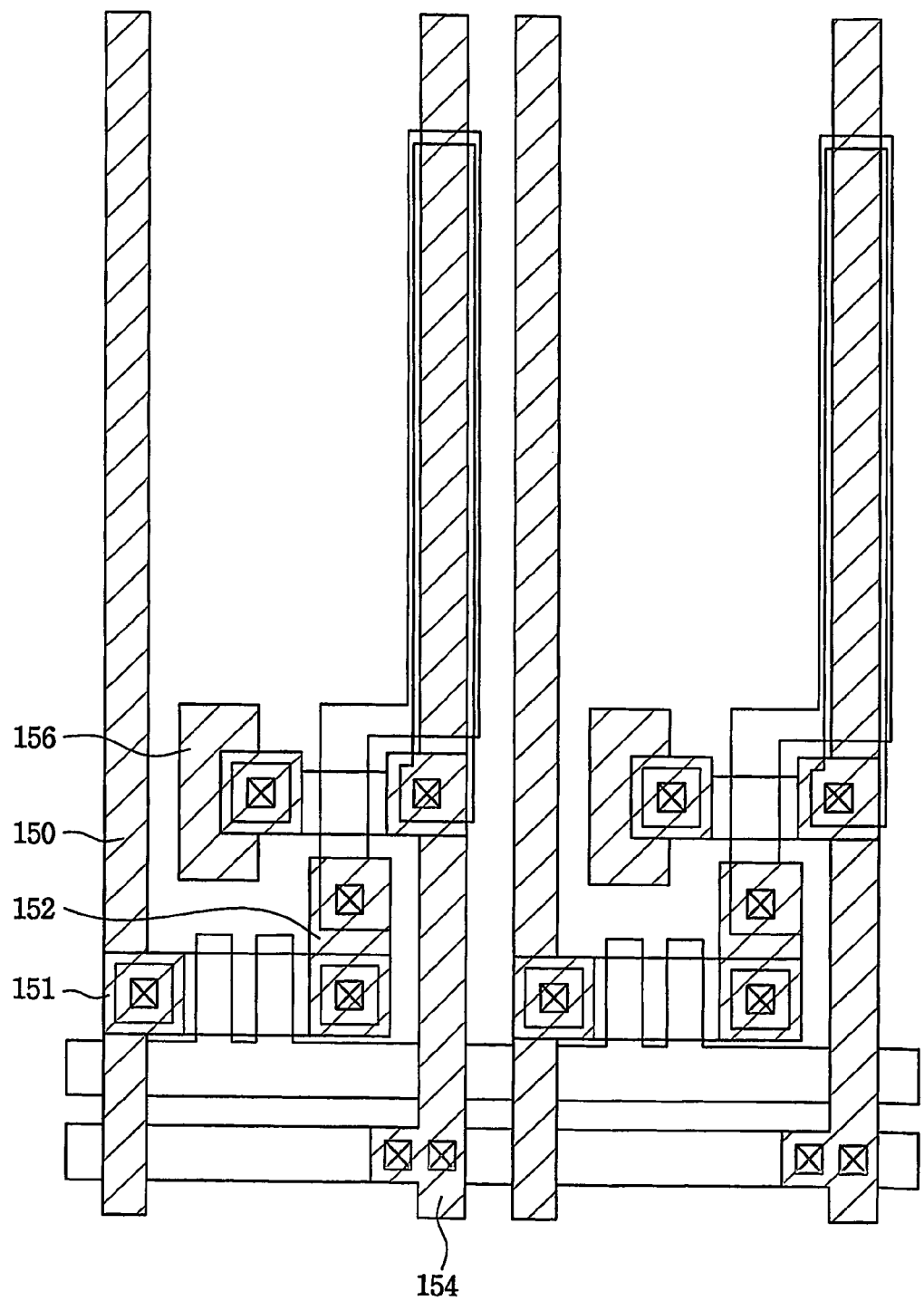

Referring to FIG. 14, the data line 150, the first source electrode 151, a first pattern 152 for the first drain electrode of the switching transistor, the longitudinal current supply line 154 and a second pattern 156 are then formed. The data line 150 is extended in the longitudinal direction. The first source electrode 151 is electrically connected to the data line 150, and electrically connected to the first source region 120a through the second contact hole 142.

Figure 15:
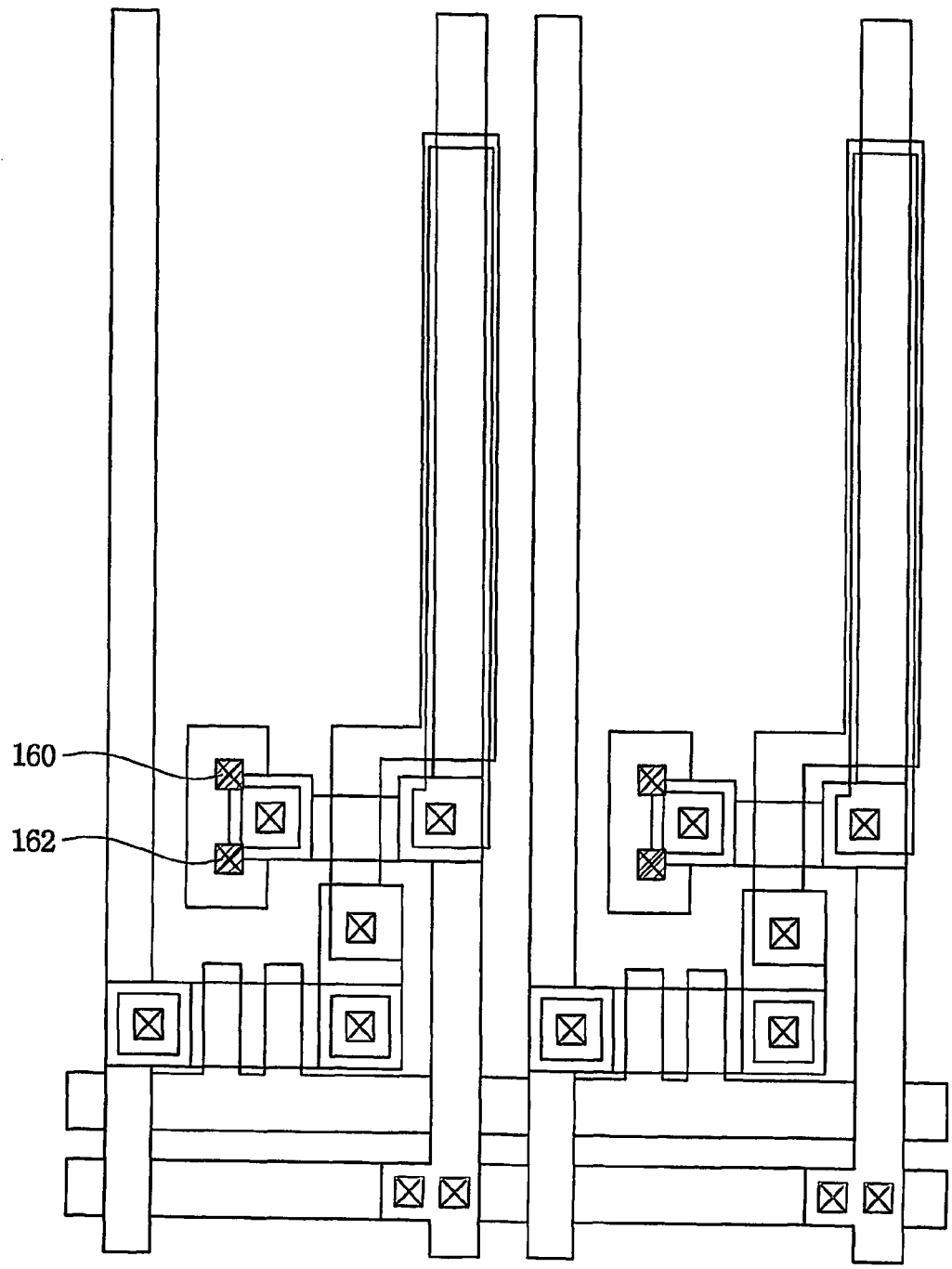

Referring to FIG. 15, contact holes 160 and 162 through which the second drain electrode of the driving transistor is electrically connected to the pixel electrode layer including the indium tin oxide (ITO) are then formed.

Figure 16:
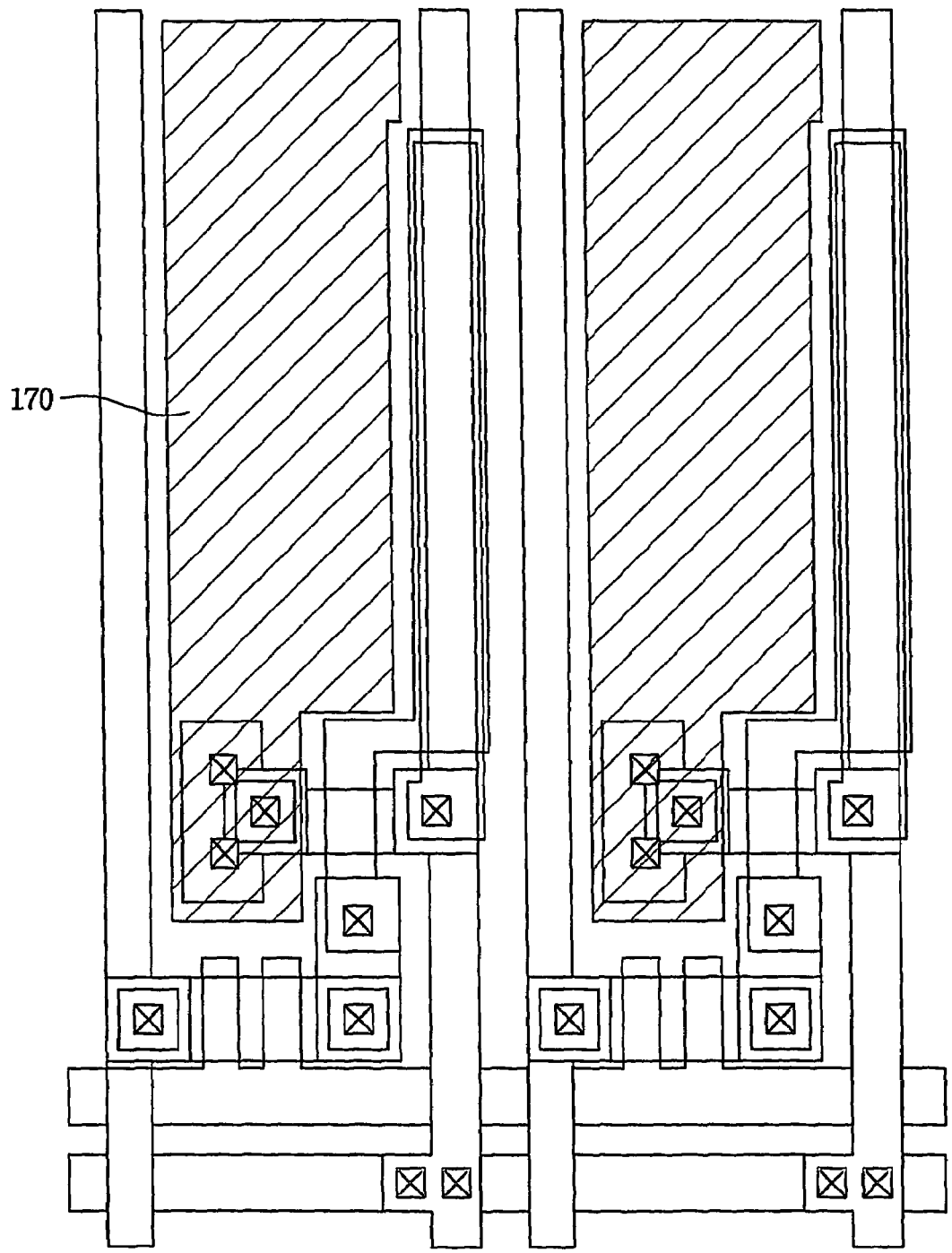

Referring to FIG. 16, the pixel electrode layer 170 including the indium tin oxide (ITO) is then formed.

Figure 17:
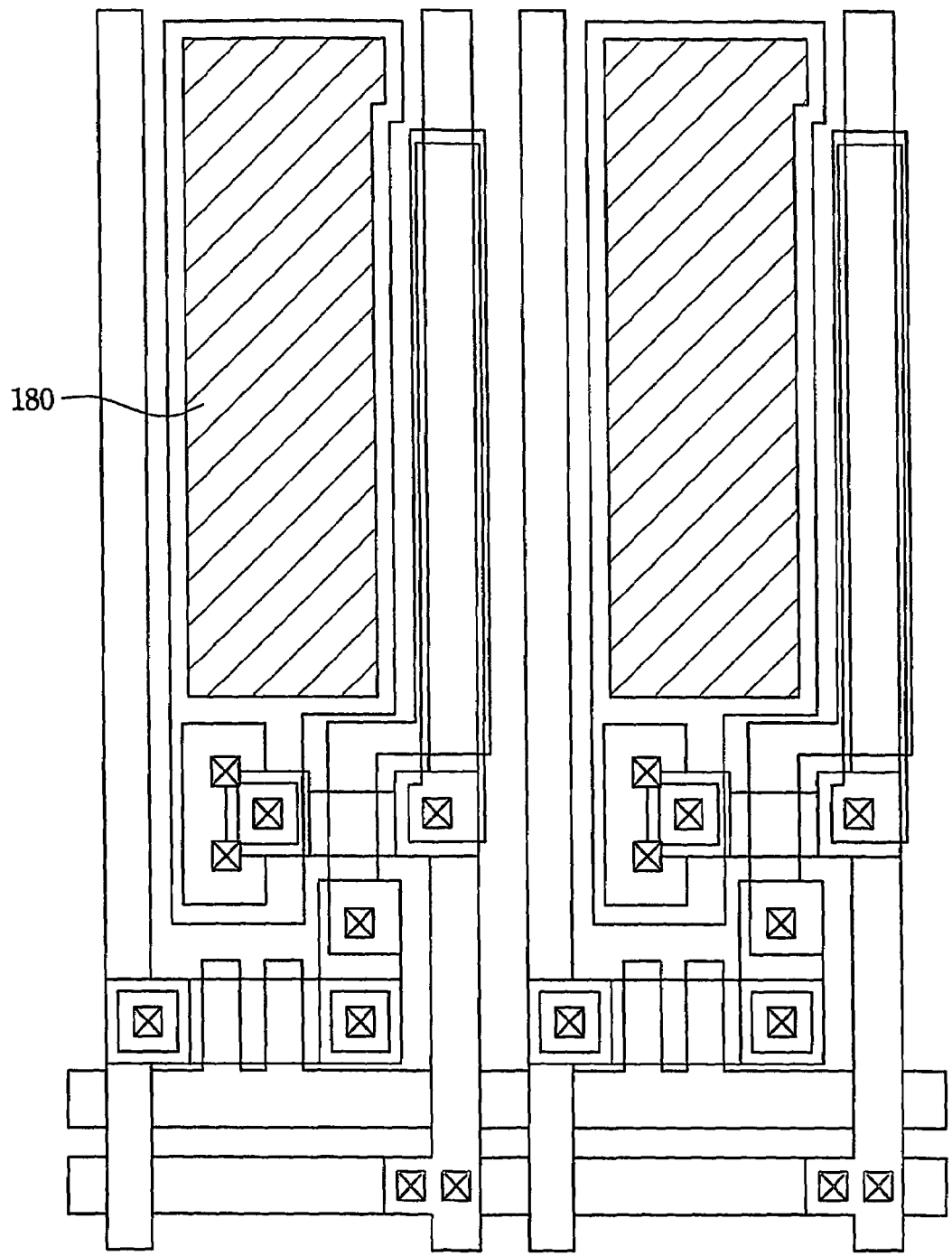

Referring to FIG. 17, the partition wall 175 is formed to define the light emitting region where the organic electro luminescent layer is received. The organic electro luminescent layer 180 is formed in the light emitting region. The counter electrode layer 185 is formed on the organic electro luminescent layer 180 and the partition wall 175. A protection layer 190 is formed on the counter electrode layer 185.

The longitudinal current supply lines and the horizontal current supply lines form the net shape, and each of the pixels is electrically connected to one of the longitudinal current supply lines and one of the horizontal current supply lines.

That is, the horizontal current supply lines may be electrically connected to the longitudinal current supply lines at every unit pixels.

When a voltage is applied to an end portion of each of the longitudinal current supply lines, a portion of the horizontal current supply lines disposed adjacent to the end portion of each of the longitudinal current supply lines where the voltage is applied may be omitted. Also, a portion of the horizontal current supply lines spaced apart from the end portion of each of the longitudinal current supply lines where the voltage is applied thereto is electrically connected to all the longitudinal current supply lines. In addition, remaining horizontal current supply lines disposed between the horizontal current supply lines disposed adjacent to the end portion and the horizontal current supply lines spaced apart from the end portion are electrically connected to a portion of the longitudinal current supply lines with a predetermined density.

Alternatively, when the voltage is applied to both end portions of each of the longitudinal current supply lines, a portion of the horizontal current supply lines disposed adjacent to the end portions of each of the longitudinal current supply lines where the voltage is applied may be omitted. Also, the remaining horizontal current supply lines disposed between the horizontal current supply lines disposed adjacent to the end portions are electrically connected to a portion of the longitudinal current supply lines with the density.

Figure 18:
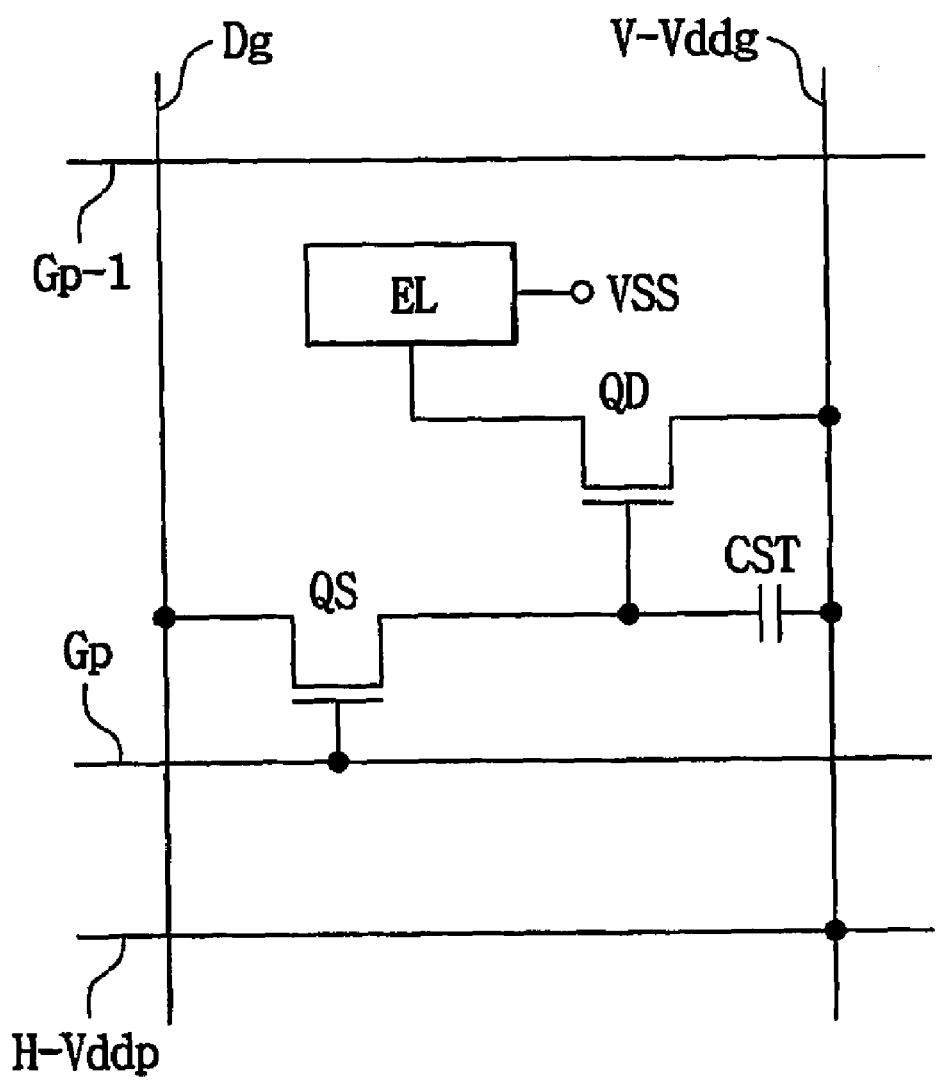
FIG. 18 is a circuit diagram showing a unit pixel of an organic electro luminescent display apparatus in accordance with another exemplary embodiment of the present invention.

FIG. 18 is a circuit diagram showing a unit pixel of an organic electro luminescent display apparatus in accordance with another exemplary embodiment of the present invention. A switching transistor and a driving transistor of the organic electro luminescent display apparatus include N-channel metal oxide semiconductor (NMOS) transistors.

Referring to FIG. 18, a unit pixel of the organic electro luminescent display apparatus includes a switching transistor (QS), a storage capacitor (CST), a driving transistor (QD) and an organic electro luminescent element (EL). The switching transistor (QS), the storage capacitor (CST), the driving transistor (QD) and the organic electro luminescent element (EL) are formed in a region defined by a p-th scan line (Gp), a g-th data line (Dg) and a g-th longitudinal current supply line (V-Vddg). A p-th scan signal, a g-th data signal and a first voltage are applied to the p-th scan line (Gp), the g-th data line (Dg) and the g-th longitudinal current supply line (V-Vddg), respectively. The switching transistor (QD) and the driving transistor (QD) include the N-channel metal oxide semiconductor (NMOS) transistors. Each of the N-channel metal oxide semiconductor (NMOS) transistors includes an amorphous silicon layer and an N+ amorphous silicon layer implanted with N+ impurities.

A p-th horizontal current supply line (H-Vddp) is substantially in parallel with the p-th scan line (Gp). A second voltage is applied to the p-th horizontal current supply line (H-Vddp). The p-th horizontal current supply line (H-Vddp) is electrically connected to the g-th longitudinal current supply line (V-Vddg). The g-th longitudinal current supply line (V-Vddg) and the g-th data line (Dg) are formed from a same layer. The g-th longitudinal current supply line (V-Vddg) is extended in a longitudinal direction that is substantially in parallel with the g-th data line (Dg). The organic electro luminescent display apparatus may include a plurality of the pixels, a plurality of the scan lines, a plurality of the horizontal current supply lines, a plurality of the data lines and a plurality of the longitudinal current supply lines. The number of the pixels that are electrically connected to each of the longitudinal current supply lines may be equal to that of the scan lines.

The p-th longitudinal current supply line (H-Vddp) is extended in the horizontal direction that is substantially in parallel with the scan line. The horizontal current supply line (H-Vddp) is electrically connected to the longitudinal current supply lines (V-Vddg and V-Vddg+1).

Figure 19:
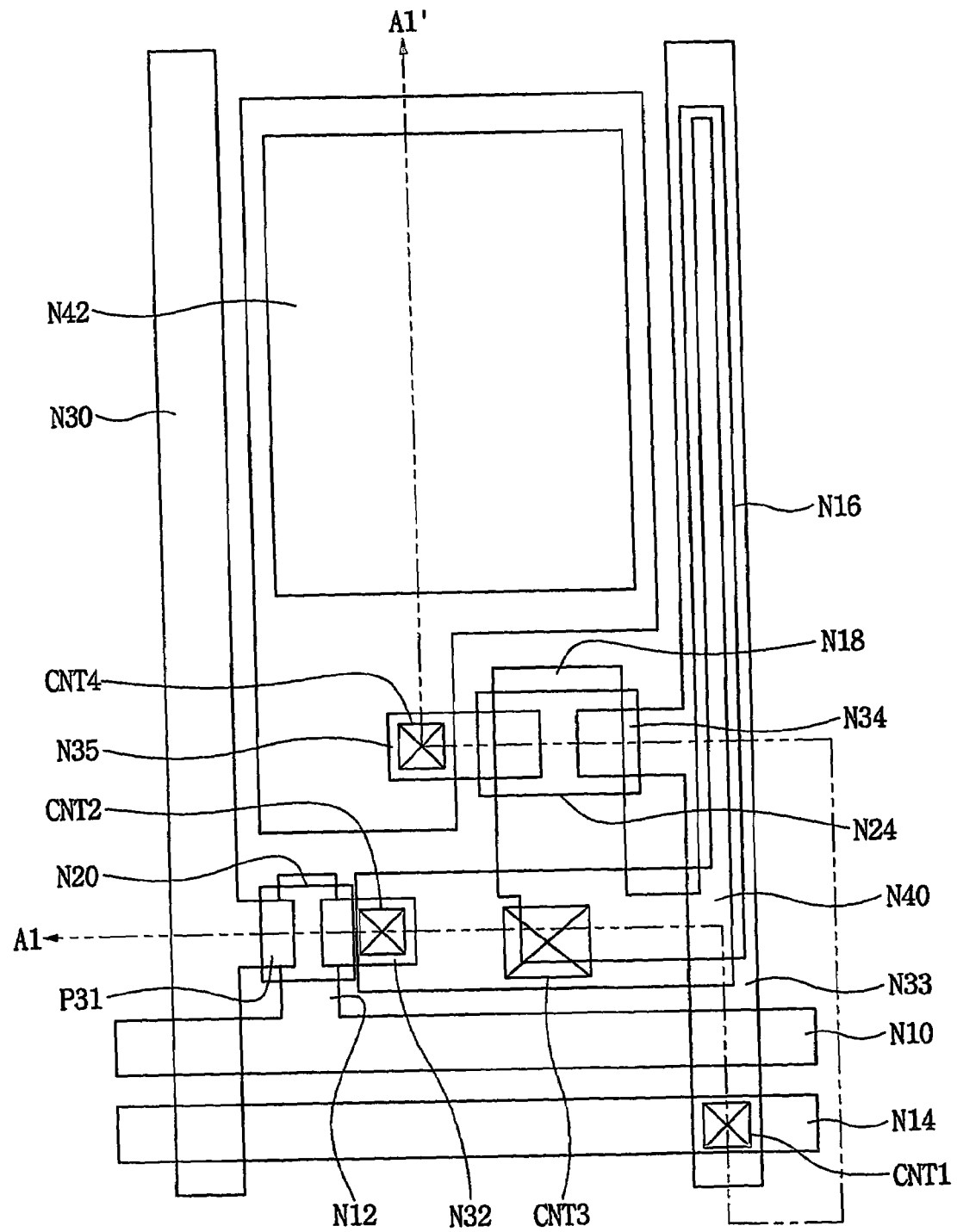
FIG. 19 is a plan view showing a unit pixel of an organic electro luminescent display apparatus in accordance with another exemplary embodiment of the present invention.
Figure 20:
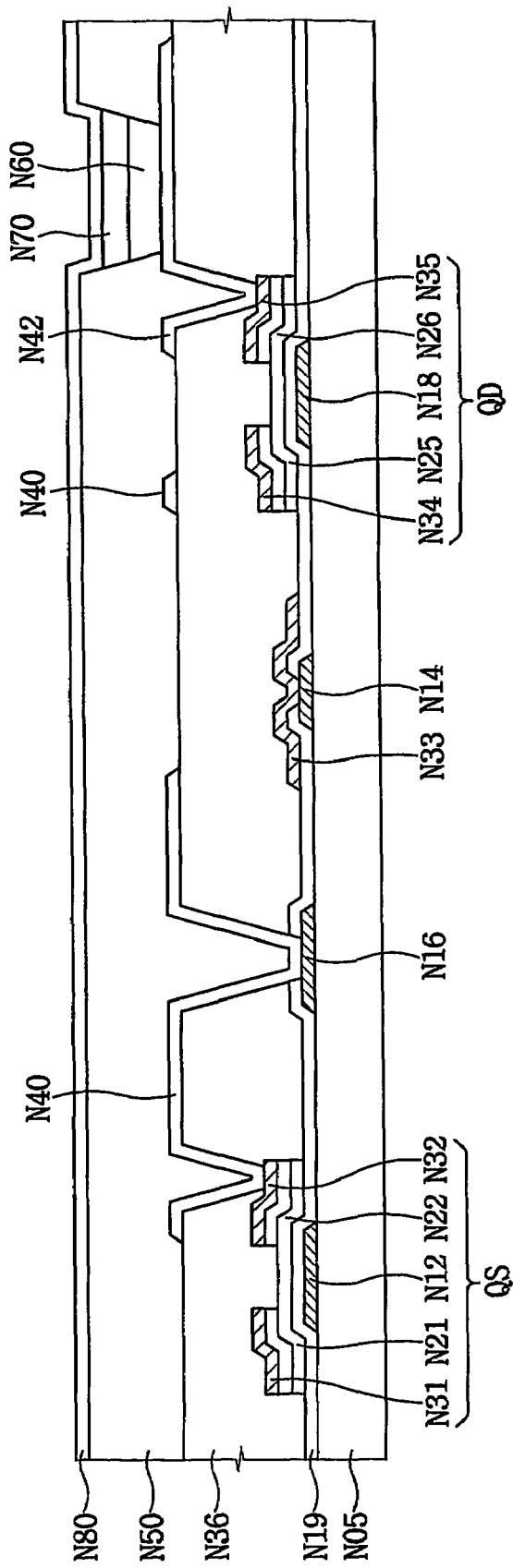
FIG. 20 is a cross-sectional view taken along the line A1-A1' of FIG. 19.

FIG. 19 is a plan view showing a unit pixel of an organic electro luminescent display apparatus in accordance with another exemplary embodiment of the present invention. FIG. 20 is a cross-sectional view taken along the line A1-A1' of FIG. 19.

Referring to FIGS. 19 and 20, the organic electro luminescent panel includes a scan line N10, a horizontal current supply line N30, a switching transistor (QS), a driving transistor (QD), a longitudinal current supply line N33, a first ITO pattern N40, a second ITO pattern N42, a partition wall N50, an organic electro luminescent layer N60, a counter electrode layer N70 and a protection layer N80. The organic electro luminescent panel may include a plurality of the scan lines, a plurality of the horizontal current supply lines, a plurality of the switching transistors, a plurality of the driving transistors, a plurality of the longitudinal current supply lines, a plurality of the first ITO patterns, a plurality of the second ITO patterns, a plurality of the partition walls and a plurality of the organic electro luminescent layers.

FIGS. 21 to 24 are plan views showing a method of manufacturing an organic electro luminescent display apparatus in accordance with another exemplary embodiment of the present invention.

Figure 21:
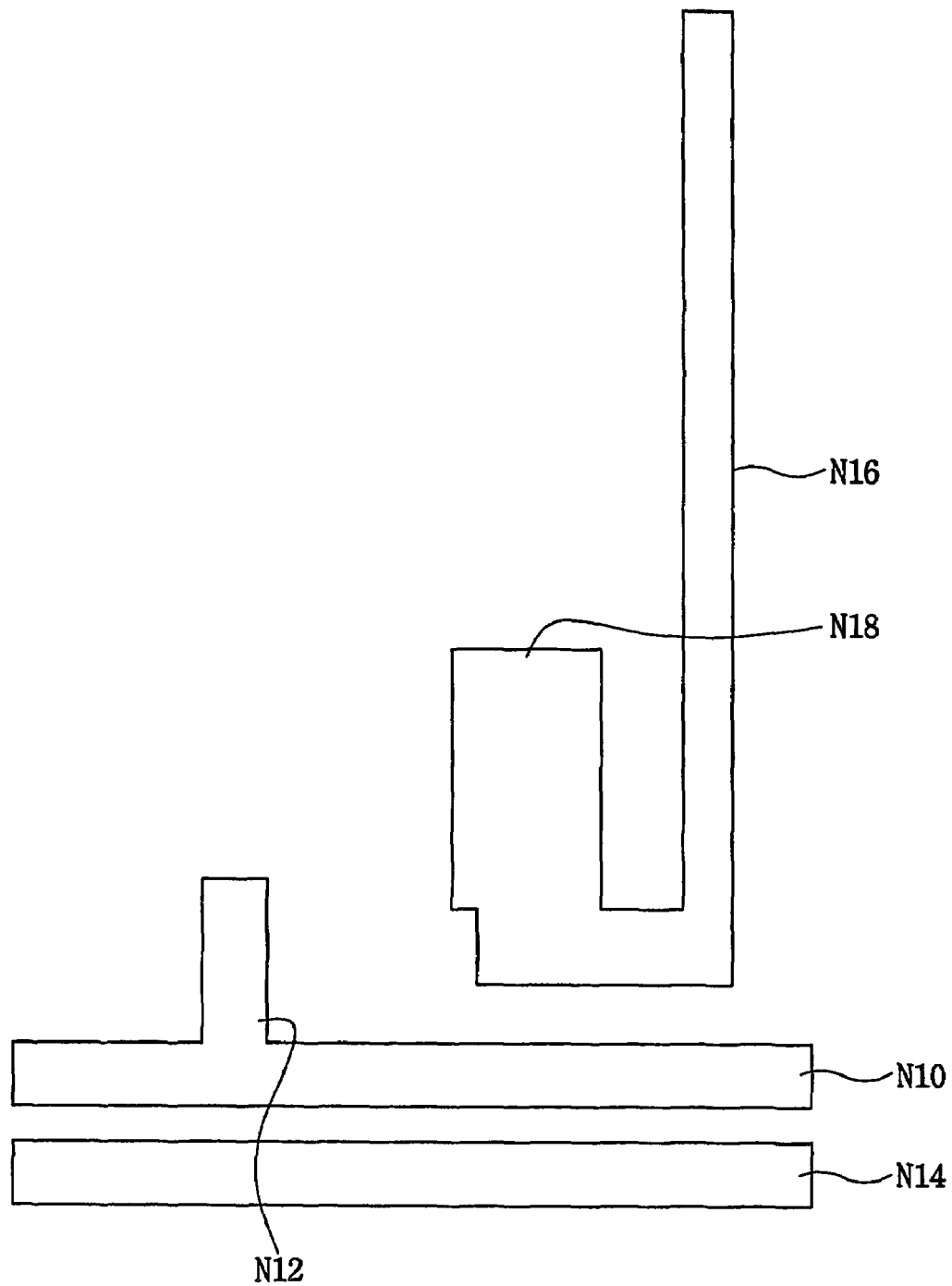
FIGS. 21 to 24 are plan views showing a method of manufacturing an organic electro luminescent display apparatus in accordance with another exemplary embodiment of the present invention.

Referring to FIG. 21, a metal, for example, such as tantalum (Ta), titanium (Ti), molybdenum (Mo), aluminum (Al), chromium (Cr), copper (Cu) or tungsten (W) is deposited on a substrate N05 including an insulating material, for example, such as a glass, a ceramic, etc. The deposited metal is patterned to form the scan line N10, a first gate electrode N12, a horizontal current supply line N14, a storage capacitor pattern N16 and a second gate electrode N18. The scan line N10 is extended in a horizontal direction. The first gate electrode N12 is electrically connected to the scan line N10. The horizontal current supply line N14 is extended in the horizontal direction that is substantially in parallel with the scan line. The second gate electrode N18 is electrically connected to the storage capacitor N16.

Figure 22:
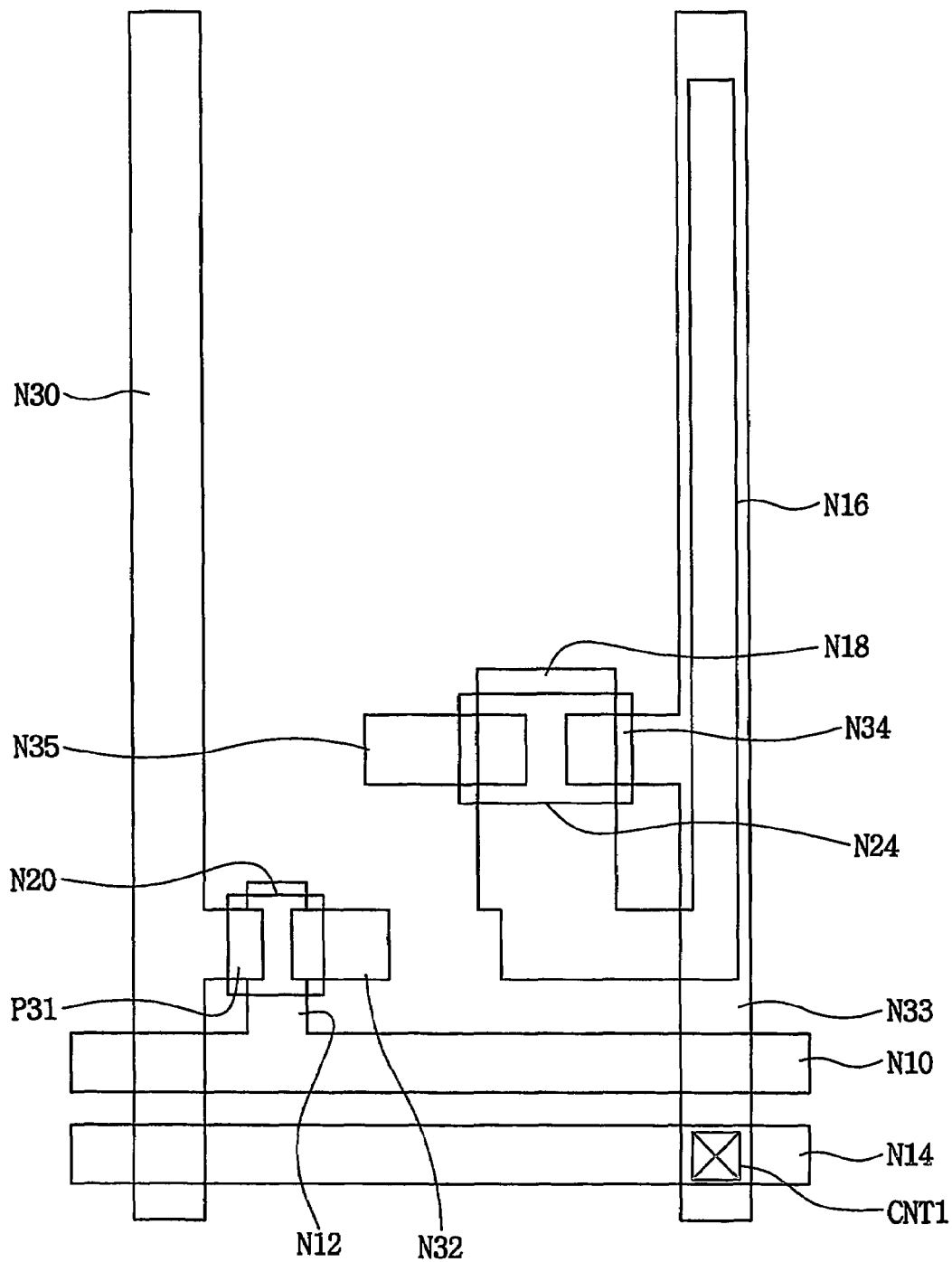

Referring to FIG. 22, a silicon nitride is deposited on the substrate N05 through a plasma chemical vapor deposition to form a gate insulating layer N19.

An amorphous silicon layer and an N+ amorphous silicon layer implanted with N+ impurities are formed on the gate insulating layer N19. The amorphous silicon layer and the N+ amorphous silicon layer are patterned to form the first active layer N20 and the second active layer N24. The first and second active layers N20 and N24 correspond to the first and second gate electrodes N12 and N18. The first active layer N20 includes a first semiconductor layer N21 and a first ohmic contact layer N22. The second active layer N24 includes a second semiconductor layer N25 and a second ohmic contact layer N26.

The gate insulating layer N19 corresponds to a portion of the horizontal current supply line N14 is partially etched to form a first contact hole (CNT1) to electrically connect the horizontal current supply line N14 to the longitudinal current supply line N33.

A metal is deposited and patterned to form the data line N30, a first source electrode N31, a first drain electrode N32, the longitudinal current supply line N33, a second drain electrode N34 and a second source electrode N35. The data line N30 is extended in the longitudinal direction. The first source electrode N31 is electrically connected to the data line N30. The first drain electrode N32 is spaced apart from the first source electrode N31. The longitudinal current supply line N33 is extended in the longitudinal direction. The second drain electrode N34 is electrically connected to the horizontal current supply line N33. The second source electrode N35 is spaced apart from the second drain electrode N34. The longitudinal current supply line N33 is electrically connected to the horizontal current supply line N14 formed thereunder through the first contact hole CNT1.

Figure 23:
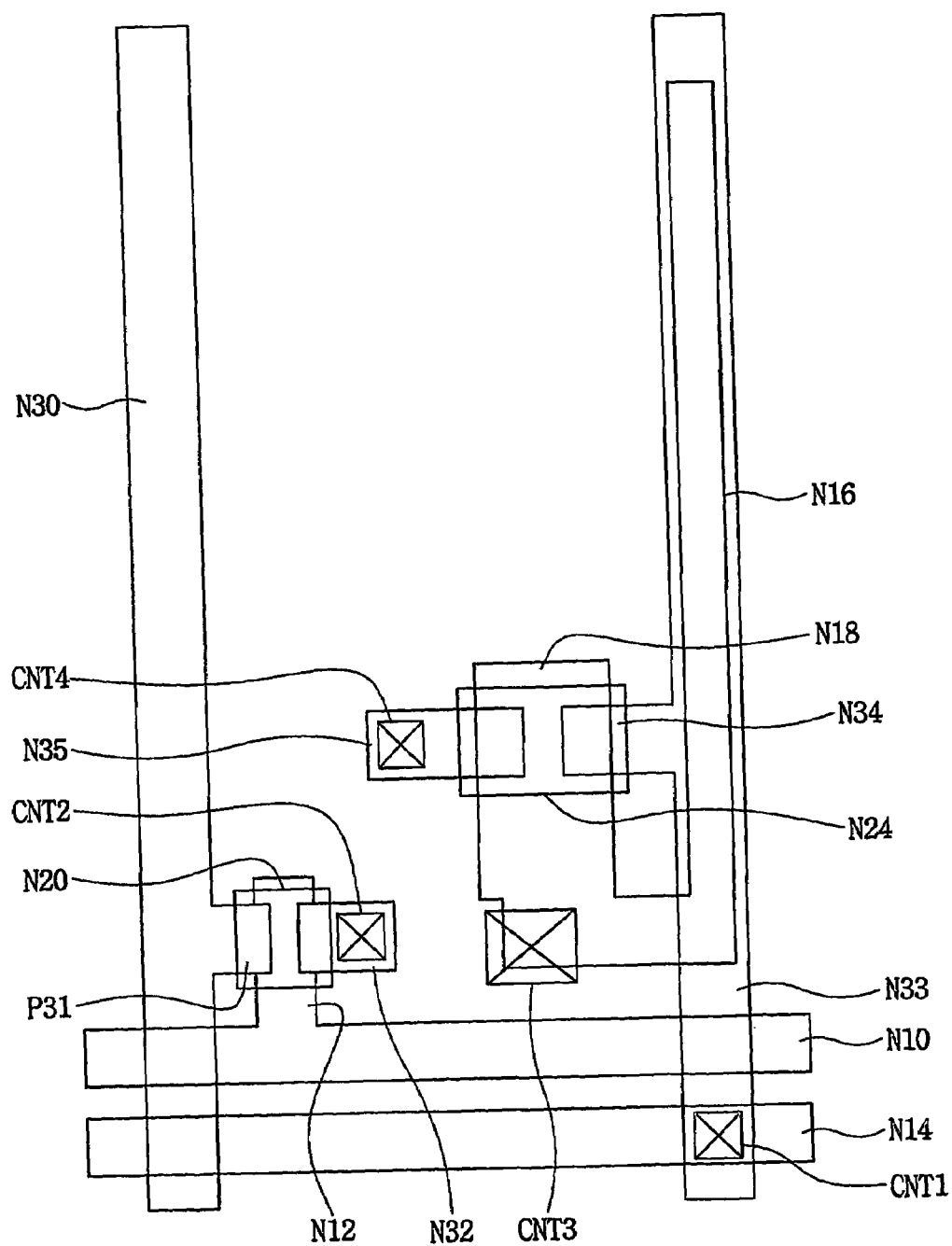

Referring to FIG. 23, a photoresist is then coated on the substrate through a spin coating method to form an insulating layer N36. The insulating layer N36 is partially etched to form a second contact hole CNT2, a third contact hole CNT3 and a fourth contact hole CNT4. The first drain electrode N32 of the switching transistor (QS) is partially exposed through the second contact hole CNT2. The switching transistor (QS) is electrically connected to the driving transistor (QD) through the third contact hole CNT3. The second source electrode N35 of the driving transistor (QD) is partially exposed through the fourth contact hole CNT4.

Figure 24:
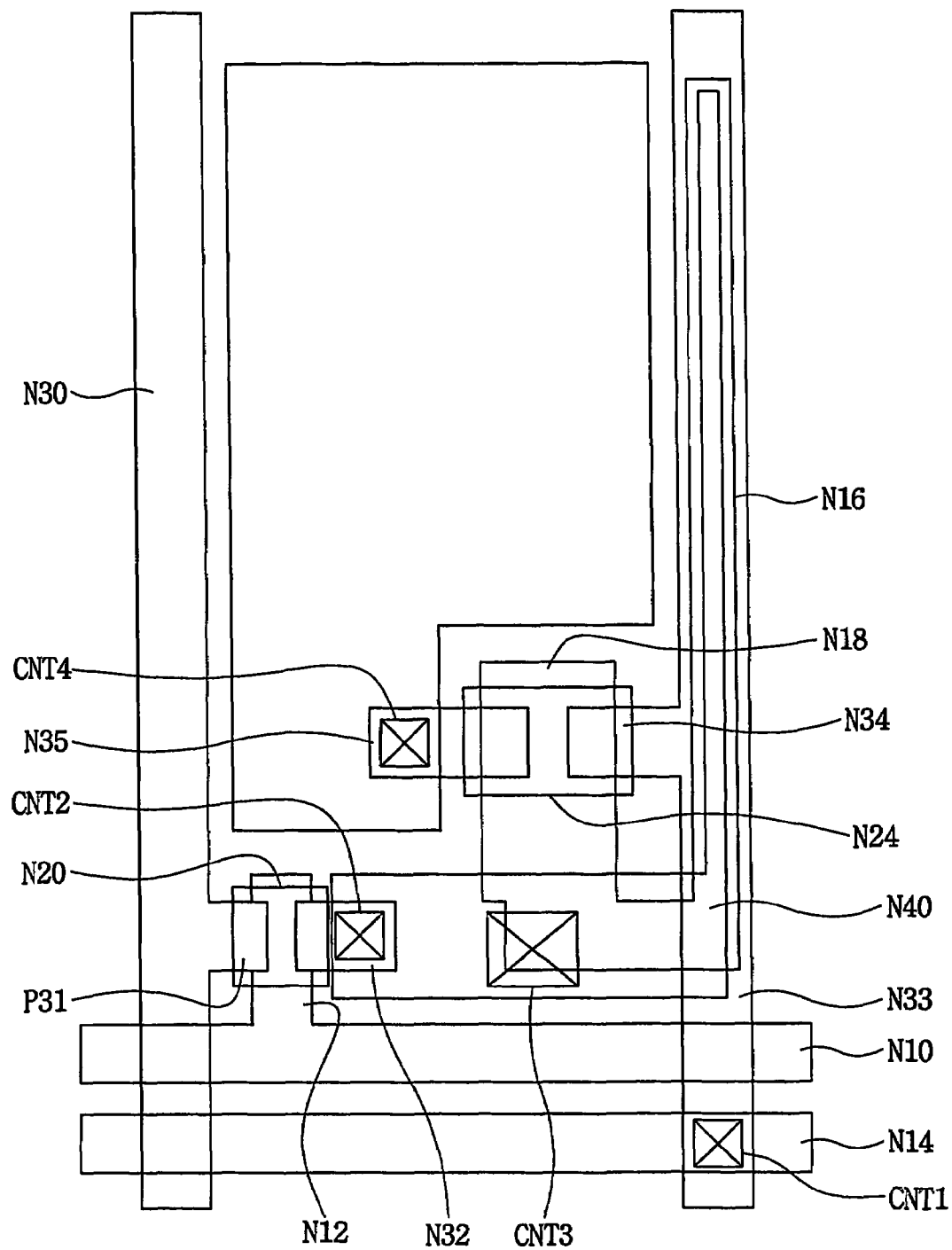

Referring to FIG. 24, the first and second ITO patterns N40 and N42 are then formed on the substrate to form a pixel electrode layer. The switching transistor (QS) is electrically connected to the driving transistor (QD) using the first ITO pattern N40. The second ITO pattern N42 is electrically connected to the second source electrode N31 of the driving transistor (QD). The first and second ITO patterns N40 and N42 may be formed through a patterning process. The first and second ITO patterns N40 and N42 may also be directly formed using a mask.

The partition wall N50 is formed to define a light emitting region where the organic electro luminescent layer N60 is received. The organic electro luminescent layer N60 is formed in the light emitting region. The counter electrode layer N70 is formed on the organic electro luminescent layer N60. The protection layer N80 is formed on the counter electrode N70.

According to this exemplary embodiment, the organic electro luminescent panel having the NMOS transistors as a driving element includes the horizontal current supply line N14 and the longitudinal current supply line N33 to decrease a resistance of the organic electro luminescent panel. The horizontal current supply line N14 and the horizontal scan line N10 are formed from a same layer. The longitudinal current supply line N33 and the longitudinal data line N30 are formed from a same layer. The horizontal current supply line N14 is electrically connected to the longitudinal current supply line N33 through the first contact hole CNT1. The organic electro luminescent panel may include the horizontal current supply lines and the longitudinal current supply lines that form a net shape. The horizontal current supply lines may be electrically connected to the longitudinal current supply lines at every unit pixels.

Figure 25:
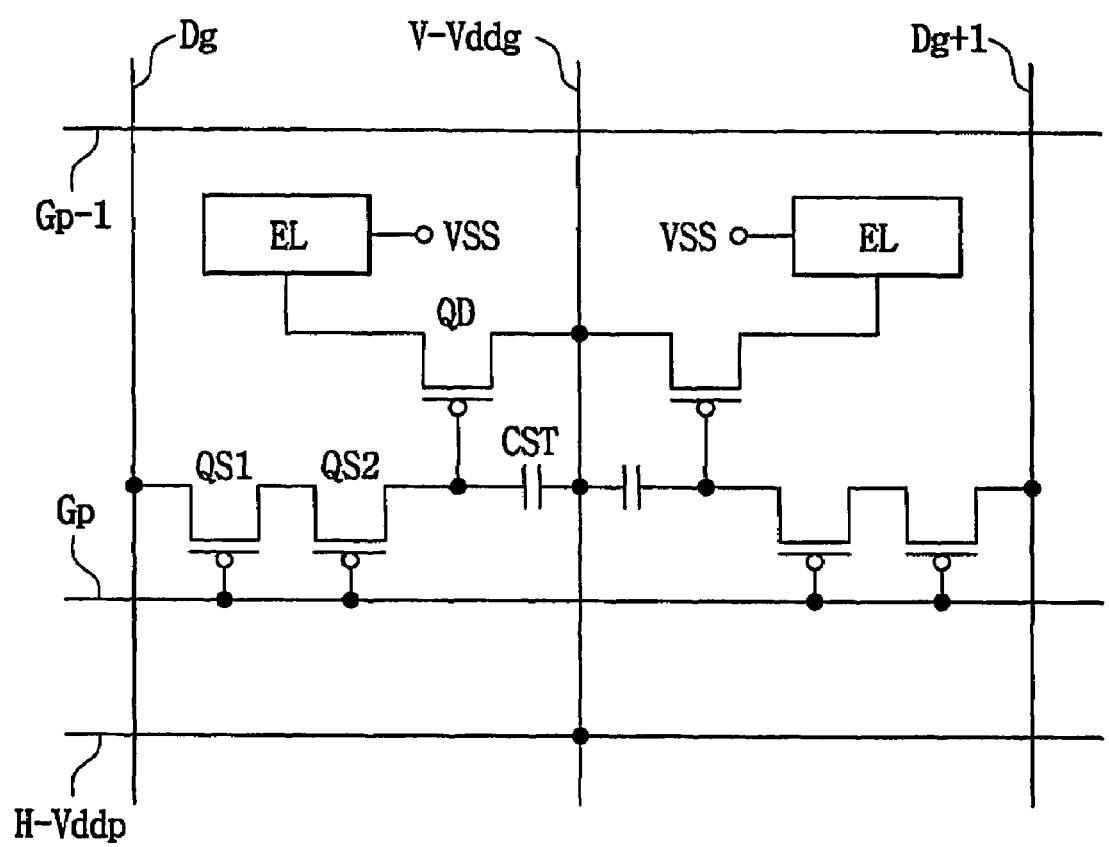
FIG. 25 is a circuit diagram showing a unit pixel of an organic electro luminescent display apparatus in accordance with another exemplary embodiment of the present invention.

FIG. 25 is a circuit diagram showing a unit pixel of an organic electro luminescent display apparatus in accordance with another exemplary embodiment of the present invention.

Referring to FIG. 25, the unit pixel includes a first switching transistor (QS1), a second switching transistor (QS2), a storage capacitor (CST), a driving transistor (QD) and an organic electro luminescent element (EL). The first switching transistor (QS1), the second switching transistor (QS2), the storage capacitor (CST), the driving transistor (QD) and the organic electro luminescent element (EL) are disposed in a region defined by a p-th scan line (Gp), a g-th data line (Dg) and a g-th longitudinal current supply line (V-Vddg). A p-th scan signal, a g-th data signal and a first voltage are applied to the p-th scan line (Gp), the g-th data line (Dg) and the g-th longitudinal current supply line (V-Vddg), respectively. A p-th horizontal current supply line (H-Vddp) is substantially in parallel with the scan line (Gp). A second voltage is applied to the p-th horizontal current supply line (H-Vddp). The longitudinal current supply line (V-Vddg) is electrically connected to the p-th horizontal current supply line (H-Vddp).

An adjacent pixel that is disposed at a position adjacent to the unit pixel includes a first switching transistor (QS1), a second switching transistor (QS2), a storage capacitor (CST), a driving transistor (QD) and an organic electro luminescent element (EL). The first switching transistor (QS1), the second switching transistor (QS2), the storage capacitor (CST), the driving transistor (QD) and the organic electro luminescent element (EL) are formed in a region defined by the p-th scan line (Gp), a g+1-th data line (Dg+1) and a g+1-th longitudinal current supply line (V-Vddg+1). The g+1-th longitudinal current supply line (V-Vddg+1) is disposed at a position adjacent to the g-th longitudinal current supply line (V-Vddg). The g+1-th longitudinal current supply line (V-Vddg+1) is electrically connected to the horizontal current supply line (G-Vddp).

The longitudinal current supply lines (V-Vddg and V-Vddg+1) and the data line are formed from a same layer. The longitudinal current supply lines (V-Vddg and V-Vddg+1) are extended in the longitudinal direction that is substantially in parallel with the data line. The organic electro luminescent display apparatus may include a plurality of the pixels, a plurality of the scan lines and a plurality of the longitudinal current supply lines, each of which is electrically connected to a portion of the pixels. The number of the pixels that are electrically connected to each of the longitudinal current supply lines may be equal to that of the scan lines.

The p-th horizontal current supply line (H-Vddp) and the scan line are formed from a same layer. The p-th horizontal current supply line (H-Vddp) is extended in the horizontal direction that is substantially in parallel with the scan line. The p-th horizontal current supply line (H-Vddp) is electrically connected to the longitudinal current supply lines (V-Vddg and V-Vddg+1).

The first and second switching transistors (QS1 and QS2) are P-channel transistors. Alternatively, the first and second switching transistors (QS1 and QS2) may also be N-channel transistors.

Gate electrodes of the first and second switching transistors (QS1 and QS2) are electrically connected to each other so as to decrease an off-current. That is, the first and second switching transistors (QS1 and QS2) include active layers forming two channel forming regions that are serially connected to each other. Each of the pixels may include a plurality of the switching transistors, and gate electrodes of the switching transistors may also be electrically connected to one another. When the off current is low, a capacitance for the capacitor decreases so as to decrease an area of the capacitor. Therefore, when the gate electrodes of the switching transistors (QS1 and QS2) are electrically connected to one another, an effective light emitting area of the organic electro luminescent element increases.

Figure 26:
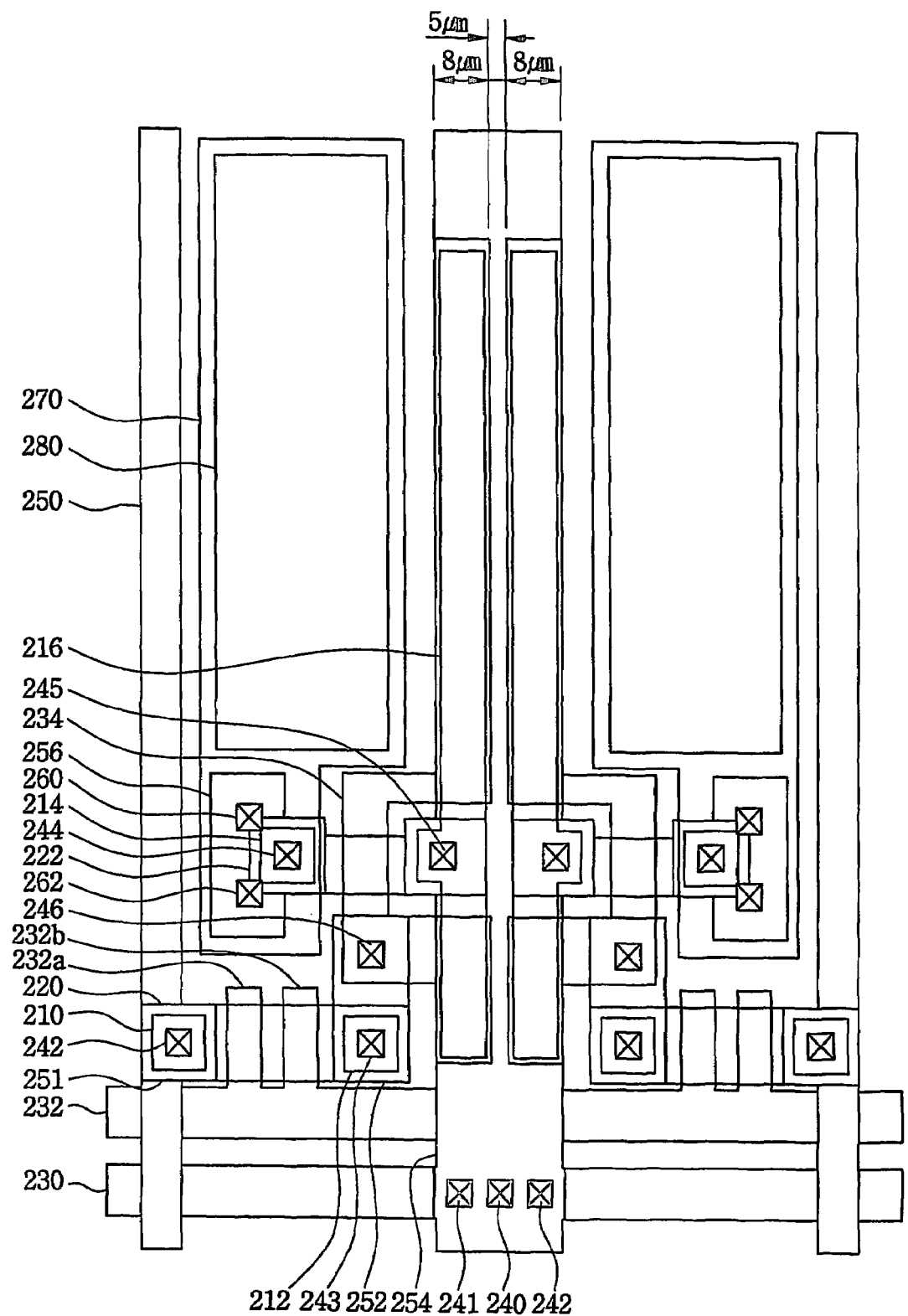
FIG. 26 is a plan view showing a unit pixel of an organic electro luminescent display apparatus in accordance with another exemplary embodiment of the present invention.

FIG. 26 is a plan view showing a unit pixel of an organic electro luminescent display apparatus in accordance with another exemplary embodiment of the present invention.

Referring to FIG. 26, the organic electro luminescent display apparatus includes an organic electro luminescent panel. The organic electro luminescent panel includes a scan line 232, a horizontal current supply line (H-VDD, 230) extended in the horizontal direction, a data line 250, and a longitudinal current supply line (V-VDD, 254) extended in the longitudinal direction. The horizontal current supply line (H-VDD, 230) and the scan line 232 are formed from a same layer. The longitudinal current supply line (V-VDD, 254) and the data line 250 are formed from a same layer. The horizontal current supply line (H-VDD, 230) is electrically connected to the longitudinal current supply line (V-VDD, 254) through contact holes 240, 241 and 242. The horizontal and longitudinal current supply lines (H-VDD and V-VDD, 230 and 254) form a net shape to decrease a resistance of the organic electro luminescent panel. The organic electro luminescent display apparatus may include a plurality of the scan lines, a plurality of the horizontal current supply lines, a plurality of the data lines and a plurality of the longitudinal current supply lines. Widths of the horizontal current supply line (H-VDD, 230) and a portion of the longitudinal current supply line (V-VDD, 254) corresponding to each of the pixels are about 8 μm. The horizontal and longitudinal current supply lines (H-VDD and V-VDD, 230 and 254) may include a low-resistance metal. The unit pixel and the adjacent pixel that is disposed on a right side of the unit pixel are commonly connected to the longitudinal current supply line (V-VDD, 254) that is disposed between the unit pixel and the adjacent pixel so that width of the longitudinal current supply line (V-VDD, 254) may be increased. For example, when an interval between a portion of the longitudinal current supply line (V-VDD, 254) corresponding to the unit pixel and a portion of the longitudinal current supply line (V-VDD, 254) corresponding to the adjacent pixel is about 5 μm, the width of the longitudinal current supply line (V-VDD, 254) may be increased from about 8×2 μm to about 8×2+5 μm. That is, the width of the portion of the longitudinal current supply line (V-VDD, 254) corresponding to each of the pixels is increased from about 8 μm to about 10.5 μm.

Alternatively, the width of the longitudinal current supply line may be about 16 μm to increase a light emitting area so as to compensate a size of the light emitting area that may be decreased by the longitudinal current supply line. Therefore, size of the light emitting area may be increased although the current supply lines form the net shape to decrease a crosstalk.

In this exemplary embodiment, the transistors include P-channel metal oxide semiconductors (PMOS). Alternatively, the transistors may also include N-channel metal oxide semiconductors (NMOS).

The unit pixel and the adjacent pixel form a group corresponding to one longitudinal current supply line, and each of the pixels is electrically connected one of the longitudinal current supply lines and one of the horizontal current supply lines.

When a voltage is applied to an end portion of each of the longitudinal current supply lines, a portion of the horizontal current supply lines disposed adjacent to the end portion of each of the longitudinal current supply lines where the voltage is applied may be omitted. Also, a portion of the horizontal current supply lines spaced apart from the end portion of each of the longitudinal current supply lines where the voltage is applied are electrically connected to all the longitudinal current supply lines. In addition, remaining horizontal current supply lines disposed between the horizontal current supply lines disposed adjacent to the end portion and the horizontal current supply lines spaced apart from the end portion are electrically connected to a portion of the longitudinal current supply lines with a predetermined density.

Alternatively, when the voltage is applied to both end portions of each of the longitudinal current supply lines, a portion of the horizontal current supply lines disposed adjacent to the end portions of each of the longitudinal current supply lines where the voltage is applied may be omitted. Also, the remaining horizontal current supply lines disposed between the horizontal current supply lines disposed adjacent to the end portions are electrically connected to a portion of the longitudinal current supply lines with the density.

Figure 27:
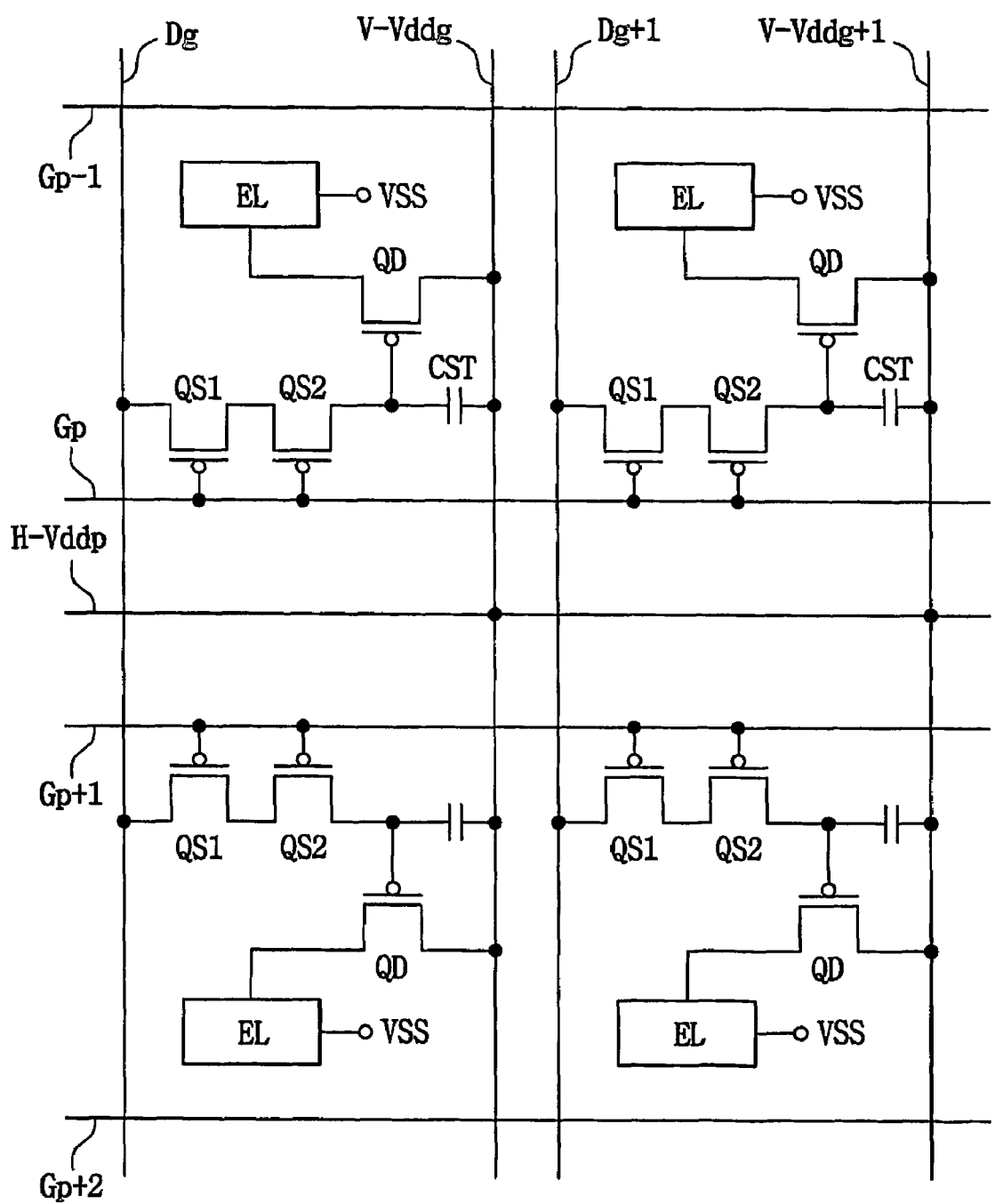
FIG. 27 is a circuit diagram showing a unit pixel of an organic electro luminescent display apparatus in accordance with another exemplary embodiment of the present invention.

FIG. 27 is a circuit diagram showing a unit pixel of an organic electro luminescent display apparatus in accordance with another exemplary embodiment of the present invention.

Referring to FIG. 27, the unit pixel includes a first switching transistor (QS1), a second switching transistor (QS2), a storage capacitor (CST), a driving transistor (QD) and an organic electro luminescent element (EL). The first switching transistor (QS1), the second switching transistor (QS2), the storage capacitor (CST), the driving transistor (QD) and the organic electro luminescent element (EL) are disposed in a region defined by a p-th scan line (Gp), a g-th data line (Dg) and a g-th longitudinal current supply line (V-Vddg). A p-th scan signal, and a g-th data signal and a first voltage are applied to the p-th scan line (Gp), the g-th data line (Dg) and the g-th longitudinal current supply line (V-Vddg), respectively. A p-th horizontal current supply line (H-Vddp) is substantially in parallel with the scan line (Gp). A second voltage is applied to the p-th horizontal current supply line (H-Vddp). The longitudinal current supply line (V-Vddg) is electrically connected to the p-th horizontal current supply line (H-Vddp).

A first adjacent pixel that is disposed on a right side of the unit pixel includes a first switching transistor (QS1), a second switching transistor (QS2), a storage capacitor (CST), a driving transistor (QD) and an organic electro luminescent element (EL) that are formed in a region defined by the p-th scan line (Gp), a g+1-th data line (Dg+1) and a g+1-th longitudinal current supply line (V-Vddg+1). The p-th scan signal, a g+1-th data signal and the first voltage are applied to the p-th scan line (Gp), the g+1-th data line (Dg+1) and the g+1-th longitudinal current supply line (V-Vddg+1), respectively. The g+1-th longitudinal current supply line (V-Vddg+1) is electrically connected to the p-th horizontal current supply line (H-Vddp).

A second adjacent pixel that is disposed on a lower side of the unit pixel includes a first switching transistor (QS1), a second switching transistor (QS2), a storage capacitor (CST), a driving transistor (QD) and an organic electro luminescent element (EL). The first switching transistor (QS1), the second switching transistor (QS2), the storage capacitor (CST), the driving transistor (QD) and the organic electro luminescent element (EL) are formed in a region defined by a p+1-th scan line (Gp+1), the g-th data line (Dg) and the g-th longitudinal current supply line (V-Vddg). A p+1-th scan signal, the g-th data signal and the first voltage are applied to the p+1-th scan line (Gp+1), the g-th data line (Dg) and the g-th longitudinal current supply line (V-Vddg), respectively. The g-th longitudinal current supply line (V-Vddg) is electrically connected to the p+1-th horizontal current supply line (H-Vddp+1).

A third adjacent pixel that is disposed on a lower right side of the unit pixel includes a first switching transistor (QS1), a second switching transistor (QS2), a storage capacitor (CST), a driving transistor (QD) and an organic electro luminescent element (EL). The first switching transistor (QS1), the second switching transistor (QS2), the storage capacitor (CST), the driving transistor (QD) and the organic electro luminescent element (EL) are formed in a region defined by the p+1-th scan line (Gp+1), the g+1-th data line (Dg+1) and the g+1-th longitudinal current supply line (V-Vddg+1). The p+1-th scan signal, the g+1-th data signal and the first voltage are applied to the p+1-th scan line (Gp+1), the g+1-th data line (Dg+1) and the g+1-th longitudinal current supply line (V-Vddg+1), respectively. The g+1-th longitudinal current supply line (V-Vddg+1) is electrically connected to the p+1-th horizontal current supply line (H-Vddp+1).

The longitudinal current supply lines (V-Vddg and V-Vddg+1) and the data lines are formed from a same layer. The longitudinal current supply lines (V-Vddg and V-Vddg+1) are extended in a longitudinal direction that is substantially in parallel with the data lines. The organic electro luminescent display apparatus may include a plurality of the pixels, a plurality of the scan lines, a plurality of the horizontal current supply lines, a plurality of the data lines and a plurality of the longitudinal current supply lines. The number of the pixels that are electrically connected to each of the longitudinal current supply lines may be equal to that of the scan lines.

The horizontal current supply lines (H-Vddp and H-Vddp+1) and the scan lines are formed from a same layer. The horizontal current supply lines (H-Vddp and H-Vddp+1) are extended in a horizontal direction that is substantially in parallel with the scan lines. The horizontal current supply lines (H-Vddp and H-Vddp+1) are electrically connected to the longitudinal current supply lines (V-Vddg and V-Vddg+1).

Referring to FIG. 27 in which the same reference numerals denote the same elements in FIGS. 8 and 26, and thus any further detailed descriptions concerning the same elements will be omitted.

In this exemplary embodiment, the transistors include P-channel metal oxide semiconductors (PMOS). Alternatively, the transistors may also include N-channel metal oxide semiconductors (NMOS).

The unit pixel and the second adjacent pixel form a group corresponding to one horizontal current supply line, and the first adjacent pixel and the third adjacent pixel also form another group corresponding to the horizontal current supply line. The longitudinal current supply lines and the horizontal current supply lines form a net shape. The horizontal current supply lines may be electrically connected to the longitudinal current supply lines at every unit pixels.

When a voltage is applied to an end portion of each of the longitudinal current supply lines, a portion of the horizontal current supply lines disposed adjacent to the end portion of each of the longitudinal current supply lines where the voltage is applied may be unnecessary. Also, a portion of the horizontal current supply lines spaced apart from the end portion of each of the longitudinal current supply lines where the voltage is applied are electrically connected to all the longitudinal current supply lines. In addition, remaining horizontal current supply lines disposed between the horizontal current supply lines disposed adjacent to the end portion and the horizontal current supply lines spaced apart from the end portion are electrically connected to a portion of the longitudinal current supply lines with a predetermined density.

Alternatively, when the voltage is applied to both end portions of each of the longitudinal current supply lines, a portion of the horizontal current supply lines disposed adjacent to the end portions of each of the longitudinal current supply lines where the voltage is applied may be unnecessary. Also, the remaining horizontal current supply lines disposed between the horizontal current supply lines disposed adjacent to the end portions are electrically connected to a portion of the longitudinal current supply lines with the density.

Figure 28:
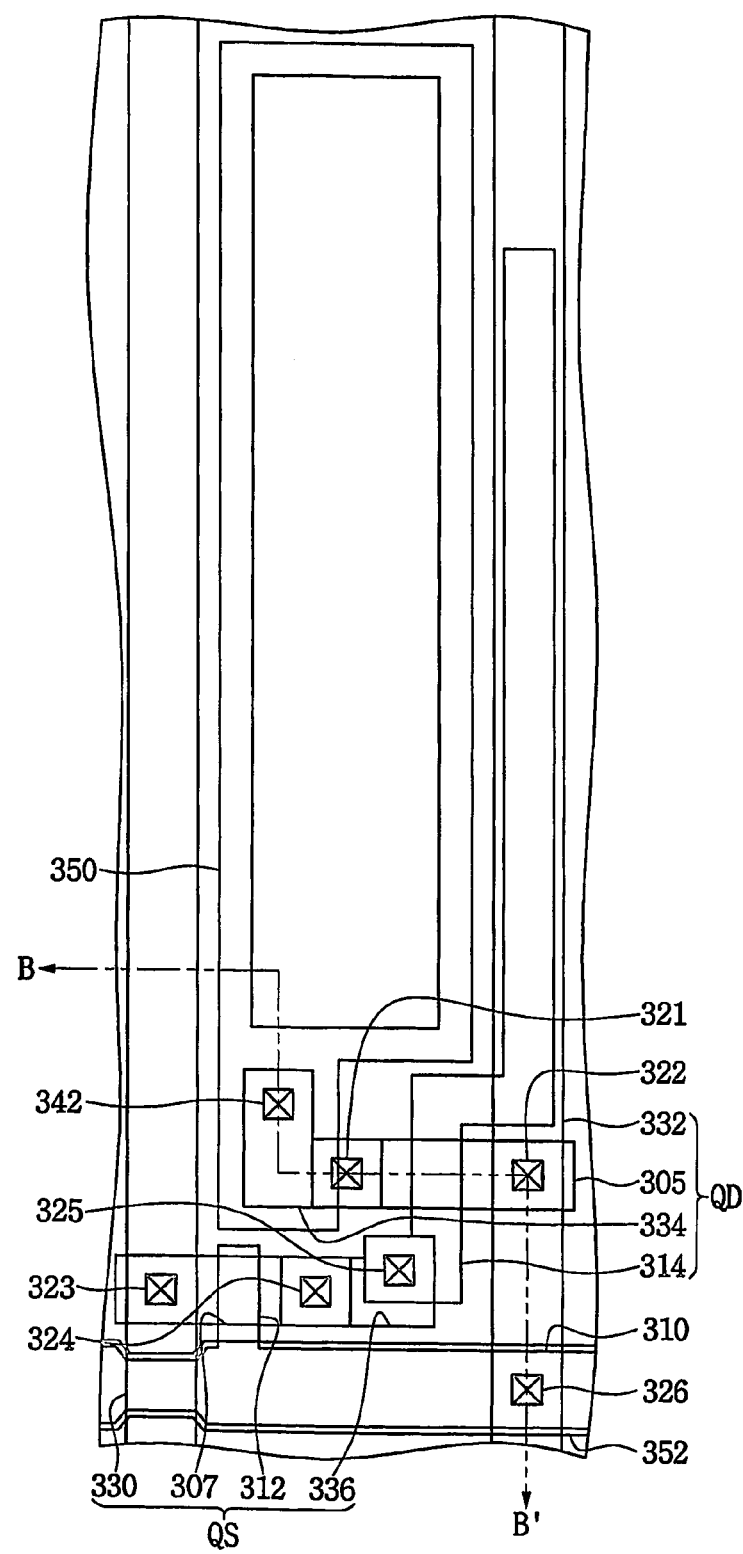
FIG. 28 is a plan view showing a unit pixel of an organic electro luminescent display apparatus in accordance with another exemplary embodiment of the present invention.
Figure 29:
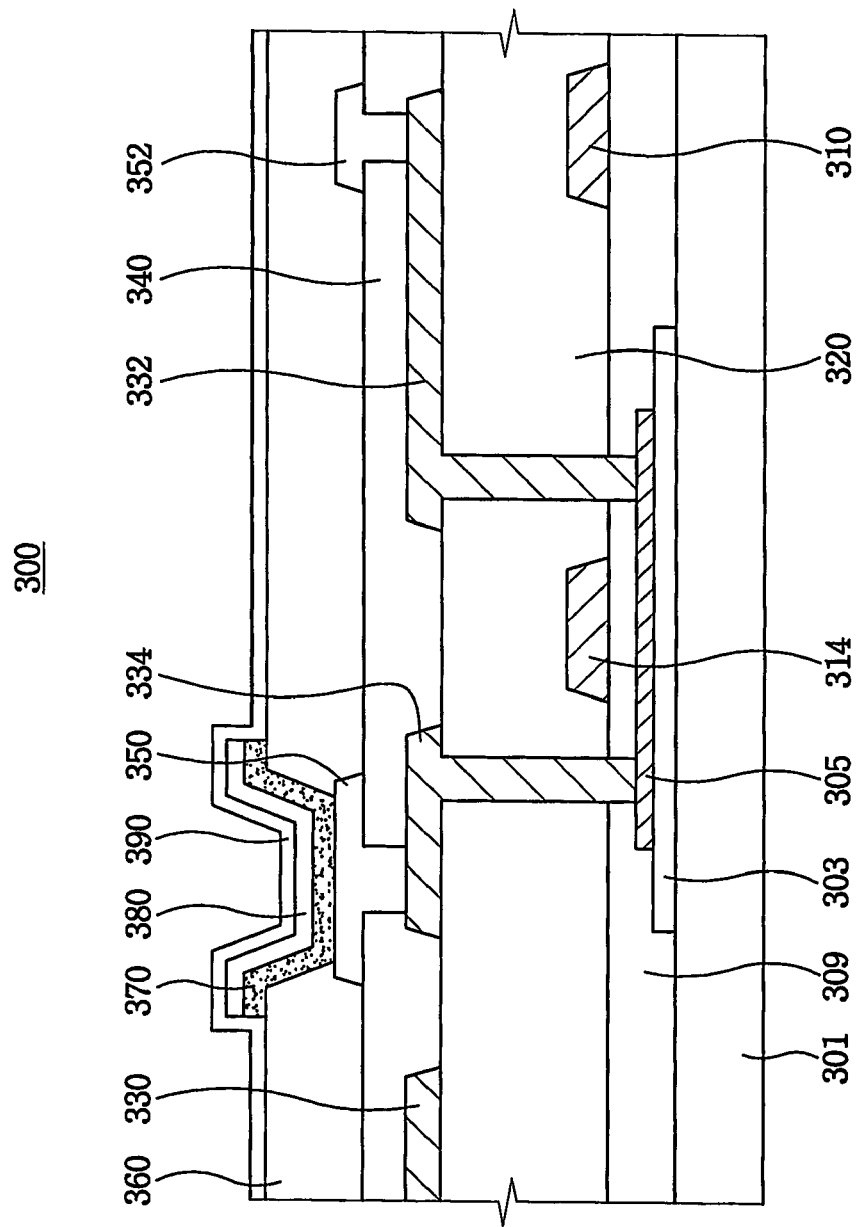
FIG. 29 is a cross-sectional view taken along the line B-B' of FIG. 28.

FIG. 28 is a plan view showing a unit pixel of an organic electro luminescent display apparatus in accordance with another exemplary embodiment of the present invention. FIG. 29 is a cross-sectional view taken along the line B-B' of FIG. 28.

Referring to FIG. 28, the organic electro luminescent display apparatus includes an organic electro luminescent panel. The organic electro luminescent panel includes a data line 330, a longitudinal current supply line (V-VDD, 332), a pixel electrode layer 350 and a horizontal current supply line (H-VDD, 352). The organic electro luminescent display apparatus may include a plurality of the data lines, a plurality of the longitudinal current supply lines, a plurality of the pixel electrode layers and a plurality of the horizontal current supply lines. The data line 330 is extended in a longitudinal direction. The longitudinal current supply line (V-VDD, 332) and the data line 330 are formed from a same layer. The horizontal current supply line (H-VDD, 352) and the scan line 310 are formed from a same layer, and the horizontal current supply line (H-VDD, 352) is overlapped with the scan line 310.

The longitudinal current supply line 332 is electrically connected to the horizontal current supply line 352 through a contact hole 326 of a second insulating interlayer 340. The longitudinal and horizontal current supply lines form a net shape so as to decrease a resistance of the organic electro luminescent panel. Widths of the horizontal and longitudinal current supply lines (H-VDD and V-VDD, 310 and 332) are about 8 μm. The horizontal and longitudinal current supply lines (H-VDD and V-VDD, 310 and 332) may include a low-resistance metal.

Referring to FIGS. 28 and 29, an insulating layer 303 is formed on a substrate 301. The substrate 301 includes a transparent material, for example, such as a glass, a quartz, a ceramic, a crystalline glass, etc. Preferably, the transparent material is heat resistive.

A driving transistor (QD) is formed on the insulating layer 303. The driving transistor (QD) includes a first active layer 305, a gate insulating layer 309, a first gate electrode 314, a first insulating interlayer 320, a first source electrode 332 and a first drain electrode 334. The first active layer 305 includes a first source region, a first channel forming region and a first drain region. The gate insulating layer 309 is formed on the first active layer 305, and includes two contact holes through which the first source region and the first drain region are exposed. The first gate electrode 314 is formed on the gate insulating layer 309. The first insulating interlayer 320 is formed on the first gate electrode 334 and the gate insulating layer 309, and includes two contact holes through which the first source region and the first drain region are exposed. The first source electrode 332 is formed on the first insulating interlayer 320, and electrically connected to first source region. The first drain electrode 334 is formed on the first insulating interlayer 320, and electrically connected to the first drain region.

A switching transistor (QS) is formed on the insulating layer 303. The switching transistor (QS) includes a second active layer 307, the gate insulating layer 309, a second gate electrode 312, the first insulating interlayer 320, a second source electrode 330 and a second drain electrode 336. The second active layer 307 includes a second source region, a second channel forming region and a second drain region. The gate insulating layer 309 is formed on the second active layer, and further includes two contact holes through which the second source region and the second drain region are exposed. The second gate electrode 312 is formed on the gate insulating layer 309. The first insulating interlayer 320 is formed on the second gate electrode 312 and the gate insulating layer 309, and further includes two contact holes through which the second source region and the second drain region are exposed. The second source electrode 330 is formed on the first insulating interlayer 320, and electrically connected to the second source region. The second drain electrode 336 is formed on the first insulating interlayer 320. The second drain electrode 336 is electrically connected to the second drain region.

A horizontal current supply line 352 is extended in a horizontal direction. The horizontal current supply line 352 is overlapped with a scan line 310 formed thereunder. The horizontal current supply line 352 is electrically connected to the longitudinal current supply line 332 through the contact hole 326 of the second insulating interlayer 340.

The second insulating interlayer 340 is formed on the driving transistor (QD), the longitudinal current supply line 332 and the switching transistor (QS).

The pixel electrode layer 350 includes a conductive oxide, for example, such as indium tin oxide (ITO). The pixel electrode layer 350 is electrically connected to the first drain electrode 342 of the driving transistor (QD) through a contact hole of the second insulating interlayer 340.

A partition wall 360 is formed on the pixel electrode layer 350. The partition wall 360 defines a light emitting region. An organic electro luminescent layer 370 is formed in the light emitting region. A counter electrode layer 380 is formed on the organic electro luminescent layer 370 and the partition wall 360. A protection layer 390 is formed on the counter electrode 380. When the pixel electrode layer 350 is an anode electrode, the counter electrode layer 380 is a cathode electrode. When the counter electrode layer 380 is the anode electrode, the pixel electrode layer 350 is the cathode electrode.

The organic electro luminescent layer 370 may have a multi-layered structure so as to improve luminance. The organic electro luminescent layer 370 includes a hole injection film formed on the pixel electrode layer 350, a hole transporting film formed on the hole injection film, a light emitting film formed on the hole transporting film and an electron transporting film formed on the light emitting film. Alternatively, the organic electro luminescent layer 370 may include a hole transporting film formed on the pixel electrode layer 350, the light emitting film formed on the hole transporting film and the electron transporting film formed on the light emitting film. The organic electro luminescent layer 370 may also include the hole injection film formed on the pixel electrode layer 350, the hole transporting film formed on the hole injection film, the light emitting film formed on the hole transporting film, the electron transporting film formed on the light emitting film and an electron injection film formed on the electron transporting film.

The organic electro luminescent display apparatus may be an active type. When the active organic electro luminescent display apparatus has a bottom illumination type, the organic electro luminescent layer 370 may generate a light corresponding to a red light, a green light or a blue light. Also, the counter electrode layer 380 may include a metal.

In addition, when the active organic electro luminescent display apparatus has a top illumination type, the organic electro luminescent layer 370 may also generate the light corresponding to the red light, the green light or the blue light. Also, the counter electrode layer 380 may include a transparent conductive material such as the indium tin oxide (ITO).

FIGS. 30 to 34 are plan views showing a method of manufacturing an organic electro luminescent display apparatus in accordance with another exemplary embodiment of the present invention.

Figure 30:
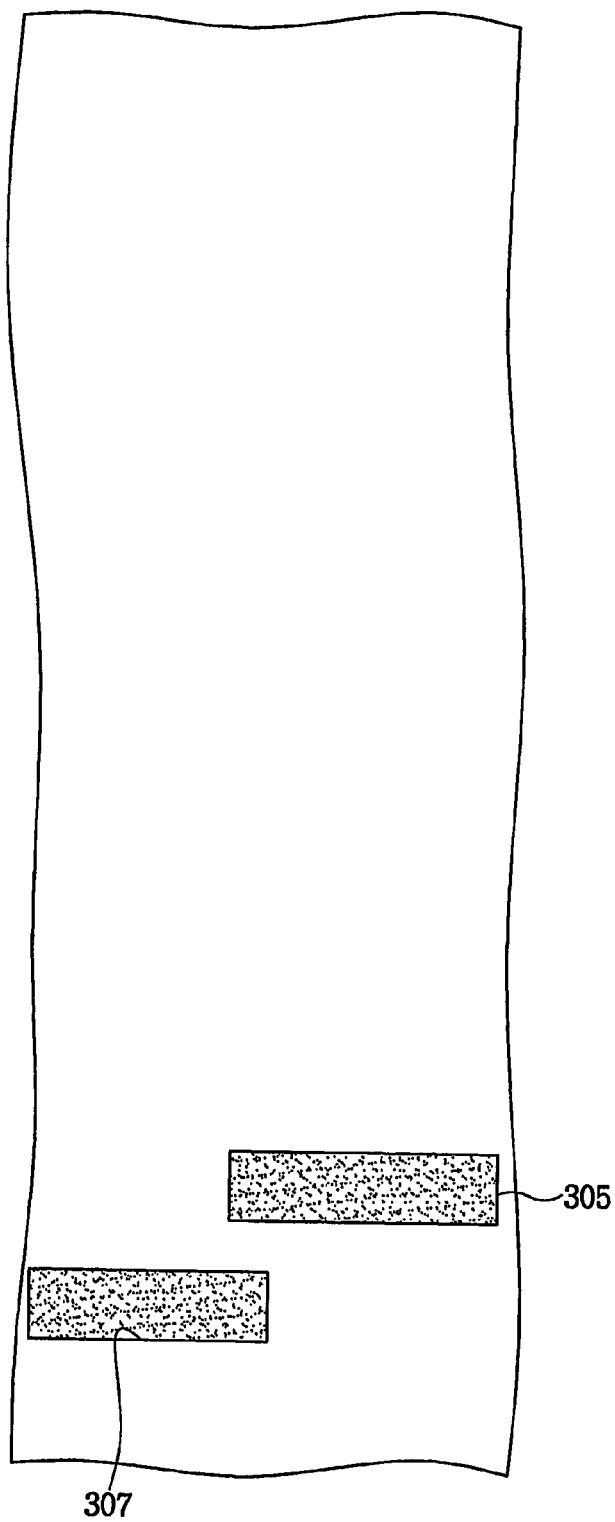
FIGS. 30 to 34 are plan views showing a method of manufacturing an organic electro luminescent display apparatus in accordance with another exemplary embodiment of the present invention.

Referring to FIG. 30, the first active layer 305 for the driving transistor and the second active layer 307 for the switching transistor are formed on the insulating layer 303 (refer to FIG. 29). The first and second active layers 305 and 307 include a polysilicon, an amorphous silicon, a nano-wire, a single crystalline material or a nano-crystalline material.

Figure 31:
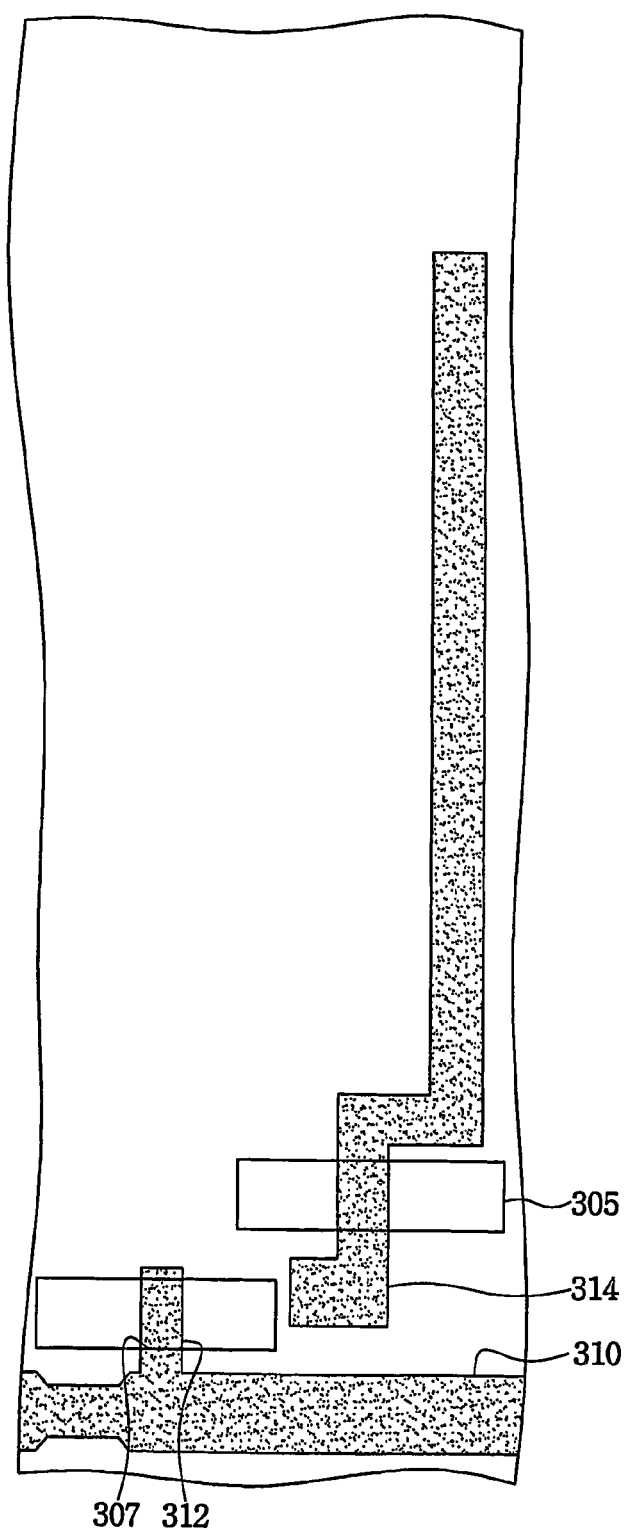

Referring to FIG. 31, the gate insulating layer 309 is formed on the substrate having the first and second active layers 305 and 307. A metal layer (not shown) is formed on the gate insulating layer 309 and patterned to form the scan line 310, the second gate electrode 312 and the storage capacitor line 314. The second gate electrode 312 is electrically connected to the scan line 310. The storage capacitor line 314 is extended in the longitudinal direction. In this exemplary embodiment, each of the transistors includes a mono-gate structure. Alternatively, the metal layer may be patterned to form the transistors including double-gate structures or multi-gate structures. The gate insulating layer 309 may be formed over a whole surface of the substrate. The gate insulating layer 309 may also be formed on the substrate corresponding to the scan line and the gate electrode.

Figure 32:
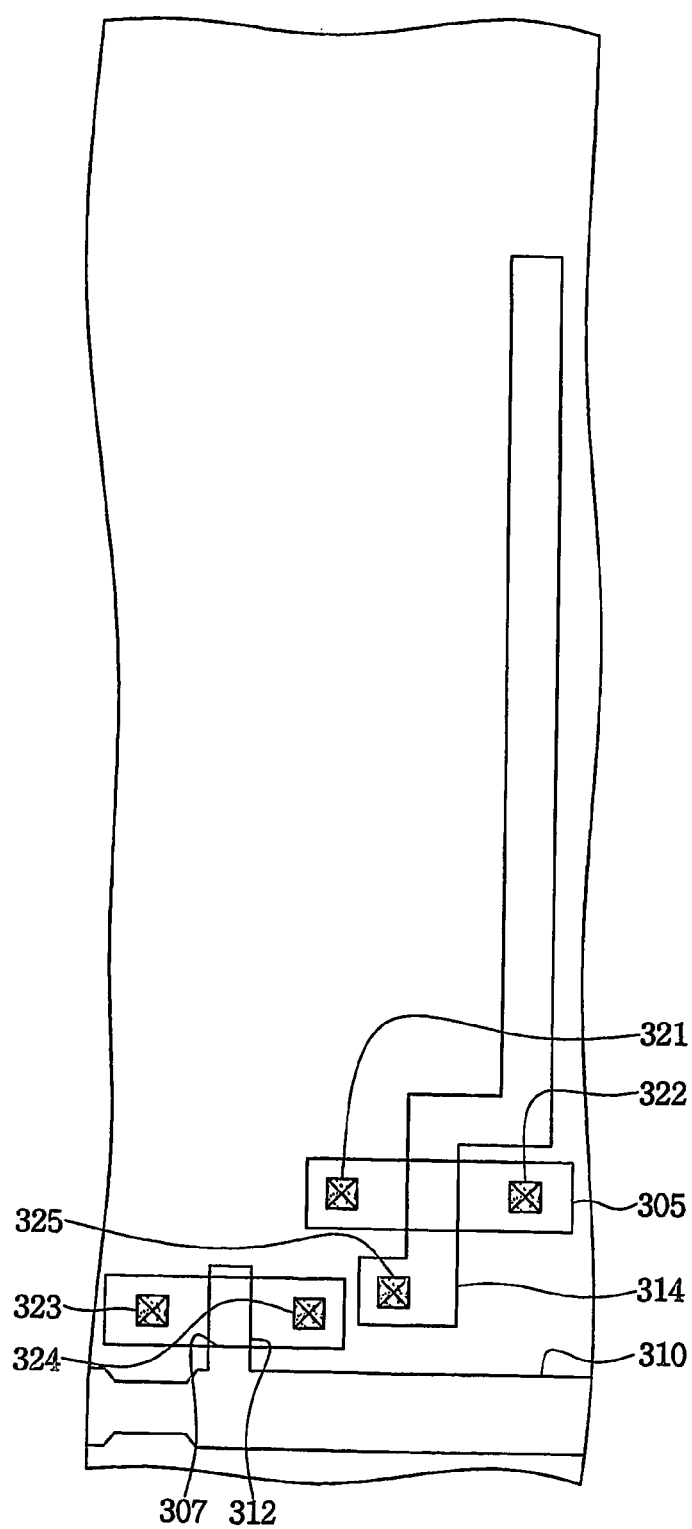

Referring to FIG. 32, the first insulating interlayer 320 is formed on the substrate having the scan line 310 and the second gate electrode 312. A first contact hole 321 and a second contact hole 322 corresponding to the first active layer 305 of the driving transistor (QD), a third contact hole 323 and a fourth contact hole 324 corresponding to the second active layer 307 of the switching transistor (QS), and a fifth contact hole 325 are formed in the first insulating interlayer 320. The first gate electrode of the driving transistor (QD) is electrically connected to the second drain electrode of the switching transistor (QS) through the fifth contact hole 325.

Figure 33:
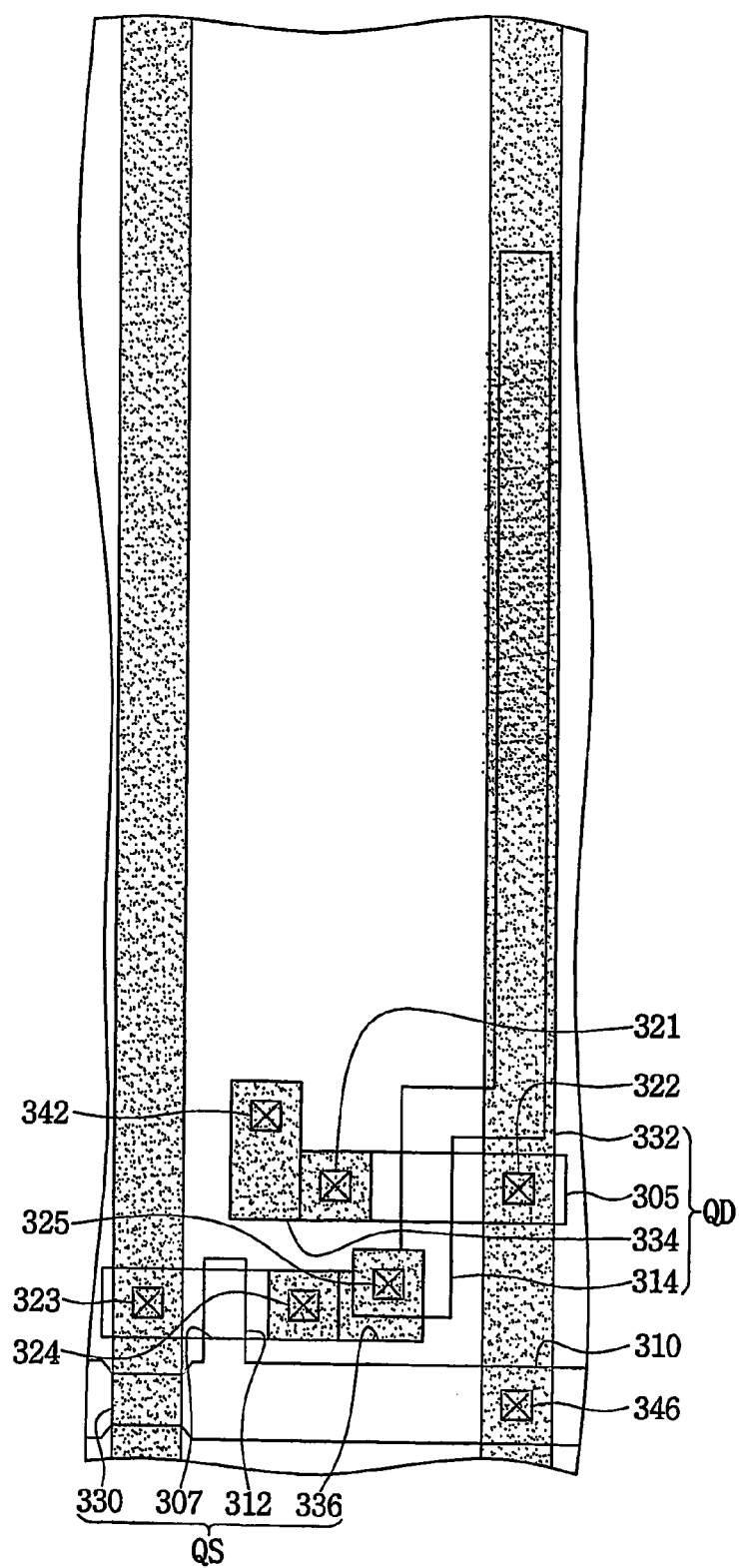

Referring to FIG. 33, the data line 330 extended in the longitudinal direction, the longitudinal current supply line 332, a first pattern 334 for the first source electrode of the driving transistor (QD) and a second pattern 336 for the second drain electrode of the switching transistor (QS) are then formed on the substrate.

The second insulating interlayer 340 having a sixth contact hole 342 and a seventh contact hole 346 is then formed. The first source electrode of the driving transistor (QD) is partially exposed through the sixth contact hole 342 so that the first source electrode of the driving transistor (QD) is electrically connected to the pixel electrode layer through the sixth contact hole 342. The longitudinal current supply line 332 is partially exposed through the seventh contact hole 346 so that the longitudinal current supply line 332 is electrically connected to the horizontal current supply line 352 through the seventh contact hole 346.

Figure 34:
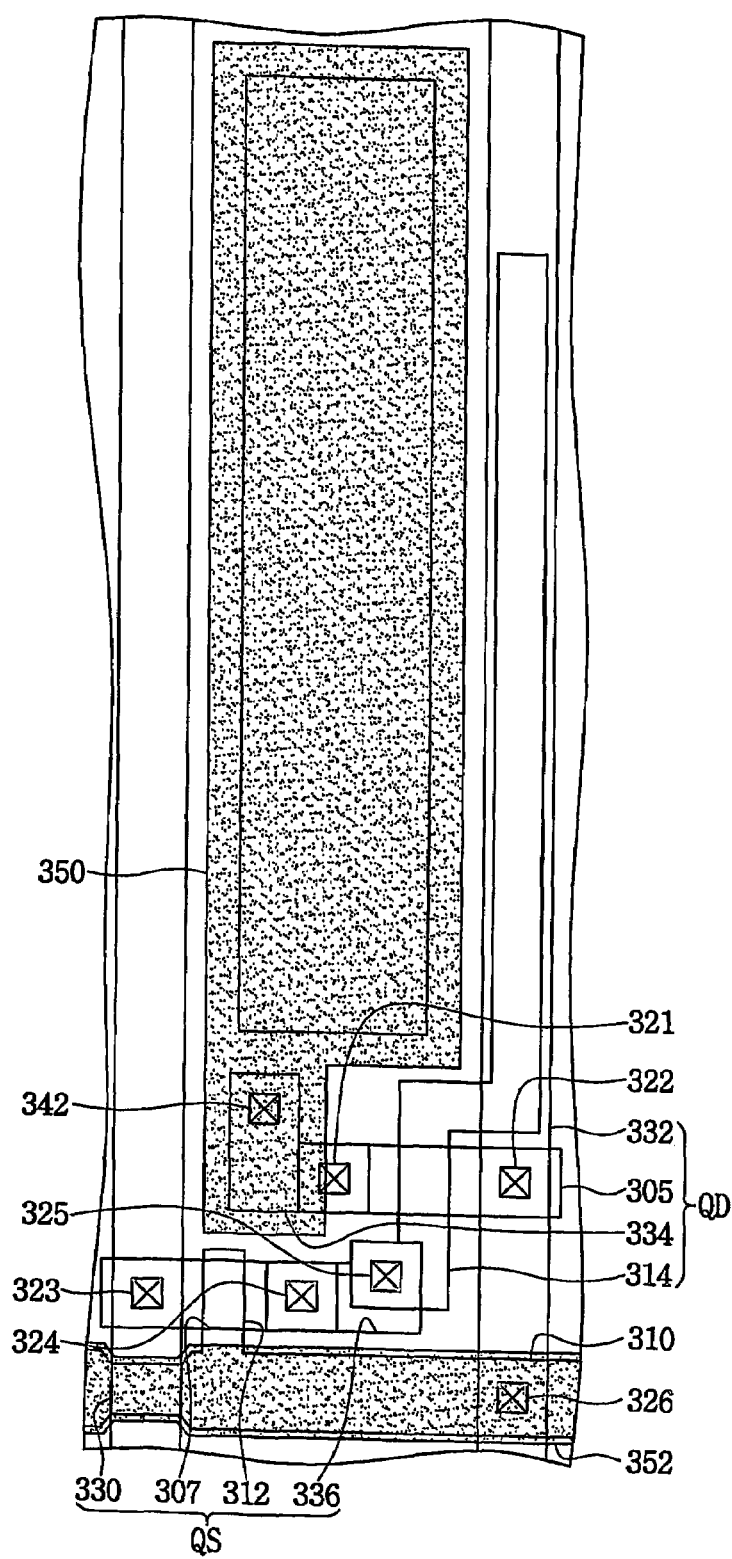

Referring to FIG. 34, the pixel electrode layer 350 including the ITO and the horizontal current supply line 352 are then formed on the substrate. The horizontal current supply line 352 is overlapped with the scan line 310 formed thereunder.

The pixel electrode layer 350 or the horizontal current supply line 352 may be formed through patterning an ITO layer. The pixel electrode layer 350 or the horizontal current supply line 352 may also be directly formed using a mask.

The partition wall 360 is formed to define a light emitting region where the organic electro luminescent layer 370 is received. The organic electro luminescent layer 370 is formed in the light emitting region. The counter electrode layer 380 is formed on the organic electro luminescent layer 370 and the partition wall 360. The protection layer 390 is formed on the counter electrode 380.

According to this exemplary embodiment, the organic electro luminescent panel includes P-channel metal oxide semiconductor (PMOS) transistors. The organic electro luminescent panel may include N-channel metal oxide semiconductor (NMOS) transistors.

When a voltage is applied to an end portion of each of the longitudinal current supply lines, a portion of the horizontal current supply lines disposed adjacent to the end portion of each of the longitudinal current supply lines where the voltage is applied may be unnecessary. Also, a portion of the horizontal current supply lines spaced apart from the end portion of each of the longitudinal current supply lines where the voltage is applied are electrically connected to all the longitudinal current supply lines. In addition, remaining horizontal current supply lines disposed between the horizontal current supply lines disposed adjacent to the end portion and the horizontal current supply lines spaced apart from the end portion are electrically connected to a portion of the longitudinal current supply lines with a predetermined density.

Alternatively, when the voltage is applied to both end portions of each of the longitudinal current supply lines, a portion of the horizontal current supply lines disposed adjacent to the end portions of each of the longitudinal current supply lines where the voltage is applied may be unnecessary. Also, the remaining horizontal current supply lines disposed between the horizontal current supply lines disposed adjacent to the end portions are electrically connected to a portion of the longitudinal current supply lines with the density.

Figure 35:
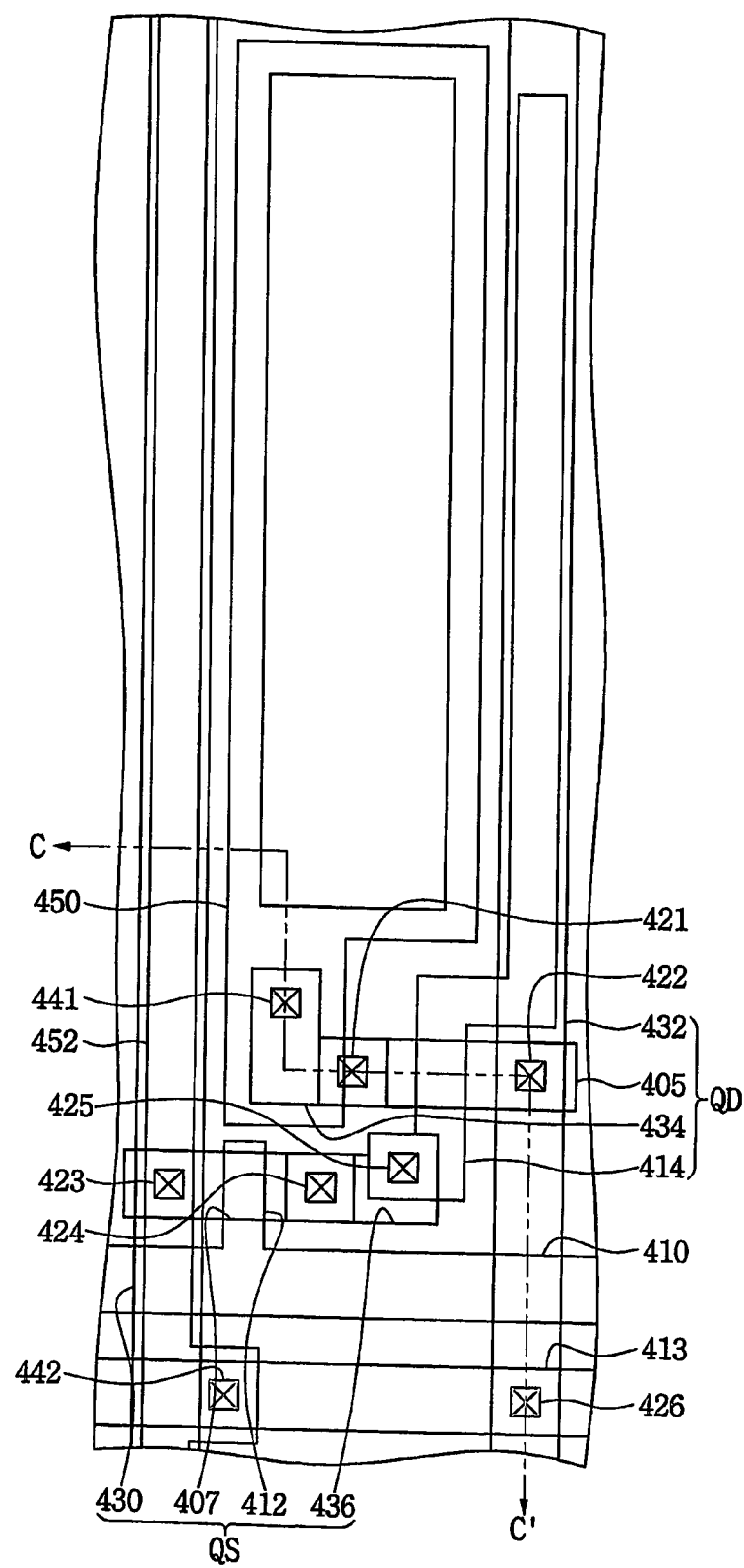
FIG. 35 is a plan view showing a unit pixel of an organic electro luminescent display apparatus in accordance with another exemplary embodiment of the present invention.
Figure 36:
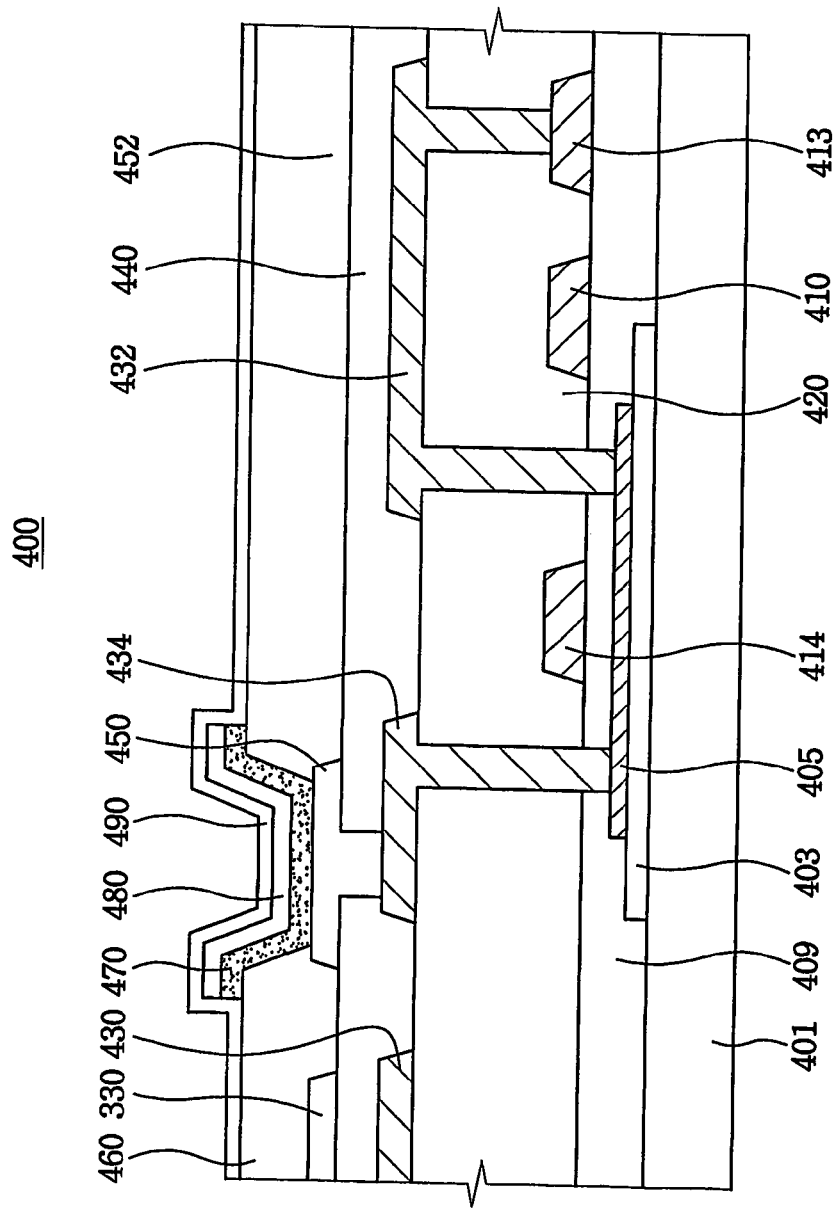
FIG. 36 is a cross-sectional view taken along the line C-C' of FIG. 35.

FIG. 35 is a plan view showing a unit pixel of an organic electro luminescent display apparatus in accordance with another exemplary embodiment of the present invention. FIG. 36 is a cross-sectional view taken along the line C-C' of FIG. 35.

Referring to FIGS. 35 and 36, the organic electro luminescent display apparatus includes an organic electro luminescent panel. The organic electro luminescent panel includes a scan line 410, a horizontal current supply line 413, a data line 430, a first longitudinal current supply line 432, a pixel electrode layer 450 having indium tin oxide (ITO), and a second longitudinal current supply line 452. The scan line 410 is extended in a horizontal direction. The horizontal current supply line 413 and the scan line 410 are formed from a same layer. The data line 430 is extended in a longitudinal direction. The first longitudinal current supply line 432, the second longitudinal current supply line 452 and the data line 430 are formed from a same layer. The organic electro luminescent panel may include a plurality of the scan lines, a plurality of the horizontal current supply lines, a plurality of the data lines, a plurality of the first longitudinal current supply lines, a plurality of the pixel electrode layers and a plurality of the second longitudinal current supply lines.

The horizontal current supply line 413 is electrically connected to the first longitudinal current supply line 432 through a sixth contact hole 426. The horizontal current supply line 413 is electrically connected to the second longitudinal current supply line 432 through an eighth contact hole 442. The horizontal, first longitudinal and second longitudinal current supply lines form a net shape so as to decrease a resistance of the organic electro luminescent panel.

Referring to FIGS. 35 and 36 in which the same reference numerals denote the same elements in FIGS. 28 and 29, and thus any further detailed descriptions concerning the same elements will be omitted.

FIGS. 37 to 41 are plan views showing a method of manufacturing an organic electro luminescent display apparatus in accordance with another exemplary embodiment of the present invention.

Figure 37:
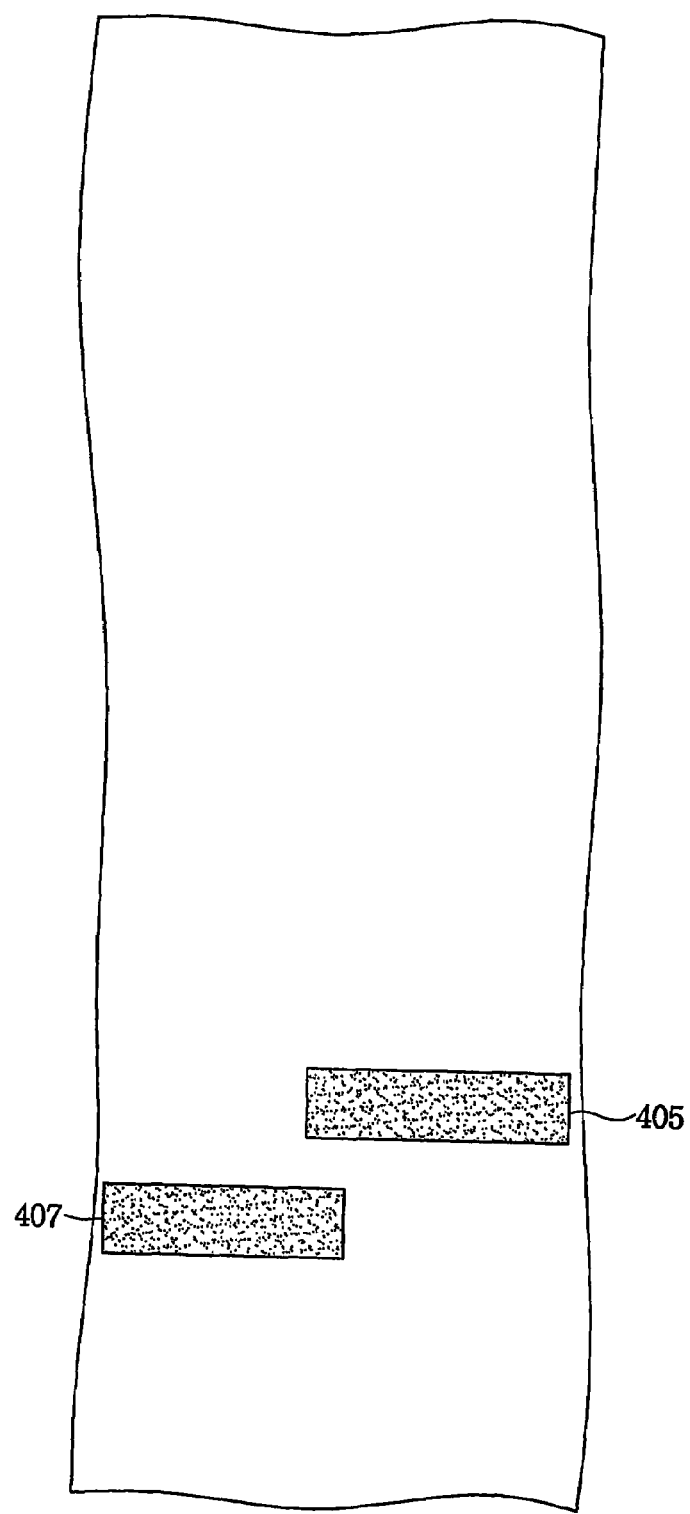
FIGS. 37 to 41 are plan views showing a method of manufacturing an organic electro luminescent display apparatus in accordance with another exemplary embodiment of the present invention.

Referring to FIG. 37, a first active layer 405 for a driving transistor (QD) and a second active layer 407 for a switching transistor (QS) are formed on an insulating layer 403 (Referring to FIG. 29) that is formed on a substrate. The first and second active layers 405 and 407 may include a polysilicon, an amorphous silicon, a nano-wire, a single crystalline material or a nano-crystalline material.

Figure 38:
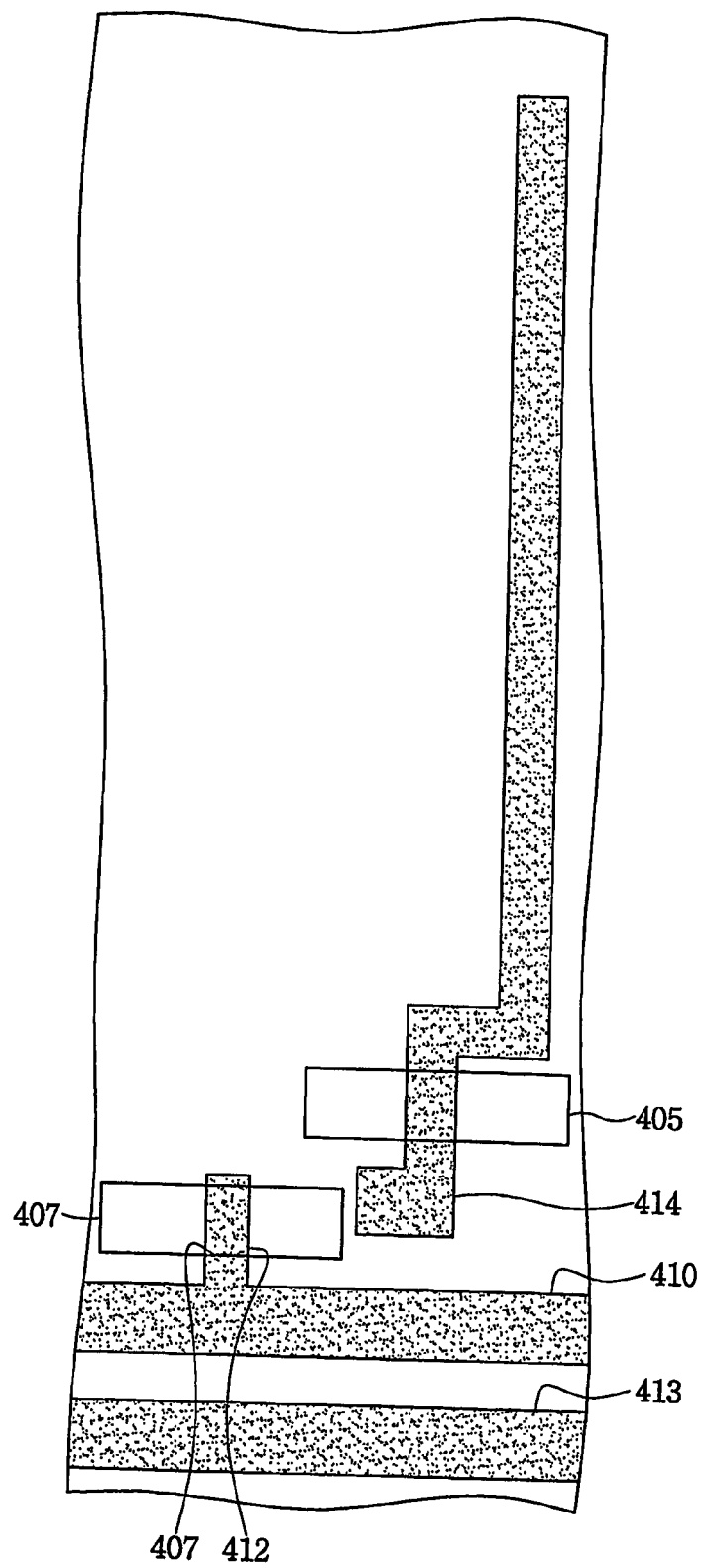

Referring to FIG. 38, a gate insulating layer 409 is formed on the substrate having the first and second active layers 405 and 407. A metal layer (not shown) is formed on the gate insulating layer 409 and patterned to form the scan line 410, a second gate electrode 412, the horizontal current supply line 413 and the storage capacitor line 414. The scan line 410 is extended in the horizontal direction. The second gate electrode 412 is electrically connected to the scan line 410. The storage capacitor line 414 is extended in the longitudinal direction. In this exemplary embodiment, each of the transistors includes a mono-gate structure. Alternatively, the metal layer may be patterned to form the transistors including double-gate structures or multi-gate structures. The gate insulating layer 409 may be formed over a whole surface of the substrate. The gate insulating layer 409 may also be formed on the substrate corresponding to the scan line and the gate electrode.

Figure 39:
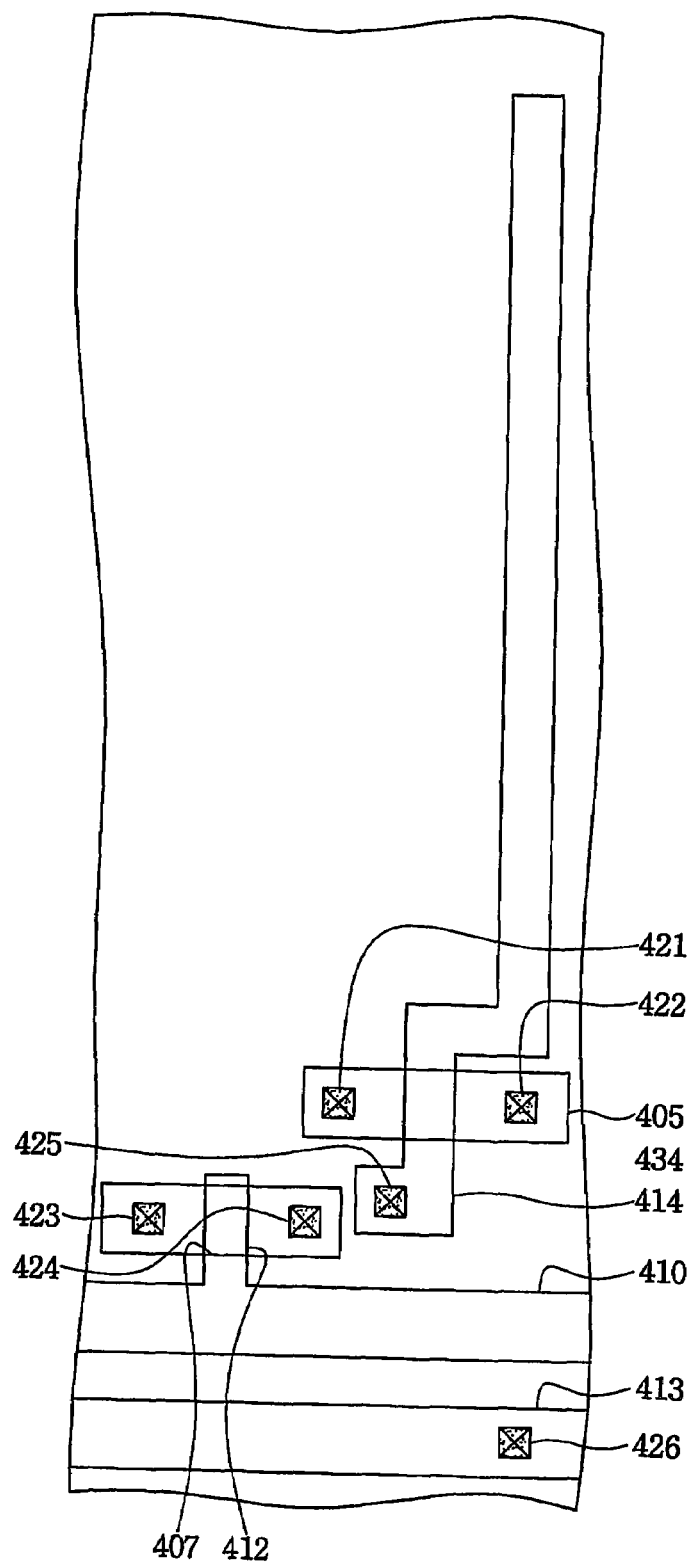

Referring to FIG. 39, a first insulating interlayer 420 is formed on the substrate having the scan line 410 and the second gate electrode 412. A first contact hole 421 and a second contact hole 422 corresponding to the first active layer 405 of the driving transistor (QD), a third contact hole 423 and a fourth contact hole 424 corresponding to the second active layer 407 of the switching transistor (QS), a fifth contact hole 425 and the sixth contact hole 426 are formed in the first insulating interlayer 420. The first gate electrode of the driving transistor (QD) is electrically connected to the second drain electrode of the switching transistor (QS) through the fifth contact hole 425. The horizontal current supply line 413 is electrically connected to the first longitudinal current supply line 432 through the sixth contact hole 426.

Figure 40:
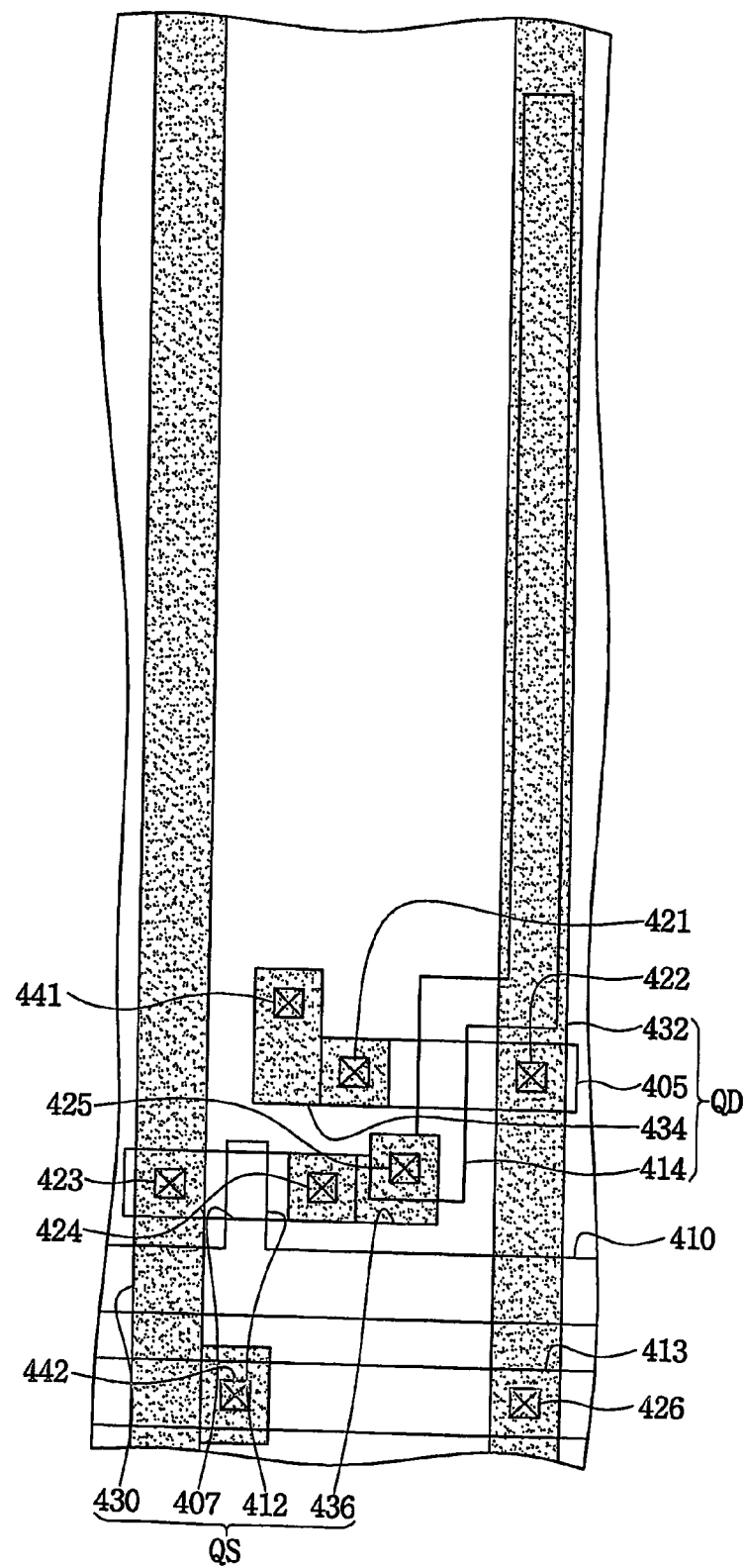

Referring to FIG. 40, the data line 430 extended in the longitudinal direction, the first longitudinal current supply line 432, a first pattern 434 for the first source electrode of the driving transistor (QD) and a second pattern 436 for the second drain electrode of the switching transistor (QS) are then formed on the substrate.

The second insulating interlayer 440 having a seventh contact hole 441 and the eighth contact hole 442 is then formed. The first source electrode of the driving transistor (QD) is partially exposed through the seventh contact hole 441 so that the first source electrode of the driving transistor (QD) is electrically connected to the pixel electrode layer through the seventh contact hole 441. The horizontal current supply line 413 is partially exposed through the eighth contact hole 442 so that the horizontal current supply line 413 is electrically connected to the second longitudinal current supply line 452 through the eighth contact hole 442. The eighth contact hole 442 may be spaced apart from the data line 430.

Figure 41:
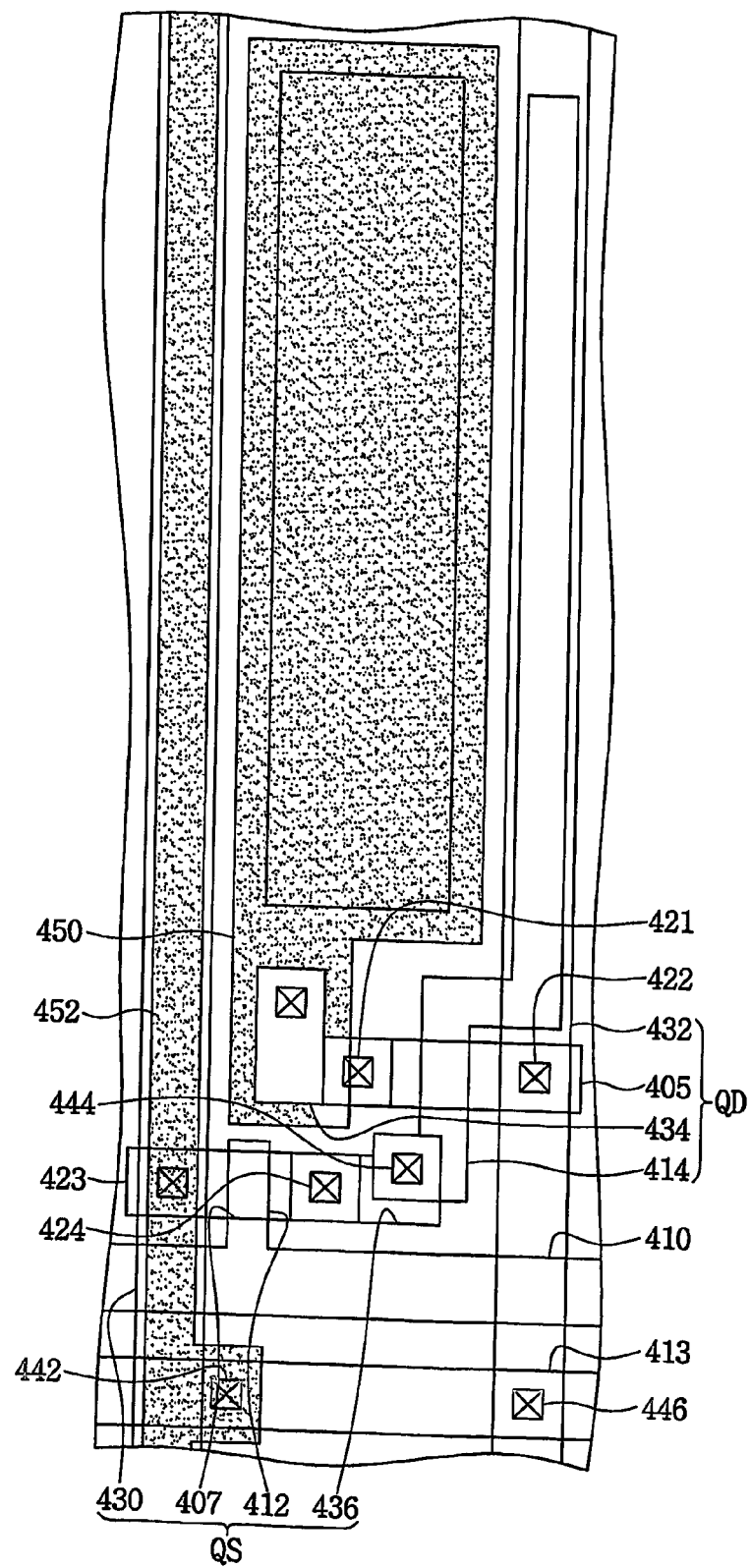

Referring to FIG. 41, the pixel electrode layer 450 including the ITO and the second longitudinal current supply line 452 are then formed on the substrate. The second longitudinal current supply line 452 is overlapped with the data line 430 formed thereunder.

The pixel electrode layer 450 or the second longitudinal current supply line 452 may be formed through patterning an ITO layer. The pixel electrode layer 450 or the second longitudinal current supply line 452 may also be directly formed using a mask.

A partition wall is formed to define a light emitting region where an organic electro luminescent layer is received. The organic electro luminescent layer is formed in the light emitting region. A counter electrode layer is formed on the organic electro luminescent layer and the partition wall. A protection layer is formed on the counter electrode.

According to this exemplary embodiment, the organic electro luminescent panel includes P-channel metal oxide semiconductor (PMOS) transistors. The organic electro luminescent panel may include N-channel metal oxide semiconductor (NMOS) transistors.

Figure 42:
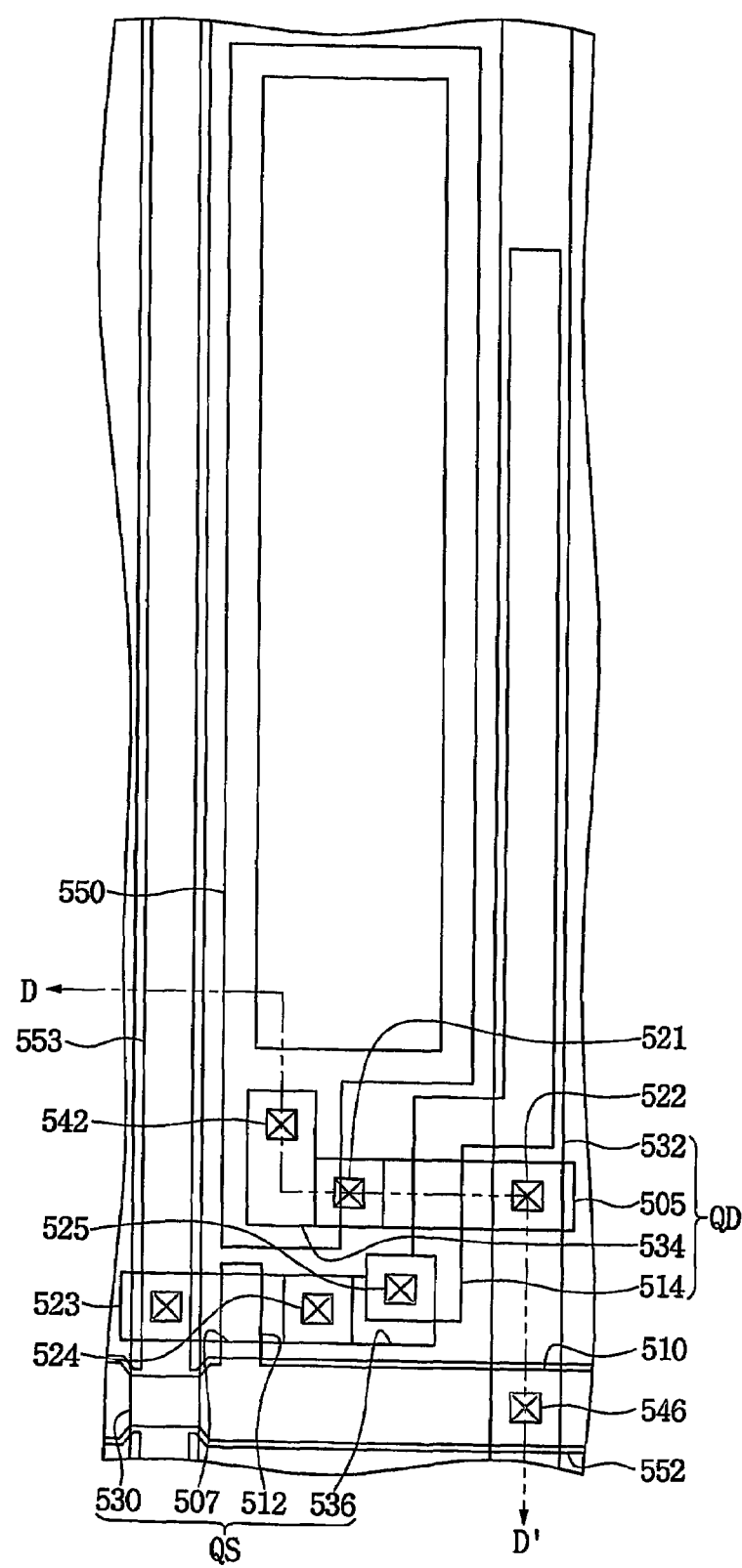
FIG. 42 is a plan view showing a unit pixel of an organic electro luminescent display apparatus in accordance with another exemplary embodiment of the present invention.
Figure 43:
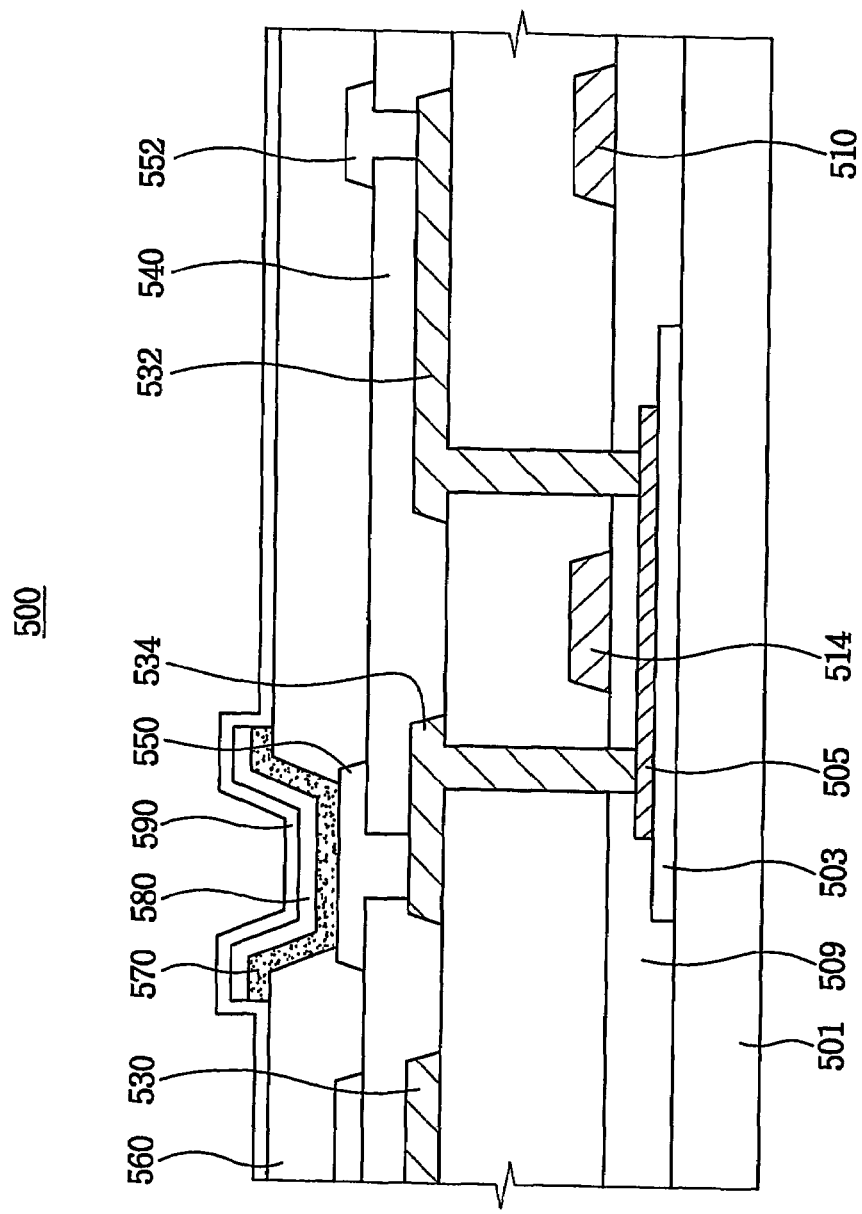
FIG. 43 is a cross-sectional view taken along the line D-D' of FIG. 42.

FIG. 42 is a plan view showing a unit pixel of an organic electro luminescent display apparatus in accordance with another exemplary embodiment of the present invention. FIG. 43 is a cross-sectional view taken along the line D-D' of FIG. 42.

Referring to FIGS. 42 and 43, the organic electro luminescent display apparatus includes an organic electro luminescent panel. The organic electro luminescent panel includes a data line 530, a first longitudinal current supply line 532, a pixel electrode layer 550 including an indium tin oxide (ITO), a scan line 510, a horizontal current supply line 552 and a second longitudinal current supply line 553. The first longitudinal current supply line 532 and the data line 530 are formed from a same layer. The horizontal current supply line 552 and the pixel electrode layer 550 are formed from a same layer. The horizontal current supply line 552 is overlapped with the scan line 510. The second longitudinal current supply line 553 is overlapped with the data line 530. The organic electro luminescent panel may include a plurality of the data lines, a plurality of the first longitudinal current supply lines, a plurality of the pixel electrode layers, a plurality of the scan lines, a plurality of the horizontal current supply lines and a plurality of the second longitudinal current supply lines.

An ITO layer is patterned to form the horizontal current supply line 552 and the second longitudinal current supply line 553. The horizontal current supply line 552 and the second longitudinal current supply line 553 are formed from the same layer. The horizontal current supply line 552 is electrically connected to the first longitudinal current supply line 532 through a seventh contact hole 546. The horizontal, first longitudinal and second longitudinal current supply lines form a net shape to decrease a resistance of the organic electro luminescent panel.

Referring to FIGS. 42 and 43 in which the same reference numerals denote the same elements in FIGS. 28 and 29, and thus any further detailed descriptions concerning the same elements will be omitted.

FIGS. 44 to 48 are plan views showing a method of manufacturing an organic electro luminescent display apparatus in accordance with another exemplary embodiment of the present invention.

Figure 44:
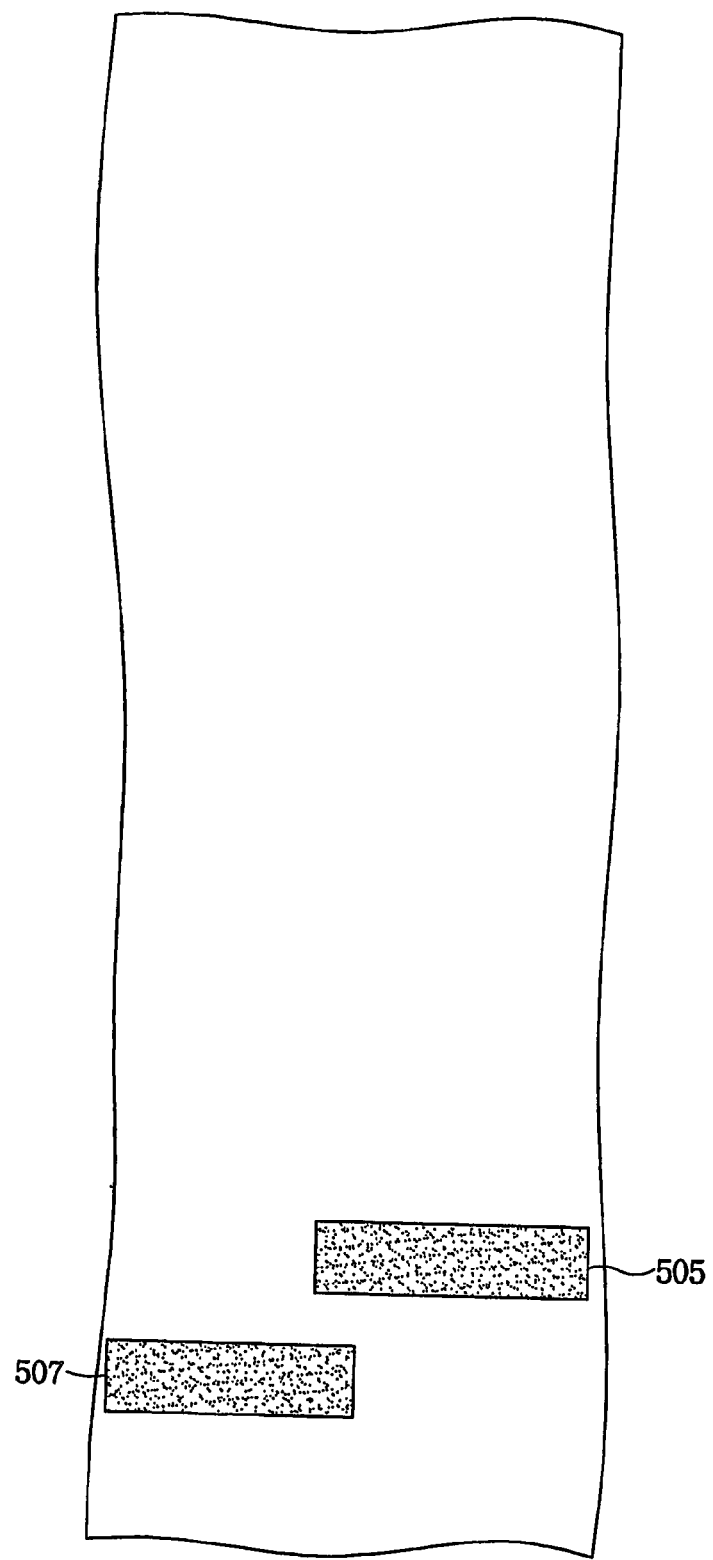
FIGS. 44 to 48 are plan views showing a method of manufacturing an organic electro luminescent display apparatus in accordance with another exemplary embodiment of the present invention.

Referring to FIG. 44, a first active layer 505 for a driving transistor (QD) and a second active layer 507 for a switching transistor (QS) are formed on an insulating layer 503 (refer to FIG. 36) that is formed on a substrate. The first and second active layers 505 and 507 may include a polysilicon, an amorphous silicon, a nano-wire, a single crystalline material or a nano-crystalline material.

Figure 45:
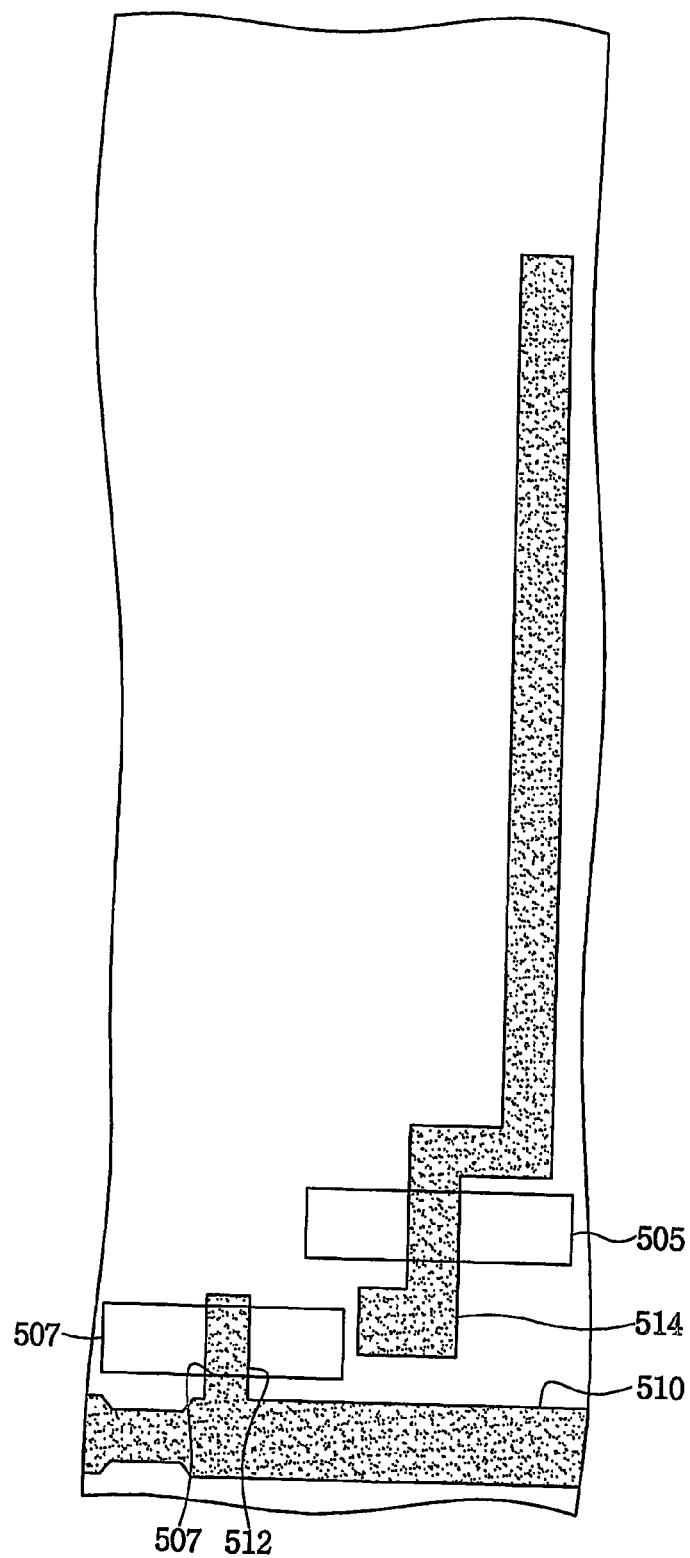

Referring to FIG. 45, a gate insulating layer 509 is formed on the substrate having the first and second active layers 505 and 507. A metal layer (not shown) is formed on the gate insulating layer 509 and patterned to form the scan line 510, a second gate electrode 512 and the storage capacitor line 514. The scan line 510 is extended in a horizontal direction. The second gate electrode 512 is electrically connected to the scan line 510. The storage capacitor line 514 is extended in a longitudinal direction. In this exemplary embodiment, each of the transistors includes a mono-gate structure. Alternatively, the metal layer may be patterned to form the transistors including double-gate structures or multi-gate structures. The gate insulating layer 509 may be formed over a whole surface of the substrate. The gate insulating layer 509 may also be formed on the substrate corresponding to the scan line and the gate electrode.

Figure 46:
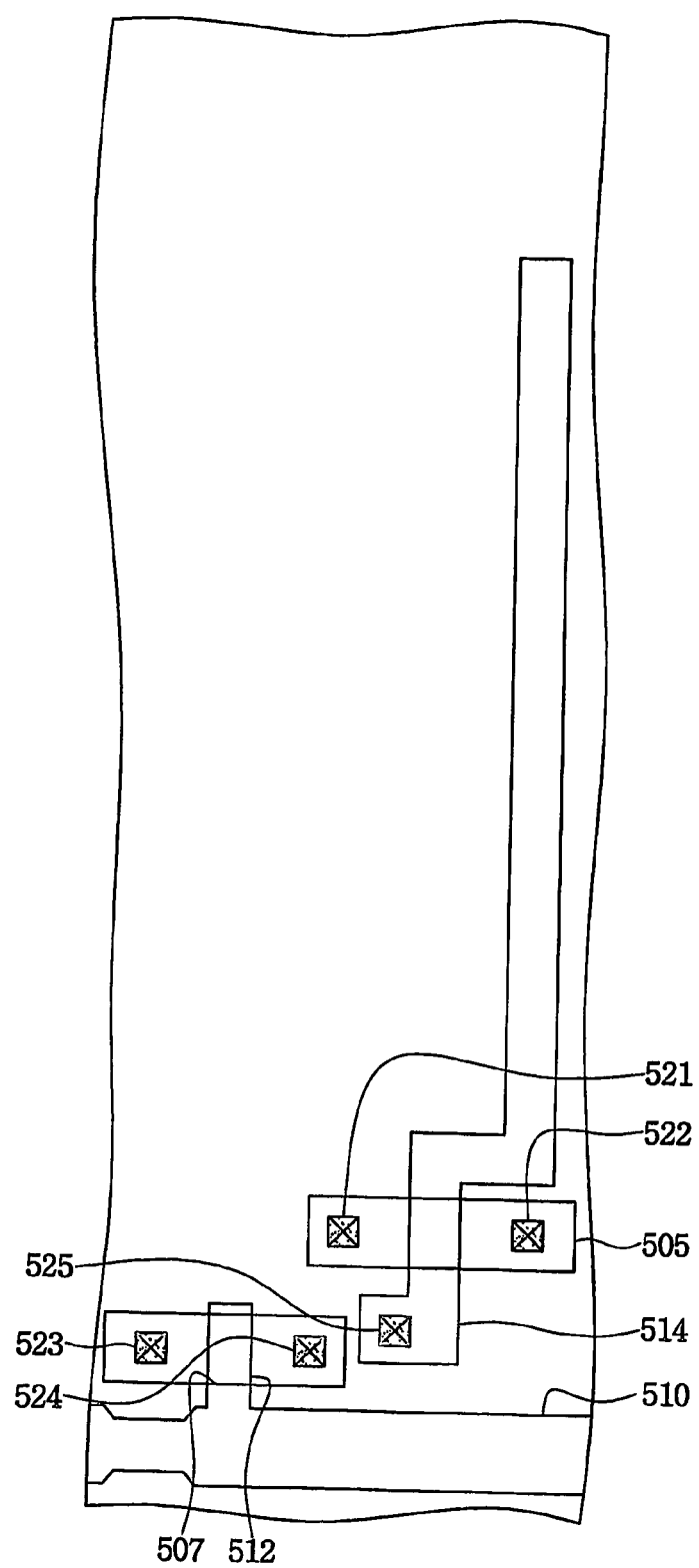

Referring to FIG. 46, a first insulating interlayer 520 is formed on the substrate having the scan line 510 and the second gate electrode 512. A first contact hole 521 and a second contact hole 522 corresponding to the first active layer 505 of the driving transistor (QD), a third contact hole 523 and a fourth contact hole 524 corresponding to the second active layer 507 of the switching transistor (QS), a fifth contact hole 525 are formed in the first insulating interlayer 520. The first gate electrode of the driving transistor (QD) is electrically connected to the second drain electrode of the switching transistor (QS) through the fifth contact hole 525.

Figure 47:
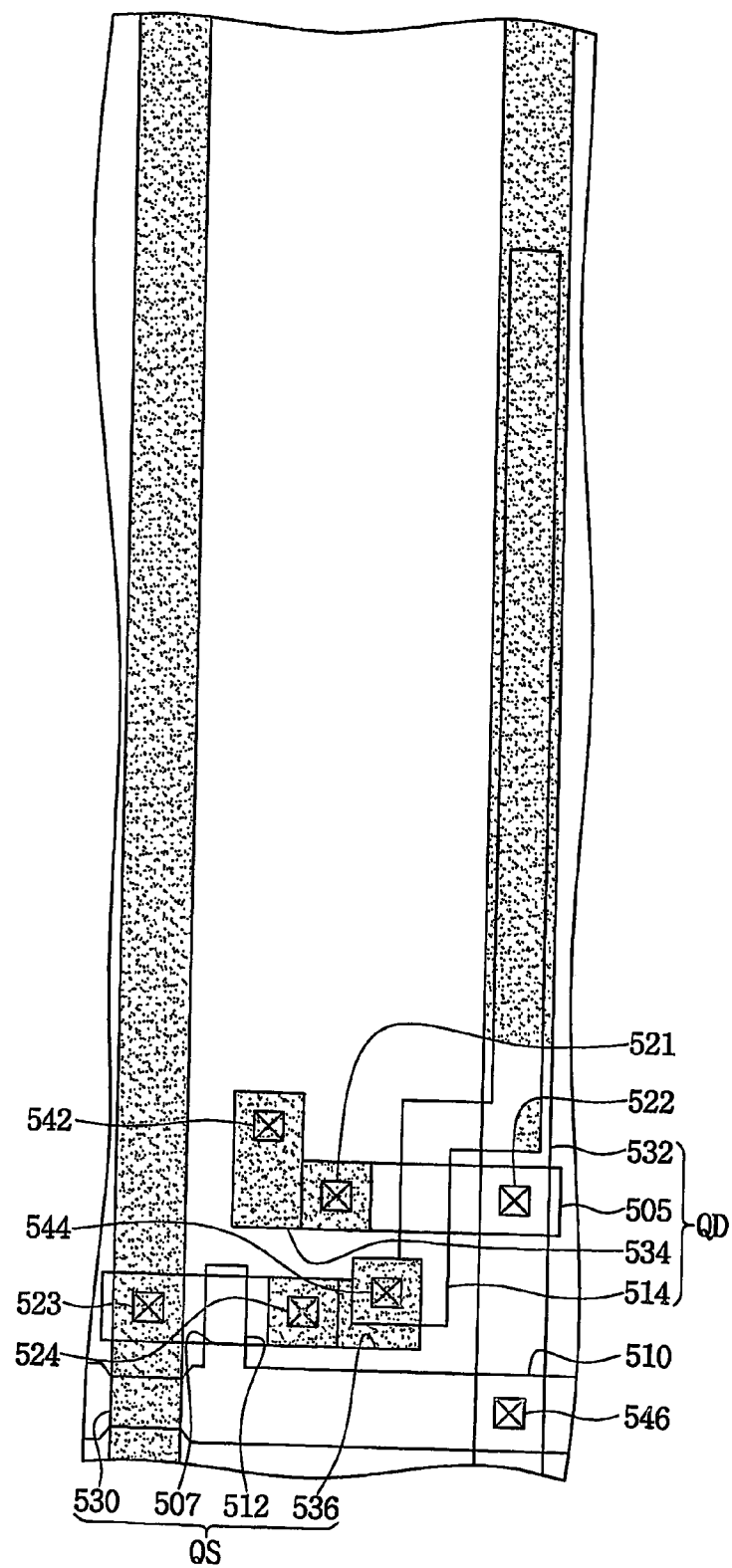

Referring to FIG. 47, the data line 530 extended in the longitudinal direction, the longitudinal current supply line 532, a first pattern 534 for the first source electrode of the driving transistor (QD) and a second pattern 536 for the second drain electrode of the switching transistor (QS) are then formed on the substrate.

The second insulating interlayer 540 having a sixth contact hole 542 and the seventh contact hole 546 is then formed. The first source electrode of the driving transistor (QD) is partially exposed through the sixth contact hole 542 so that the first source electrode of the driving transistor (QD) is electrically connected to the pixel electrode layer through the sixth contact hole 542. The longitudinal current supply line 532 is partially exposed through the seventh contact hole 546 so that the longitudinal current supply line 532 is electrically connected to the horizontal current supply line 552 through the seventh contact hole 546.

Figure 48:
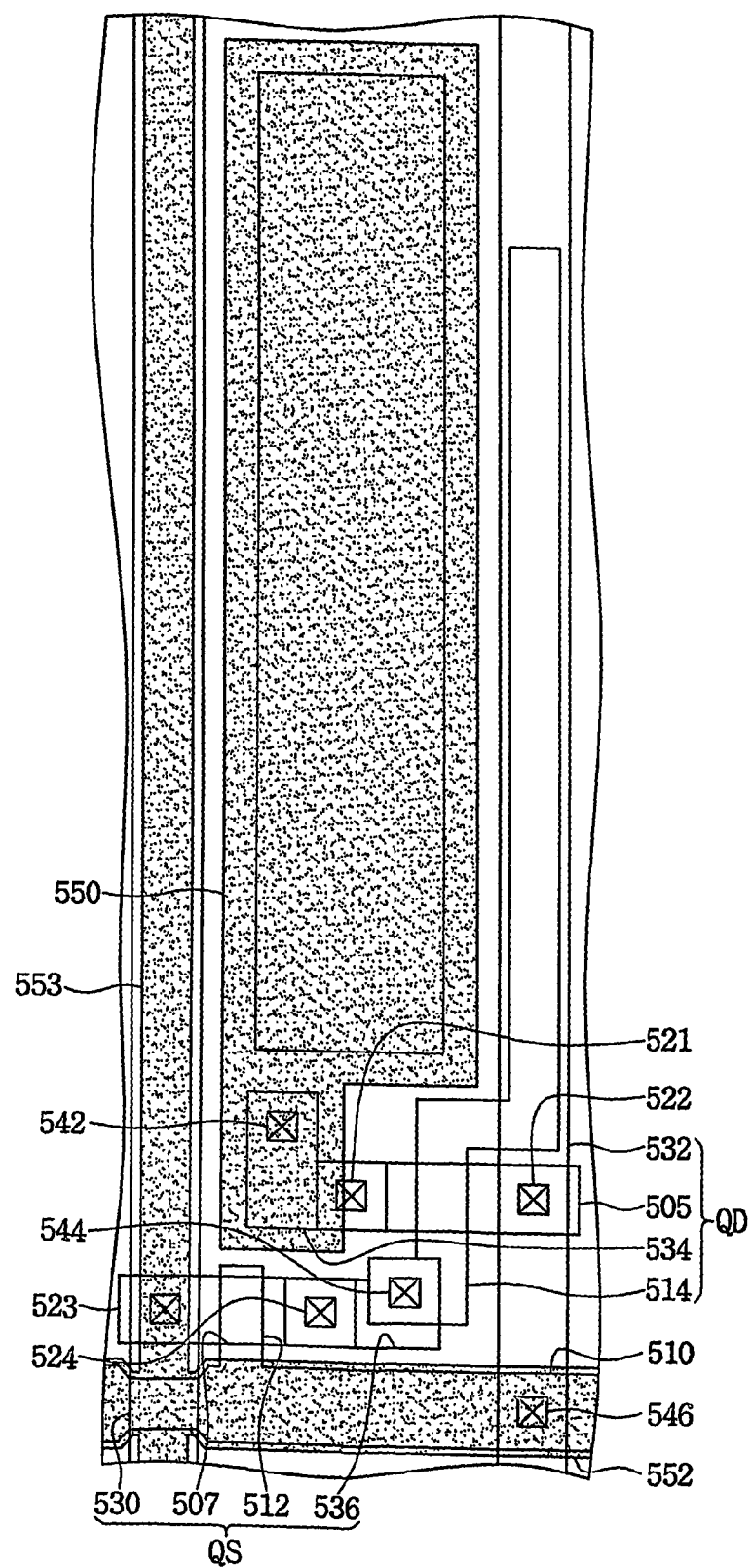

Referring to FIG. 48, the pixel electrode layer 550 including the ITO, the horizontal current supply line 552 and the second longitudinal current supply line 553 are then formed on the substrate from a same layer. The horizontal current supply line 552 is overlapped with the scan line 510. The second longitudinal current supply line 553 is overlapped with the data line 530. An ITO layer is patterned to form the horizontal current supply line 552 and the second longitudinal current supply line 553. The horizontal current supply line 552 and the second longitudinal current supply line 553 are formed from the same layer. The horizontal current supply line 552 is electrically connected to the first longitudinal current supply line 532 through the second contact hole 546. The horizontal and first longitudinal current supply lines form a net shape.

The horizontal current supply line 552 and the second longitudinal current supply line 553 may be formed through patterning an ITO layer. The horizontal current supply line 552 and the second longitudinal current supply line 553 may also be directly formed using a mask.

A partition wall is then formed to define a light emitting region where an organic electro luminescent layer is received. The organic electro luminescent layer is formed in the light emitting region. A counter electrode layer is formed on the organic electro luminescent layer and the partition wall. A protection layer is formed on the counter electrode.

According to this exemplary embodiment, the organic electro luminescent panel includes P-channel metal oxide semiconductor (PMOS) transistors. The organic electro luminescent panel may include N-channel metal oxide semiconductor (NMOS) transistors.

According to the exemplary embodiments of the present invention, the organic electro luminescent display apparatus includes the longitudinal current supply line (V-VDD) that is substantially in parallel with the data line and the horizontal current supply line (H-VDD) that is substantially in parallel with the scan line to form net shaped current supply lines (VDD). The longitudinal and horizontal current supply lines (V-VDD and H-VDD) are electrically connected to one another. Therefore, the resistance of the current supply lines (VDD) is decreased so that the resistance of the current supply lines (VDD) is substantially identical to a sheet resistance of a metal layer, thereby decreasing the cross-talk.

As mentioned above, an organic electro luminescent display apparatus includes main current supply lines and auxiliary current supply lines that are substantially perpendicular to the main current supply lines to uniformize a voltage distribution that is applied to each of pixels, thereby decreasing a voltage drop and a cross-talk.

Furthermore, a unit pixel and an adjacent pixel that is disposed at a position adjacent to the unit pixel are commonly connected to one current supply line that is disposed between the unit pixel and the adjacent pixel so that width of the current supply line may decreased to increase a size of a light emitting area.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

The invention claimed is:

1. A display panel comprising:
   a data line transferring a data signal;
   a scan line transferring a scan signal;
   a switching part connected to the data line and scan lines;
   a driving part connected to the switching part;
   a first current supply line connected to the driving part and transferring a current;
   a second current supply line in contact with the first current supply line;
   an organic electro luminescent part generating a light in response to the current; and
   a pixel electrode connected to the driving part and arranged on a same layer as the second current supply line,
   wherein the second current supply line overlaps the scan line.

2. The display panel of claim 1, wherein the first current supply line is arranged on a same layer as the data line.

3. The display panel of claim 1, further comprising a third current supply line electrically connected to the second current supply line.

4. The display panel of claim 3, wherein the third current supply line is arranged on a same layer as the pixel electrode, and the third current supply line overlaps the data line.

5. The display panel of claim 1, further comprising a storage capacitor disposed between the first current supply line and the driving part.

6. The display panel of claim 1, wherein the display panel comprises a plurality of the first current supply lines, a plurality of the second current supply lines and a plurality of the unit pixels, the second current supply lines being electrically connected to the first current supply lines at every unit pixels.

7. The display panel of claim 1, wherein the display panel comprises a plurality of the first current supply lines, a plurality of the second current supply lines and a plurality of the unit pixels, and wherein one of the second current supply lines is electrically connected to a portion of the first current supply lines, and each of the first current supply lines is electrically connected to a plurality of the unit pixels.

8. The display panel of claim 1, wherein the first current supply line is substantially in parallel with the data line, and the second current supply line is substantially in parallel with the scan line.

9. The display panel of claim 1, wherein a level of the first voltage is substantially equal to a level of the second voltage.

10. The display panel of claim 1, wherein the switching part, the organic electro luminescent part and the driving part are disposed on the unit pixel defined by the data and scan lines, and the first current supply line is electrically connected to the unit pixel and an adjacent pixel disposed at a position adjacent to the unit pixel.

11. The display panel of claim 1, wherein the driving part comprises a first transistor, and the first transistor comprises a P-channel metal oxide semiconductor (PMOS) transistor or an N-channel metal oxide semiconductor (NMOS) transistor.

12. The display panel of claim 1, wherein the switching part comprises a second transistor, and the second transistor comprises a P-channel metal oxide semiconductor (PMOS) transistor or an N-channel metal oxide semiconductor (NMOS) transistor.

13. The display panel of claim 3, wherein a level of the second voltage is substantially equal to a level of the first voltage, and a level of the third voltage is substantially equal to a level of the second voltage.

14. A display panel comprising:
   a data line which transfers a data signal;
   a scan line which transfers a scan signal;
   a switching part connected to the data line and scan line;
   a driving part connected to the switching part;
   a first current supply line connected to the driving part and which transfers a current;
   a second current supply line electrically connected to the first current supply line;
   a third current supply line in contact with the second current supply line;
   an organic electro luminescent part which generates a light in response to the current; and
   a pixel electrode connected to the driving part.

15. The display panel of claim 14, wherein the third current supply line is arranged on a same layer as the pixel electrode.

16. The display panel of claim 15, wherein the third current supply line overlaps the data line.

* * * * *